US010423733B1

(12) United States Patent
Venkataramani et al.

(10) Patent No.: US 10,423,733 B1
(45) Date of Patent: Sep. 24, 2019

(54) SYSTEMS AND METHODS FOR SHARING RESOURCES HAVING DIFFERENT DATA TYPES

(71) Applicant: The Mathworks, Inc., Natick, MA (US)

(72) Inventors: Girish Venkataramani, Boston, MA (US); Yongfeng Gu, Brookline, MA (US); Rama Kokku, Natick, MA (US); Sanmukh Rao Kuppannagari, Gwalior (IN)

(73) Assignee: The MathWorks, Inc., Natick, MA (US)

( * ) Notice: Subject to any disclaimer, the term of this patent is extended or adjusted under 35 U.S.C. 154(b) by 600 days.

(21) Appl. No.: 15/099,111

(22) Filed: Apr. 14, 2016

Related U.S. Application Data

(60) Provisional application No. 62/262,714, filed on Dec. 3, 2015.

(51) Int. Cl.
*G06F 17/50* (2006.01)
*G06F 8/30* (2018.01)

(52) U.S. Cl.
CPC ............ *G06F 17/5009* (2013.01); *G06F 8/30* (2013.01)

(58) Field of Classification Search
CPC ..... G06F 8/35; G06F 8/36; G06F 8/30; G06F 8/34
See application file for complete search history.

(56) References Cited

U.S. PATENT DOCUMENTS 5,164,724 A * 11/1992 Hartley ................ G06F 7/5312 341/101
5,461,576 A 10/1995 Tsay et al.
5,701,294 A 12/1997 Ward et al.
5,764,951 A 6/1998 Ly et al.
5,920,711 A 7/1999 Seawright et al.
5,923,653 A 7/1999 Denton
5,956,674 A 9/1999 Smyth et al.
6,118,902 A 9/2000 Knowles
6,128,025 A 10/2000 Bright et al.
6,216,252 B1 4/2001 Dangelo et al.
6,298,471 B1 10/2001 Schreiber
6,505,339 B1 1/2003 Miller et al.
(Continued)

FOREIGN PATENT DOCUMENTS

WO WO-2008033344 A2 3/2008

OTHER PUBLICATIONS

Acosta, Alfonso, "ForSyDe: Rising the Abstraction Level in System Design," Royal Institute of Technology, Stockholm, Sweden, Mar. 27, 2008, pp. 1-98.
(Continued)

*Primary Examiner* — Aniss Chad
(74) *Attorney, Agent, or Firm* — Cesari and McKenna, LLP; Michael R. Reinemann

(57) ABSTRACT

A system and method generates optimized code for a source model. The system may include a resource sharing optimizer that evaluates the source model and replaces multiple model elements of the source model that are functionally equivalent with a single shared model element. The model elements replaced with the single shared model element may have different fixed point data types. The resource sharing optimizer may convert some of the fixed point data types to a common fixed point data type.

19 Claims, 43 Drawing Sheets

1800
1702
1802
1
In1
sfix20_En12
Convert
Data Type Conversion
sfix20
1704
1804
2
In2
sfix20_En14
Convert
Data Type Conversion1
sfix20
1706
x
Product
sfix40
1806
Convert
Data Type Conversion2
sfix40_En26
1708
1
Out1

(56) References Cited

U.S. PATENT DOCUMENTS 6,513,043 B1 * 1/2003 Chan ................ G06F 17/30595 707/802
6,584,601 B1 6/2003 Kodosky et al.
6,651,222 B2 11/2003 Gupta et al.
7,143,368 B1 11/2006 Plofsky et al.
7,178,112 B1 2/2007 Ciolfi et al.
7,376,544 B1 5/2008 Dick et al.
7,428,737 B1 * 9/2008 Borghesani ......... G06F 9/44521 717/163
7,584,465 B1 9/2009 Koh et al.
7,698,668 B2 4/2010 Balasubramanian et al.
7,720,662 B1 5/2010 Aldrich
7,882,462 B2 2/2011 Ogilvie et al.
7,895,584 B1 * 2/2011 Ma ...................... G06F 17/5045 717/137
7,983,879 B1 7/2011 Vetsch et al.
8,046,386 B2 10/2011 Taitel
8,122,238 B2 2/2012 Kassas et al.
8,156,459 B1 4/2012 Ou et al.
8,352,505 B1 1/2013 Venkataramani et al.
8,365,141 B1 * 1/2013 Yan .......................... G06F 8/34 717/104
8,402,409 B1 * 3/2013 Janneck .............. G06F 17/5054 716/103
8,413,088 B1 4/2013 Armbruster et al.
8,504,978 B1 8/2013 Bhardwaj et al.
8,533,642 B1 9/2013 Ogilvie et al.
8,694,947 B1 * 4/2014 Venkataramani ... G06F 17/5045 716/113
8,745,557 B1 6/2014 Mosterman et al.
8,863,069 B1 * 10/2014 Venkataramani ... G06F 17/5045 716/100
8,914,262 B2 12/2014 Zhang et al.
8,935,137 B1 1/2015 Han et al.
9,251,308 B2 2/2016 Kajitani et al.
9,298,862 B1 3/2016 Venkataramani et al.
9,436,441 B1 9/2016 Venkataramani et al.
9,817,931 B1 * 11/2017 Gu ........................ G06F 17/505
9,971,633 B1 * 5/2018 Barsness ........... G06F 17/30958
10,062,422 B2 8/2018 Wingard et al.
2001/0025292 A1 * 9/2001 Denk ........................ G06F 7/48 708/550
2001/0053069 A1 12/2001 Haba et al.
2002/0080174 A1 6/2002 Kodosky et al.
2002/0120909 A1 8/2002 Brouhard et al.
2002/0193078 A1 12/2002 MacFarlane Shearer et al.
2003/0016234 A1 1/2003 Mani et al.
2003/0215017 A1 11/2003 Fang
2004/0049596 A1 3/2004 Schuehler et al.
2004/0243964 A1 12/2004 McElvain et al.
2006/0064670 A1 3/2006 Linebarger et al.
2006/0120189 A1 6/2006 Beerel et al.
2006/0225021 A1 10/2006 Padalia et al.
2007/0058572 A1 3/2007 Clauberg
2007/0113209 A1 5/2007 Park et al.
2007/0150855 A1 * 6/2007 Jeong ........................ G06F 8/36 717/106
2007/0277161 A1 11/2007 Herbordt et al.
2008/0098349 A1 4/2008 Lin et al.
2008/0189089 A1 8/2008 Lee
2008/0198938 A1 * 8/2008 Lee ..................... H04L 12/4625 375/244
2008/0201690 A1 * 8/2008 Lovisa ...................... G06F 8/34 717/107
2008/0234995 A1 9/2008 Newcomb et al.
2009/0013301 A1 1/2009 Ogilvie et al.
2009/0128189 A1 5/2009 Madurawe et al.
2009/0193239 A1 7/2009 Hanai et al.
2010/0293342 A1 11/2010 Morfey et al.
2011/0225572 A1 * 9/2011 Stoicescu .............. G06F 8/4434 717/156
2013/0116987 A1 5/2013 Zhang et al.
2018/0011706 A1 * 1/2018 Bucuvalas ................ G06F 8/72

OTHER PUBLICATIONS

"Actel Digital Signal Processing (DSP) Solution," Actel Corporation, <http://web.archive.org/web/20071028055746/www.actel.com/products/solutions/dsp/default.aspx>, Oct. 11, 2007, pp. 1-5.
Akella, Sreesa, "Guidelines for Design Synthesis Using Synopsys Design Compiler," Department of Computer Science Engineering University of South Carolina, Columbia, South Carolina, Dec. 2000, pp. 1-13.
Banerjee, Prithviraj et al., "Overview of a Compiler for Synthesizing MATLAB Programs onto FPGAs," IEEE Transactions on Very Large Scale Integration (VLSI) Systems, vol. 12(3):312-324 (2004).
Bjureus, Per et al., "FPGA Resource and Timing Estimation from Matlab Execution Traces," International Conference on Hardware Software Codesign, Proceedings of the tenth international symposium on Hardware/software codesign, pp. 31-36 (2002).
Goering, Richard, "MathWorks Moving Deeper into IC Design," Sep. 18, 2006, pp. 1-3.
Haldar, Malay et al., "FPGA Hardware Synthesis from MATLAB," Fourteenth International Conference on VLSI Design, pp. 299-304 (Jan. 2001).
International Search Report for Application No. PCT/US2007/019734, dated Nov. 11, 2008.
Martins, Sergio et al., "A high-level tool for the design of custom image processing systems," Proceedings of the 2005 8th Euromicro conference on Digital System Design (OSO'05), pp. 346-349 (Sep. 2005).
"MathWorksTM Products for Signal Processing and Communications," The MathWorks, Inc., Mar. 2008, pp. 1-4.
Nayak, Anshuman et al., "Accurate Area and Delay Estimators for FPGAs," Proceedings of the 2002 Design, Automation and Test in Europe Conference and Exhibition (DATE'02), pp. 862-869 (2002).
Ou, Jingzhao et al., "PyGen: A MATLAB/Simulink Based Tool for Synthesizing Parameterized and Energy Efficient Designs Using FPGAs," Proceedings of the 12th Annual IEEE Symposium on Field-Programmable Custom Computing Machines, pp. 47-56 (Apr. 2004).
Popinchalk, Seth, "Building Accurate, Realistic Simulink Models," Newsletters, The MathWorks, Inc., 2006, pp. 1-10.
Popinchalk, Seth, "Improving Simulation Performance in Simulink," The MathWorks, Inc., <http://www.eetimes.com/General/PrintView/4087424>, Apr. 2012, pp. 1-10.
Portero, Antoni et al., "Study of High Level design methodologies for a MPEG frames I Compressor for a HW/SW Implementation," 2004 IEEE International Conference on Industrial Technology (ICIT), DOS. 1688-1693 (Dec. 2004).
"Precision RTL Synthesis Users Manual," 2003c Update 1, Mentor Graphics Corporation, Mar. 2004, pp. 1-119.
Raudvere, Tarvo, et al., "Application and Verification of Local Nonsemantic-Preserving Transformations in System Design," IEEE Transactions on Computer-Aided Design of Integrated Circuits and Systems, vol. 27, No. 6, Jun. 2008, pp. 1-13.
Sander, Ingo, "System Modeling and Design Refinement in ForSyDe," Royal Institute of Technology, Stockholm, Sweden, Apr. 2003, pp. 1-244.
Simulink® HDL Coder™: User's Guide, R2013b, The MathWorks, Inc., Sep. 2013, pp. 1-1238.
Simulink®: User's Guide, R2015b, The MathWorks, Inc., Sep. 2015, pp. 1-3480.
"Working With Xilinx® Devices and Place and Route Tools," Altium, AP0112 (v1.0), Jan. 13, 2004, pp. 1-6.
Karris, Steven T., "Introduction to Simulink® with Engineering Applications Second Edition," Orchard Publications, 2006, pp. 1-44.
Klauske, Lars K. et al., "Improving Modeling Usability: Automated Layout Generation for Simulink," Jun. 16, 2010, pp. 1-8.
"Lecture Notes," Imperial College, Department of Electrical and Electronic Engineering, Jan. 31, 2006, pp. 1-5.
Simulink® 7: User's Guide, The Math Works, Inc., Sep. 2009, pp. 1-1528.
Simulink® 7 User's Guide—Matlab & Simulink—The MathWorks—Mar. 2010, pp. 1-1616.

(56) References Cited

OTHER PUBLICATIONS

"Simulink User's Guide: R2012b," The Math Works, Inc., Sep. 2012, pp. Jan. 1-2839.

Zacher, Darren, "How to Use Register Retiming to Optimize Your FPGA Designs," Mentor Graphics, <http://www.eetimes.com/design/programmable-logic/4014801/How-to-use-register-retiming-to-optimize-your-FPGA-designs>, EE Times Group a UBM company, Dec. 14, 2005, pp. 1-5.

* cited by examiner

700

RESOURCE UTILIZATION REPORT

SUMMARY 702

| | |
|---|---|
| MULTIPLIERS | 3 |
| ADDERS/SUBTRACTORS | 2 |
| REGISTERS | 210 |

DETAILED REPORT

[Expand all] [Collapse all]

REPORT FOR SUBSYSTEM: CONTROLLER

MULTIPLIERS (3)

[ + ] 8x8-bit Multiply : 2
[ + ] 32x8-bit Multiply : 1

704

ADDERS/SUBTRACTORS (2)

[ + ] 32x32-bit Adder : 1
[ + ] 32x32-bit Subtractor : 1

REGISTERS (210)

1-bit Register : 3
[ + ] 8-bit Register : 207

FIG. 7

TARGET HARDWARE DATABASE (DSP slice usage)

| Target Device | Word Length (bits) 8 | 10 | 12 | 14 | 16 | 20 | 32 | |
|---|---|---|---|---|---|---|---|---|
| Xilinx Spartan-3 | 2 | 2 | 2 | 3 | 2 | 4 | 4 | |
| Xilinx Virtex-6 | 2 | 2 | 3 | 3 | 4 | 4 | 5 | |
| Xilinx Artix-7 | 1 | 1 | 3 | 3 | 3 | 4 | 4 | |
| Altera Stratix V | 1 | 2 | 2 | 3 | 2 | 4 | 4 | |
| Altera Max 10 | 2 | 2 | 3 | 3 | 4 | 5 | 4 | |

| input1 width | input2 width | number of dsp slices |
|---|---|---|
| 26 | 18 | 1 |
| 35 | 25 | 2 |
| 42 | 35 | 4 |
| 42 | 42 | 5 |
| 59 | 18 | 3 |
| 64 | 25 | 4 |
| 64 | 42 | 8 |
| 64 | 59 | 12 |
| 64 | 64 | 16 |

SYSTEMS AND METHODS FOR SHARING RESOURCES HAVING DIFFERENT DATA TYPES

RELATED APPLICATIONS

This application claims the benefit of Provisional Patent Application Ser. No. 62/262,714 filed Dec. 3, 2015, and is related to application Ser. No. 14/245,629, filed Apr. 4, 2014 for Resource Sharing Workflows with Executable Graphical Models, which is a continuation of application Ser. No. 12/963,371, filed Dec. 8, 2010 for Resource Sharing Workflows Within Executable Graphical Models, now U.S. Pat. No. 8,694,947, which claims the benefit of U.S. Provisional Patent Application Ser. No. 61/267,902, filed Dec. 9, 2009. The contents of all above applications are hereby incorporated by reference in their entireties.

BRIEF DESCRIPTION OF THE DRAWINGS

The description below refers to the accompanying drawings, of which:

FIG. 7 is a schematic illustration of a resource report for an optimized version of the source model corresponding to FIG. 6;

DETAILED DESCRIPTION OF ILLUSTRATIVE EMBODIMENTS

Figure 1:
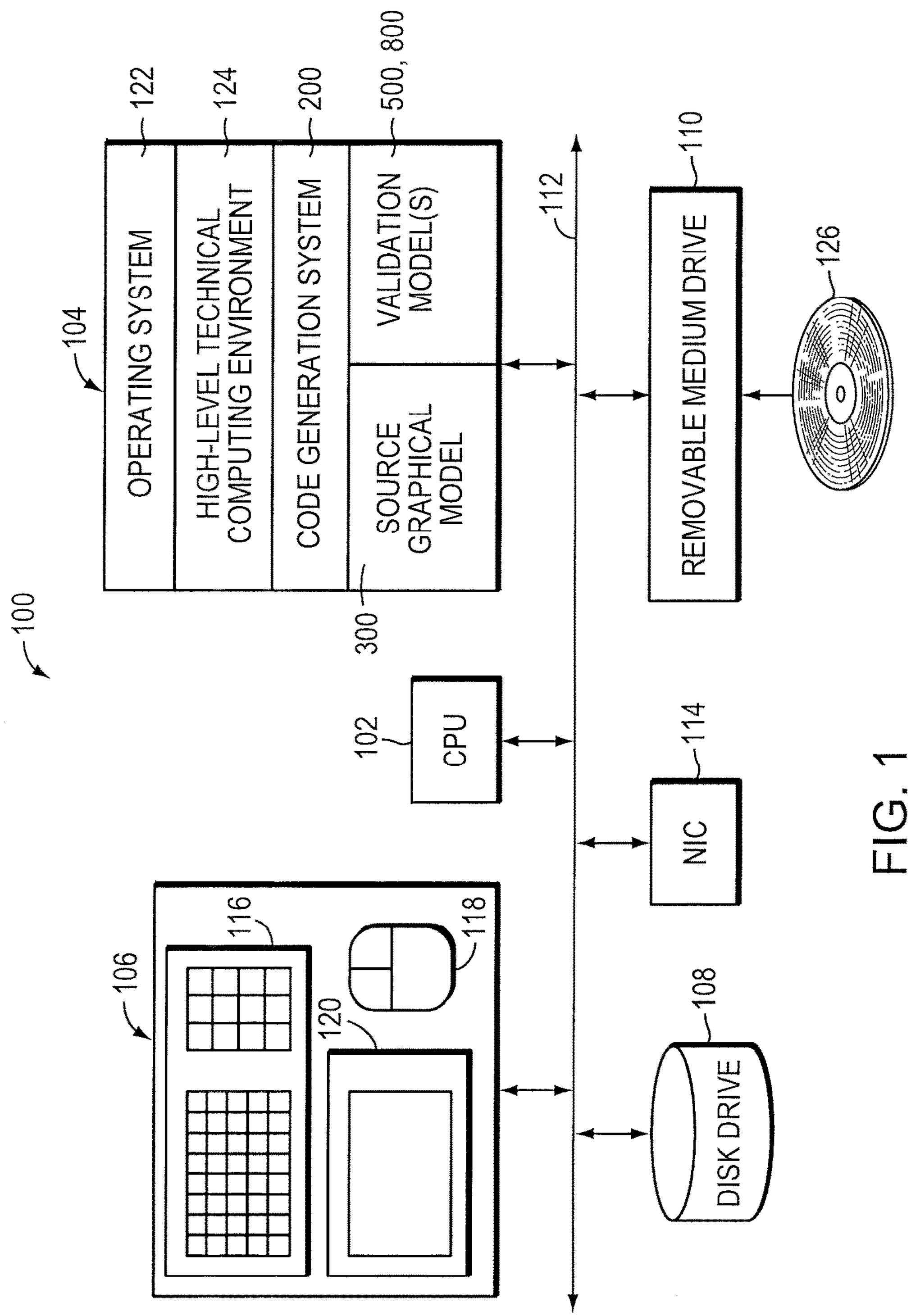
FIG. 1 is a schematic block diagram of a computer system suitable for use with the present disclosure.

Engineers, scientists and other users often work with computer-based, high-level development tools or environments to perform algorithm development, data visualization, simulation, and model design, among other tasks. Exemplary high-level development tools include the MATLAB® and Simulink® technical computing environments from The MathWorks, Inc. of Natick, Mass. With the Simulink® technical computing environment, a user creates an executable graphical model by selecting blocks from a library browser, placing them onto a canvas, for example in a graphical editor, and connecting them with lines that establish mathematical relationships and/or signals between the blocks. The Stateflow® modeling environment is an extension to the Simulink® technical computing environment that allows a user to specify state machines and flow charts. A Stateflow chart may be created by selecting states, junctions, and functions from a graphical palette, and entering them into a drawing window. The user can then create transitions by connecting states and junctions together.

Other products or tools exist for generating code from Simulink models, MATLAB files and/or functions, also referred to as M-files and/or M-functions, and/or Stateflow charts. Specifically, a Simulink Hardware Description Language (HDL) Coder™ product, also available from The MathWorks, Inc., generates HDL code based on Simulink models or Stateflow charts. The generated HDL code can be exported to synthesis and layout tools for hardware realization onto target hardware devices, such as Field Programmable Gate Arrays (FPGAs), Application Specific Integrated Circuits (ASICs), Complex Programmable Logic Devices (CPLDs), etc. With the Simulink HDL Coder product, the Simulink technical computing environment can be used for electronic design automation, and other design and exploration functions.

Overview

Briefly, the present disclosure relates to a system and method for generating optimized code, such as a hardware description code, from an executable source model automatically. For example, the source model may include a plurality of functionally equivalent elements, such as multipliers. The present disclosure may generate code that, instead of including code for the same plurality of multipliers as in the source model, has code for just a single multiplier that is shared within the generated code. A system interacting with the source model may include a resource sharing optimizer that identifies resources, such as resources that perform math operations, including multipliers, adders, dividers, trigonometric (trig) functions, that can be shared, and replaces them with a single shared resource. The resource sharing optimizer may perform the identification and replacement during model construction, optimization, compilation, or code generation from the model. In some embodiments, the resource sharing optimizer may search at least a portion of the source model (or an in-memory intermediate representation (IR) of the source model) for a set of model elements that implement equivalent functionality. The resource sharing optimizer may then modify the source model, for example as represented by the IR or represented by model elements in a modeling environment, by replacing part of or the entire set of functionally equivalent model elements with a single shared model element. The resource sharing optimizer may further modify the model or IR by inserting one or more Multiplexer (Mux) blocks, and routing the input data paths of the removed model elements to the one or more Mux blocks. The output of the one or more Mux blocks may feed the single shared model element, and the output of the single shared model element may be coupled to one or more Demultiplexer (Demux) blocks inserted into the model or IR by the resource sharing optimizer. The outputs of the one or more Demux blocks may be routed to the output data paths of the removed model elements. The resource sharing optimizer may also insert one or more Serializer blocks and Deserializer blocks into the data paths being modified, and configure the modified portion of the model or IR to execute at a faster rate. The modified model or IR may be used to generate code for the source model, a validation model, and/or a report, such as a hardware utilization report. Because the generated code includes code for just the single shared model element (instead of code for the plurality of model elements included in the source model), the generated code may require fewer hardware resources when deployed to a target hardware device.

The model elements being shared may have different fixed point data types. Specifically, a first model element may receive inputs having a first fixed point data type, while a second model element may receive inputs having a second fixed point data type, different from the first fixed point data type. A fixed point data type may include a word length, a fraction length, and a sign attribute, for example signed or unsigned. The resource sharing optimizer may share resources whose inputs have different fraction lengths, word lengths, and sign by normalizing the word length to a predetermined fixed word length, normalizing the sign to signed or unsigned, and normalizing the fraction length to a predetermined fraction length, e.g., zero. In some implementations, for different model elements, the predetermined fixed word length or fraction length may be different, and the normalization processes may be different.

In the example of model elements performing math operations, most such model elements can be reduced to combinations of adders and multipliers. Accordingly, processes described for multipliers and adders can be selected and/or combined for use in other model elements.

In some implementations, the resource sharing optimizer may share multipliers whose inputs have different fraction lengths by re-interpreting the underlying bits, e.g., the input bit sequences, as a whole value without fraction lengths. The plurality of multipliers may then be replaced with a single shared multiplier whose inputs have zero fraction length. Mux and Demux blocks may also be added, and the demuxed outputs of the shared multiplier may be converted back to their original fraction lengths. Multipliers whose inputs have different sign attributes may be shared by normalizing the data types to either signed fixed point data types or to unsigned fixed point data types. If the data types are normalized to unsigned fixed point data types, the resource sharing optimizer also may add sign determination and setting logic to the demuxed outputs of the shared multiplier to set one or more outputs of the shared multiplier to the correct sign. For multipliers with different word lengths, the resource sharing optimizer may promote multipliers whose inputs have first word lengths to multipliers whose inputs have second word lengths, where the second word length is greater than the first input word length. The promoted multiplier may then be shared with other multipliers whose inputs have the second word length. Additionally or alternatively, the resource sharing optimizer may split or partition a multiplier whose inputs have a first word length into multipliers whose inputs have a second word length, where the second word length is smaller than the first word length. The split or partitioned multipliers may then be shared with other multipliers whose inputs have the second word length. Additionally or alternatively, the resource sharing optimizer may merge multipliers whose inputs have the same or different word lengths into a multiplier whose inputs have a new word length that may then be shared with other multipliers whose inputs have the same word length as the new word length of the merged multiplier.

For adders, some of the normalizing procedures may be the same as described for multipliers, while others may be different. For example, in some implementations, normalizing word length for adders as well as for multipliers may increase word length without affecting fraction length. The process of normalizing the sign for adders may be the same as described for multipliers. However, the sign determination and setting logic may be different. For example, for adders the sign determination and setting logic may be based on value comparisons. For adders, fraction length may be normalized, not to zero as with multipliers, but in a way that aligns the binary points of the inputs to the adders to be shared. This approach may also be used with multipliers. For example, suppose the inputs to a first adder have a word length of 8 and a fraction length of 2, and the inputs to a second adder have a word length of 8 and a fraction length of 4. In some implementations, the inputs for both adders may be normalized to have a word length of 10 and a fraction length of 4.

Examples of Systems

FIG. 1 is a schematic illustration of a computer or data processing system 100 for implementing and utilizing an embodiment of the disclosure. The computer system 100 includes one or more processing elements, such as a central processing unit (CPU) 102, a main memory 104, user input/output (I/O) 106, a disk drive 108, and a removable medium drive 110 that are interconnected by a system bus 112. The computer system 100 may also include a network interface card (NIC) 114. The user I/O 106 may include a keyboard 116, a mouse 118 and a display 120.

The main memory 104 may store a plurality of libraries or modules, such as an operating system 122, and one or more applications running on top of the operating system 122, including a technical computing environment 124. The main memory 104 may also include a code generation system 200. The code generation system 200 may be configured as a toolbox or an add-on product to the high-level technical computing environment 124. Furthermore, as described herein, the main memory 104 may include a program specification, such as a source graphical model 300, and a validation model 500.

The removable medium drive 110 is configured to accept and read a computer readable medium 126, such as a CD, DVD, floppy disk, solid state drive, tape, flash memory or other medium. The removable medium drive 110 may further be configured to write to the computer readable medium 126.

Suitable computer systems include personal computers (PCs), workstations, laptops, tablets, palm computers and other portable computing devices, etc. Nonetheless, those skilled in the art will understand that the computer system 100 of FIG. 1 is intended for illustrative purposes only and that the present disclosure may be used with other computer systems, data processing systems or computational devices. The present disclosure may also be used in a networked, e.g., client-server, computer architecture, or a public and/or private cloud computing arrangement. For example, a high-level technical computing environment, such as a modeling environment, or other application, may be hosted on one or more servers, and may be accessed by a client, which may be remote from the server, for example in a different city or country, through a Software as a Service (SaaS) model, or by accessing a virtual machine.

Suitable operating systems 122 include the Windows series of operating systems from Microsoft Corp. of Redmond, Wash., the Linux operating system, the MAC OS® series of operating systems from Apple Inc. of Cupertino, Calif., and the UNIX® series of operating system, among others.

As indicated above, a user or developer, such as an engineer, scientist, programmer, etc., may utilize the keyboard 116, the mouse 118 and the computer display 120 of the user I/O 106 to operate the high-level technical computing environment 124, and create the source graphical model 300.

Suitable high-level technical computing environments for use with embodiments of the present disclosure include the MATLAB® and SIMULINK® technical computing environments from The MathWorks, Inc. of Natick, Mass., the Simscape physical modeling system and the Stateflow state chart environment also from the MathWorks, the MapleSim physical modeling and simulation tool from Waterloo Maple Inc. of Waterloo, Ontario, Canada, the LabVIEW programming system and the NI MatrixX model-based design product both from National Instruments Corp. of Austin, Tex., the Visual Engineering Environment (VEE) from Agilent Technologies, Inc. of Santa Clara, Calif., the System Studio model-based signal processing algorithm design and analysis tool from Synopsis, Inc. of Mountain View, Calif., the SPW signal processing algorithm tool from Synopsis, a Unified Modeling Language (UML) system, a Systems Modeling Language (SysML) system, and System Generator from Xilinx, Inc., among others. Those skilled in the art will recognize that the computer system 100 need not include any software development environment at all.

The high-level technical computing environment 124 may include a simulation engine (not shown) configured to simulate, e.g., execute, block diagrams or models, such as the source graphical model 300, on the computer 100. That is, icons or blocks of the model may represent computations, functions or operations, and interconnecting lines or arrows among those blocks may represent data, signals, or relationships among those computations, functions, or operations. The icons or blocks, moreover, may be selected by the user from one or more libraries or palettes that contain icons or blocks for the blocks supported by the high-level technical computing environment 124. The high-level technical computing environment 124 may include or support a graphical user interface (GUI) having a Run button that may be selected by the user. The high-level technical computing environment 124 may also be configured to receive a run command entered by the user, e.g., in the GUI or in a Command Line Interface (CLI). In response to the user selecting the Run button or entering the run command, the simulation engine of the high-level technical computing environment 124 may execute the model, and may present the results of the model's execution to the user via the display 120.

The high-level technical computing environment 124 may further include one or more debugging facilities that may, for example, allow halting a simulation at one or more breakpoints. A breakpoint may be specified for a variable, for example, to halt execution when the variable value changes. A breakpoint also may be conditional, for example, only halting execution when a variable value changes if the current time of execution is in a certain time interval, or only halting execution when a variable has changed a specified number of times.

A suitable simulation engine includes the simulation engine included in the Simulink modeling environment, the execution engine of the LabVIEW programming system, and the execution engine of the Agilent VEE programming system, among others.

The high-level technical computing environment 124, moreover, may include or support a graphical user interface (GUI) having a Code Generation button that may be selected by the user. The high-level technical computing environment 124 may also be configured to receive a code generation command entered by the user, e.g., in the GUI or in a Command Line Interface (CLI). In response to the user selecting the Code Generation button or entering the code generation command, the code generation engine of the high-level technical computing environment 124 may generate code for at least part of the model, and may present the results of the code generation to the user via the display 120.

Those skilled in the art will understand that the MATLAB® technical computing environment is a math-oriented, textual programming environment for digital signal processing (DSP) design, among other uses. The SIMULINK® technical computing environment is a graphical, block-based environment for modeling and simulating dynamic systems, among other uses.

Figure 2:
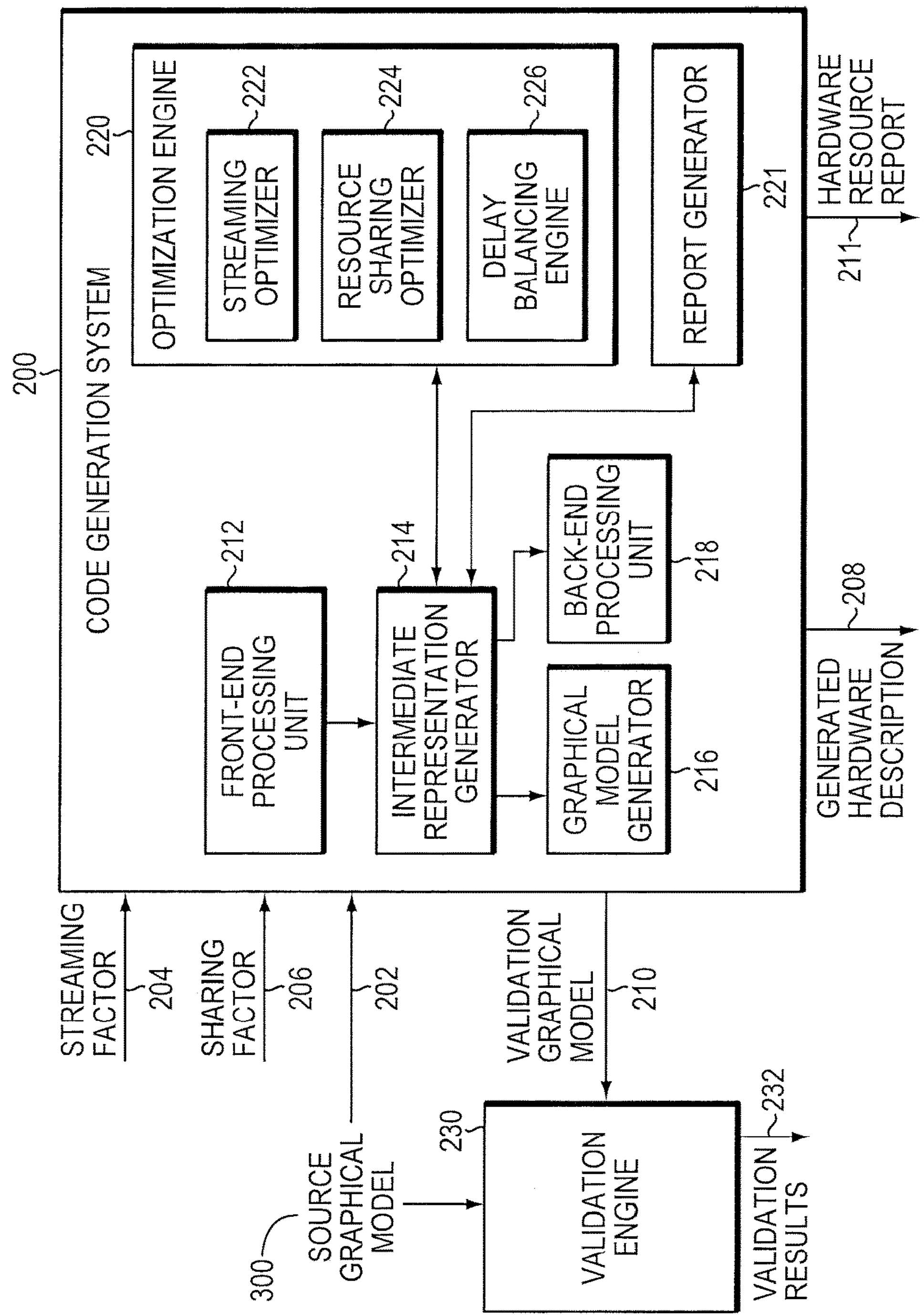
FIG. 2 is a schematic block diagram of a code generation system in accordance with an embodiment of the present disclosure.

FIG. 2 is a highly schematic, functional block diagram of an embodiment of the code generation system 200. The code generation system 200 may receive the source graphical model 300 created by the user or developer with the high-level technical computing environment 124, as indicated by arrow 202. The source graphical model 200 may be a Simulink model, a Stateflow chart, a LabVIEW block diagram, a VEE diagram, etc. The code generation system 200 also may receive a streaming factor specified by the user or developer, as indicated by arrow 204, and a sharing factor specified by the user or developer, as indicated by arrow 206. As described herein, the code generation system 200 may produce hardware description code corresponding to the source graphical model, as indicated by arrow 208, that is optimized, and yet remains bit true and cycle accurate (modulo a well-defined initial latency) to the simulation of the source graphical model. Exemplary hardware descriptions that may be generated include hardware description language (HDL) code, such as VHDL or Verilog code, SystemC code, embedded MATLAB code, vendor or target specific HDL code, such as Xilinx FPGA libraries, etc. The code generation system 200 may also produce one or more validation models, as indicated by arrow 210, and one or more hardware resource reports, as indicated by arrow 211.

In some embodiments, the code generation system 200 may produce hardware description code from other source programs in addition to or besides graphical models. For example, the code generation system 200 may receive a source model or program written in a textual programming language, such as C, C++, or SystemC, among others. The code generation system 200 may produce hardware description code, such as VHDL or Verilog code, among others, from the C, C++, or SystemC program. Exemplary systems for producing hardware description code from such programs include the Vivado High-Level Synthesis (HLS) tool from Xilinx, the Catapult high-level synthesis tool from Calypto Design Systems, Inc. of San Jose, Calif., and the C-to-Silicon compiler and Forte Cynthesizer tool both from Cadence Design Systems, Inc. of San Jose, Calif.

The code generation system 200 may include a plurality of components or modules. Specifically, the code generation system 200 may include a front-end processing unit 212, an intermediate representation (IR) generator 214, a graphical model generator 216, a back-end processing unit 218, an optimization engine 220, and a report generator 221. The optimization engine 220, in turn, may include one or more sub-components or modules, such as a streaming optimizer 222, a resource sharing optimizer 224, and a delay balancing engine 226. The code generation system 200 may include or have access to, e.g., be in communication with, a validation engine 230. As described herein, the validation engine, which may be part of the high-level technical computing environment 124, may receive the source and validation models, and produce validation results, as indicated by arrow 232.

The front-end processing unit 212, the IR generator 214, the graphical model generator 216, the back-end processing unit 218, the optimization engine 220, and the report generator 221 may each comprise registers and combinational logic configured and arranged to produce sequential logic circuits. In the illustrated embodiment, the front-end processing unit 212, the IR generator 214, the graphical model generator 216, the back-end processing unit 218, the optimization engine 220, and the report generator 221 are implemented through one or more software modules or libraries containing program instructions pertaining to the methods described herein, that may be stored on main memory 104 and/or computer readable media, such as computer readable medium 126, and executable by one or more processing elements, such as CPU 102. Other computer readable media may also be used to store and execute these program instructions. In alternative embodiments, various combinations of software and hardware, including firmware, may be utilized to implement the present disclosure.

Figure 3:
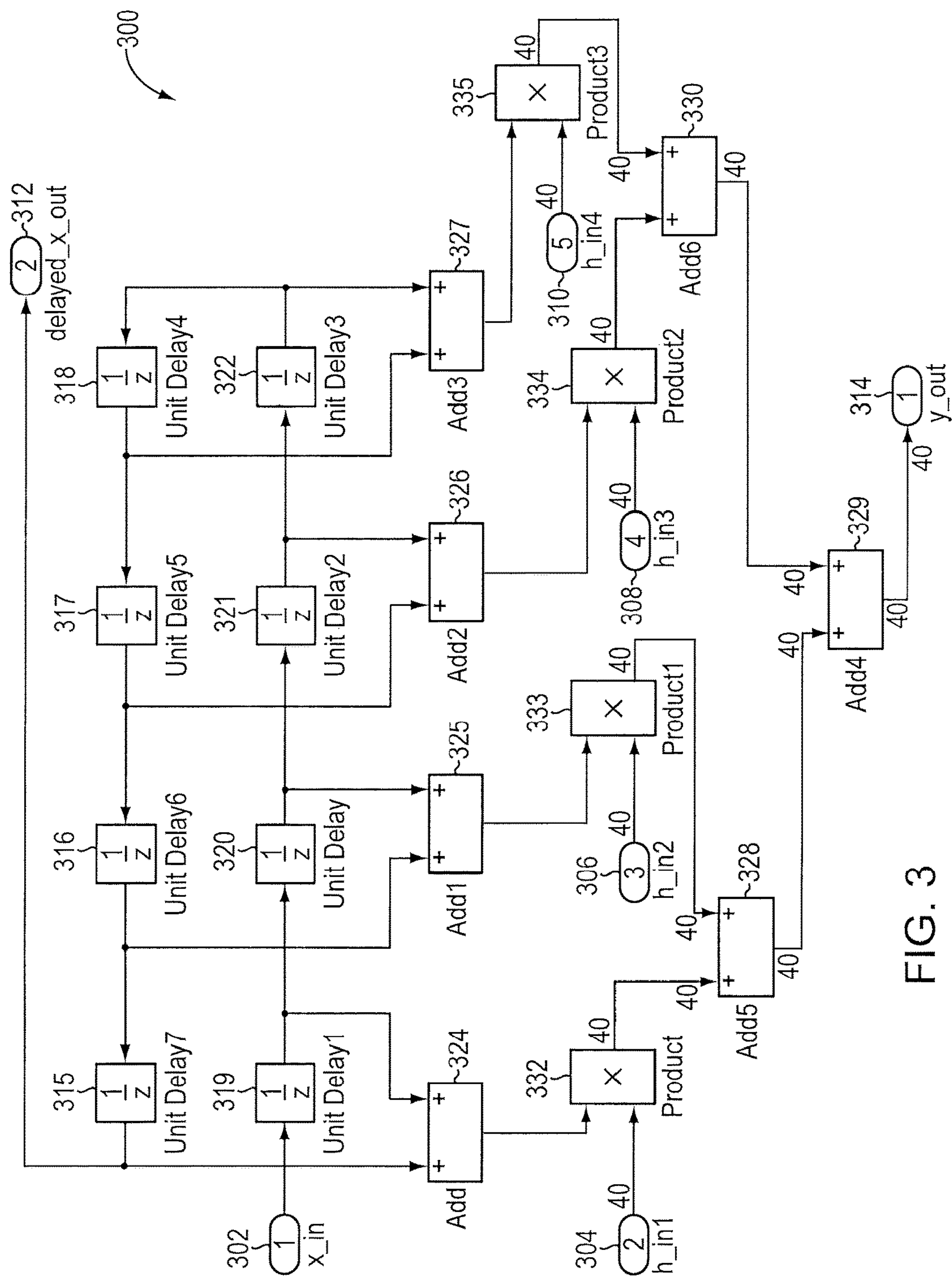
FIG. 3 is an exemplary graphical program for use with an embodiment of the present disclosure.

FIG. 3 is a schematic illustration of the source graphical model 300. It should be understood that the source graphical model 300 is for illustrative purposes, and that the present disclosure may be used with other models or portions thereof. The source graphical model 300, which illustrates a symmetric Finite Impulse Response (FIR) filter that filters forty (40) parallel channels, includes a plurality of blocks interconnected by lines such as arrows. Specifically, the source graphical model 300 has a first input port (Inport) block 302 that receives a scalar element or value, and second, third, fourth, and fifth Inport blocks 304-310, respectively, that each receive a vector of elements or values typically referred to as the filter coefficients. Specifically, the second through fifth Inport blocks 304-310 each receives a 40-element vector. Source model 300 also has a first output port (Outport) block 312 that outputs a scalar value, and a second Outport block 314 that outputs a vector of width forty, i.e., a 40-element vector.

Source model 300 further includes eight Unit Delay blocks 315-322, seven Add blocks 324-330, and four Product blocks 332-335. The Unit Delay blocks 315-322 hold and delay their inputs by a specified sample period or step. If the input to a given Delay block is a vector, the block holds and delays all elements of the vector by the specified sample period or step. The Add blocks 324-330 perform addition on their inputs, which may be scalar, vector, or matrix types. The Product blocks 332-335 perform multiplication on their inputs, which may also be scalar, vector or matrix types. The blocks of the model 300 are interconnected by arrows that establish relationships among the blocks. The relationship represented by the arrow or line may depend on the kind or type of model. For example, in a time-based modeling system, an arrow may represent a mathematical relationship between two connected blocks where a first, e.g., upstream, block updates the signal, and a second, e.g., downstream, block reads the signal. In other modeling environments, the arrows or lines may represent data and/or control flow among the blocks.

A sequence of arrows that link a series of blocks, e.g., from an Inport to an Outport, may be referred to as a path, such as a signal or data path. Different paths through the model 300 may remain parallel to each other, or may merge at a join point of the model, such as a particular block. For example, a first path starting at the Inport 302 merges with a second path starting at the Inport 306 at the Product block 333.

The source graphical model 300 is intended for illustrative purposes only. Other models may be received for processing, such as models having different types or arrangements of blocks or representing different dynamic or other systems.

The source graphical model 300 may execute over one or more steps, where a step refers to an iteration of the model 300. For example, the source graphical model 300 may be a time-based model that executes over a plurality of time steps from a start time to an end time. The time step of the source graphical model may be color coded. For example, portions of the source graphical model having different time steps may be represented in different colors. Alternatively, the source graphical model may be an event-based system, such as a state transition diagram, that executes over a plurality of event steps. In another embodiment, the source graphical model may be a dataflow model in which case the one or more steps may be time or event based. An exemplary event in a dataflow model may be the availability of new data to be consumed.

For example, the source graphical model 300 may be a time-based model generated by the Simulink® graphical modeling system from The MathWorks, Inc. that executes or runs, e.g., iterates, over one or more time steps.

It should be understood that each block of the source model may execute once every time step. Alternatively, one or more blocks may execute once every occurrence of some multiple of the time step, such as once every third or fourth time step. Furthermore, the time step for a given block may be inferred from one or more other blocks of the model. For example, the time step for a given block may be indicated to be inherited, and an inferencing engine may determine the actual time step. The inferencing engine may be based on propagation, for example, when the output of a block with a time step indicated to be inherited is connected to the input of a block with a time step, the inherited sample time may be inferred to be that given time step. Other execution information such as data type, complexity, and dimensions may also be determined by an inferencing engine.

At each step of the model 300, each Product block 332-335 receives a scalar value and a vector of forty elements or values, and produces a vector of forty elements. To produce a hardware description of the source graphical model 300 that is bit true and cycle accurate, a code generation system may synthesize forty parallel multipliers in hardware for each Product block 332-335. In other words, for the source model 300, which has four Product blocks 332-335, each processing a forty element vector, a code generation system may synthesize a total of 160 hardware multipliers to implement the source model 300 in hardware. Such a large number of multipliers can consume significant physical resources on a target hardware device, such as an FPGA, being configured with the hardware description generated from the source model 300.

To determine the exact number of resources consumed by a hardware description of the source graphical model 300, the user may direct the report generator 221 to evaluate the source graphical model 300. The report generator 221 may examine an in-memory representation of the source model 300, which may be produced by the IR generator 214, and determine the number of resources that would be required to implement the source model 300 in hardware. The hardware resource report produced by the report generator 221 may be presented to the user, e.g., on the display 120 of the computer system 100, for evaluation.

As described herein, the streaming optimizer 222 and the resource sharing optimizer 224 of the optimization engine 220 are each configured to enable more optimized hardware description to be generated from the source model 300. In an embodiment, this optimized hardware description remains bit true and cycle accurate to the source model 300 modulo a pre-determined initial latency, but uses less physical hardware resources, e.g., fewer multipliers.

Sharing Resources Whose Inputs have the Same Data Types

In addition to conserving hardware resources by converting a vector data path to a scalar (or smaller sized vector) path, the optimization engine 220 may perform another optimization automatically on an in-memory representation of the source model 300. More specifically, the resource sharing optimizer 224 may search the in-memory representation, identify multiple components that are functionally equivalent to each other, such as components corresponding to blocks or subsystems, and modify the in-memory representation to share a single instantiation of this component. In this way, components that perform equivalent functions may be eliminated, thereby conserving hardware resources.

A subsystem may include a subset of the model elements included within a model. The subset of model elements may be represented by a single subsystem block within the model. A subsystem may be saved in a library, and may be reused at other locations in the model or in other models. A subsystem may be context dependent. That is, at least some of the parameters of the subset of model elements, such as data type, data dimension, and sample time, may be undefined. Values for these parameters may be inherited from the model into which the subsystem is added. In some implementations, execution of the subset of model elements of a subsystem may be interleaved with the execution of other model elements of the model. In other implementations, the subset of model elements of a subsystem may execute atomically. In addition, in some implementations, a subsystem may be configured for conditional execution, and the subsystem may execute when the condition is satisfied.

FIGS. 4A-E are partial views of a flow diagram of a method in accordance with an embodiment of the present disclosure. A graphical model, such as the source graphical model 300, is received by the code generation system 200, as indicated at step 402. The code generation system 200 also may receive a designation of a subsystem of the received model for code generation, as indicated at step 404. In addition, the code generation system 200 may receive a designation of a sharing factor, e.g., from the user, as indicated at step 406.

A user may specify a desired shared factor through a GUI or CLI, as discussed above in connection with the streaming factor (Sf).

The front-end processing unit 212 may perform a number of preliminary tasks, such as capturing dataflow relationships specified in the source model 300, if any, determining block semantics, such as the type of block, determining particular block and/or subsystem parameter settings, as established by the user, etc. This information may be provided by the front-end processing unit 212 to the Intermediate Representation (IR) generator 214.

The Intermediate Representation (IR) generator 214 may generate an in-memory representation of the source graphical model, e.g., source model 300, or at least the subsystem, as indicated at step 408. In an embodiment, the in-memory representation is in a form and structure that is suitable for use in generating hardware description code as well as returning the in-memory representation back into an executable graphical model. In an embodiment, the in-memory representation is in the form of a hierarchical, Data Flow Graph (DFG), referred to as Parallel Intermediate Representation (PIR), which has a plurality of nodes interconnected by edges. The nodes of the PIR, also known as components, represent blocks from the source model or designated subsystem in an abstract manner, and the edges of the PIR, called signals, represent the connections between the blocks of the model or subsystem. Special nodes, called network instance components (NICs), provide hierarchy in the PIR, for example, by abstractly representing subsystems of the model. That is, each block of the source model 300 or subsystem may map to one or more nodes of the PIR, and each line or arrow of the source model 300 may map to one or more edges of the PIR.

Signals may be continuously defined over a period of time based on values computed at points in time during the period. For example, a signal value may be defined over an interval of time with a start time and a stop time by extrapolating the value of the signal computed at the start time. The extrapolation may be based on a zero-order hold. As another example, a signal value may be defined over an interval of time with a start time and a stop time by interpolating the value of the signal computed at the start time and the stop time. The interpolation may be based on a first-order hold.

In an embodiment, the in-memory representation may have a plurality of hierarchically arranged levels. More specifically, the PIR may be a top-level of the in-memory representation of the source model 300, and one or more of the components of the PIR may be a particular type or form of in-memory representation. For example, one or more components of the PIR may a Control Flow Graph (CFG), Control Data Flow Graph (CDFG), program structure tree (PST), abstract syntax tree (AST), etc. A CDFG may capture the control flow as well as the data flow of a graphical model through data dependency and control dependency edges.

The in-memory representation or IR may be stored in memory, such as main memory 104.

If the PIR represents a model having one or more subsystems, the optimization engine 220 may locate within the PIR the NIC corresponding to a subsystem of the model that has been marked for hardware description generation.

The resource sharing optimizer 224 may parse the PIR gathering information about the PIR, and may perform a number of modifications to the PIR, thereby generating a modified PR. The resource sharing optimizer 224 may operate on the PIR or the source model. For ease of description, at least some of the operations are described with reference to the source model 300 rather than the PIR. Similarly, while the optimization engine 220 may be configured to operate on a subsystem of a model, the functions performed by the optimization engine 200 may be described as operating on the source graphical model 300. It should be understood that the source graphical model 300 may represent a subsystem of a larger model (not shown). This larger model may include the source graphical model 300 by reference and may include more than one instance of the source graphical model 300. The source graphical model may be stored in a shared repository such as, for example, a library, or the source graphical model may be stored separately in an individual repository such as, for example an electronic file. The interface between the larger model and the referenced model may be stored by the larger model. This interface may include, for example, the number of input ports, the number of output ports, the data type of input and output ports, sample time of input and output ports, dimensions of input and output ports, etc. The larger model also may store information of the referenced model, such as the version number of the referenced model.

In an embodiment, the resource sharing optimizer 224 may analyze and perform its operations on the PR modified by the streaming optimizer 222. The resource sharing optimizer 224 may perform its optimizations first, followed by the streaming optimizer 222, or the two optimizers 222 and 224 may work simultaneously or substantially simultaneously.

The resource sharing optimizer 224 may search the in-memory representation, e.g., the PR, to find functional components, which may represent or correspond to blocks and/or subsystems of the source model, that are functionally equivalent with each other, as indicated at step 410. The resource sharing optimizer 224 may operate on the source model or on an in-memory representation of a source model or subsystem. For convenience, reference is made herein to the source model or subsystem. Two blocks of the source model 300 may be considered functionally equivalent by the resource sharing optimizer 224 if the following conditions are met:

(1) the two blocks being compared are both the same type (or kind) of component, e.g., they are both Product blocks, or Gain blocks, etc., (2) the values of the block parameters (if any) for the two blocks being compared are the same, and (3) the inputs and outputs of the two blocks being compared are identical in number, data type, and signal rate.

Two subsystems of a source model may be considered to be equivalent, if the following conditions are met:

(1) all of the blocks of each subsystem are treated as a single execution unit by the model execution engine, i.e., the two subsystems are atomic, and (2) a checksum calculation performed on each subsystem yields the same result.

A suitable technique for computing checksums for subsystems of a graphical model is described in U.S. Pat. No. 7,178,112, issued Feb. 13, 2007 for Management of Functions for Block Diagrams.

In an embodiment, Gain blocks having different gain values (i.e., different block parameters) may still be shared. In particular, the Gain blocks of the source model may be replaced with a combination of Constant and Multiplier blocks where the Constant is set to the Gain block's gain parameter. If the resource sharing optimizer 224 determines that the Constant blocks are the same, then the pairs of Constant and Multiplier blocks may be collapsed back into Gain blocks and shared. If the Constant blocks are not the same, then the resource sharing optimizer 224 may share the Multiplier blocks.

The process by which a resource, such as a single instance of a block, is shared may depend on whether there is a data dependency among the candidate blocks. Accordingly, in an embodiment, a determination may be made whether the blocks (or subsystems) identified as candidates for sharing are (1) mutually parallel, or (2) data-dependent, as indicated by decision step 412. Two candidate blocks may be considered data dependent if a data path extends from one to the other. If no such data path exists, the two candidate blocks may be considered mutually parallel.

Figure 4A:
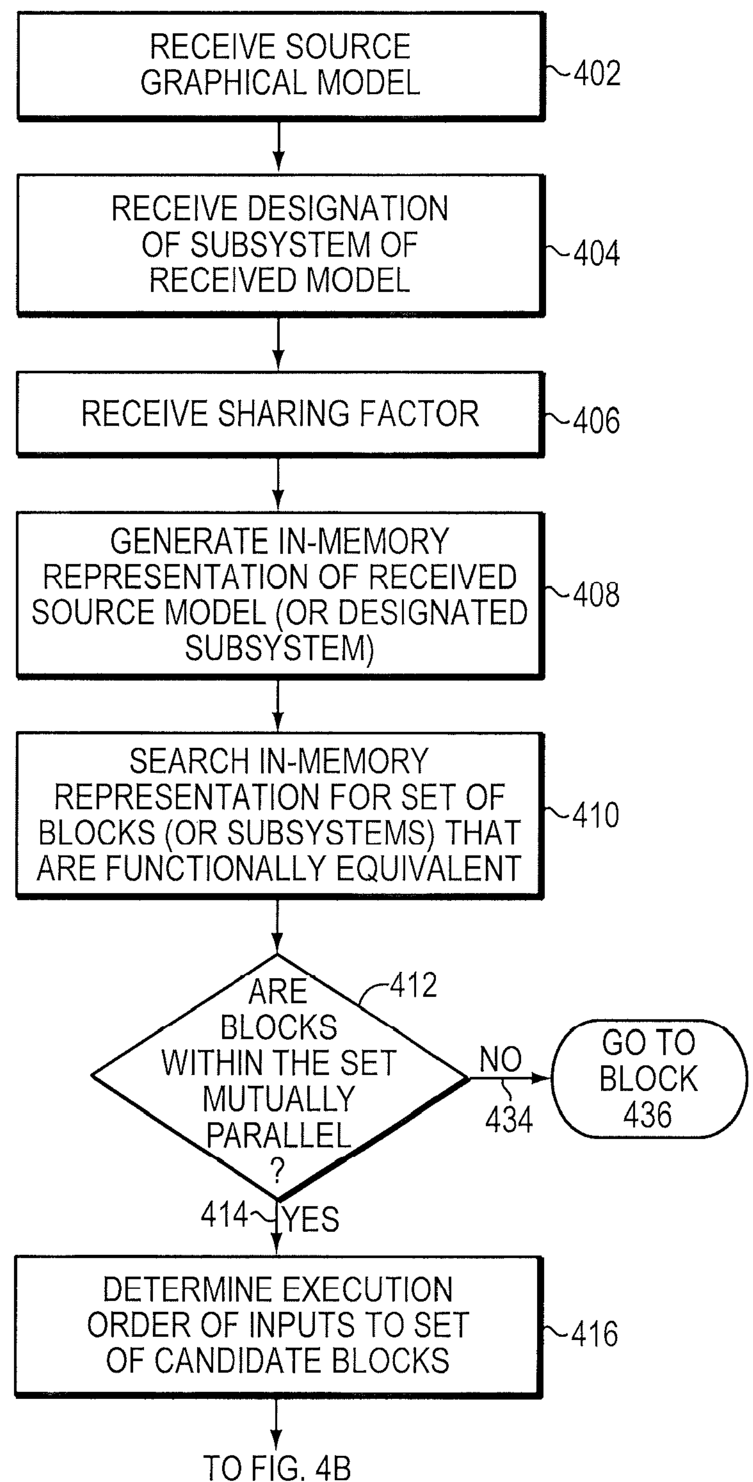
FIGS. 4A-E are partial views of a flow diagram of a method in accordance with an embodiment of the present disclosure.
Figure 4B:
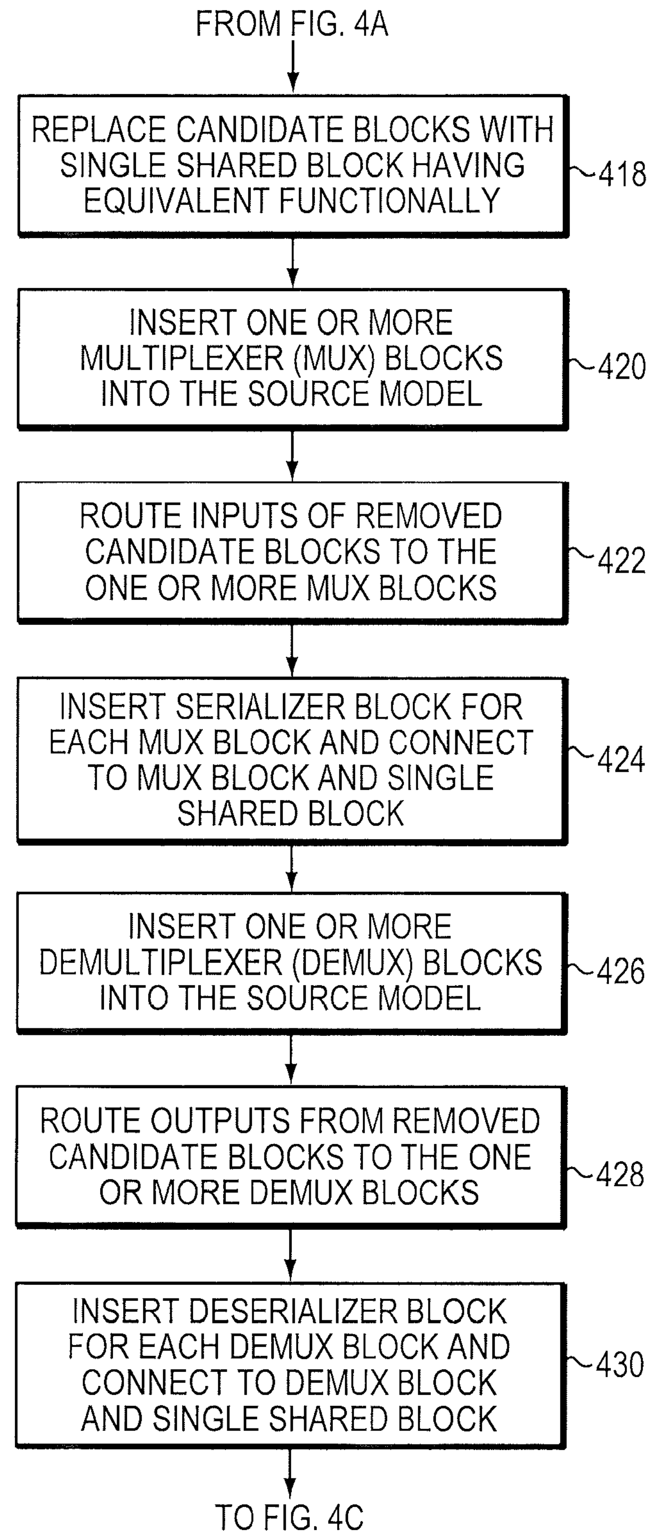

If the candidate blocks are mutually parallel, the resource sharing engine 224 may determine the order of execution of the inputs to the set of candidate blocks, as originally arranged in the source model, that are to be replaced with a single shared instance of the block, as indicated by Yes arrow 414 leading to step 416. The resource sharing engine 224 may determine the execution order of the block inputs by performing a breadth first traversal of the source model. The determined execution order may be stored in a list, such as an ordered list. The resource sharing engine 224 may delete the candidate blocks identified as functionally equivalent, and insert a single shared block with the shared functionality in their place, as indicated at step 418 (FIG. 4B).

Alternatively, the resource sharing engine 224 may select one of the candidate blocks that is to be retained within the model, as modified, and delete the other candidate blocks. For example, the first block in a candidate block ordered list may be selected.

Next, the resource sharing engine 224 may further modify the source model by inserting one or more, e.g., K, Multiplexer (Mux) blocks into the model, as indicated at step 420, where K equals the number of inputs of the single shared block. Each Mux block inserted into the source model may have a plurality, e.g., N, inputs and one output, where N is the number of candidate blocks that were selected for sharing. The one or more Mux blocks are inserted on the input side of the single shared block. The resource sharing engine 224 then routes the inputs of the candidate blocks that were removed from the model to the inputs of the K Mux blocks that were inserted into the source model, as indicated at step 422. The inputs of the removed blocks are routed to the one or more Mux blocks based on the previously determined execution order of the inputs. In general, the $i^{th}$ input of the $x^{th}$ candidate block is routed to the $x^{th}$ input of the $i^{th}$ Mux block. For example, the second input of the first candidate block is routed to the first input of the second Mux block. Similarly, the first input of the third candidate block is routed to the third input of the first Mux block, and so on.

Next, the resource sharing engine 224 may insert a Serializer block between each Mux block and the single shared block, as indicated at step 424. Furthermore, the vector output of each Mux block may be routed to the Serializer block inserted for that Mux block, and the output of the Serializer may be routed to one of the inputs of the single shared block. In addition, the resource sharing engine 224 may insert one or more, e.g., L, Demultiplexer (Demux) blocks each having one input and a plurality, e.g., M, outputs into the source model being modified, where L equals the number of outputs of the single shared resource, and M is the number of candidate blocks that were selected for sharing, as indicated at step 426. The one or more Demux blocks may be inserted on the output side of the single shared resource. The outputs from the deleted candidate blocks may be routed to the outputs of the one or more, e.g., L, Demux blocks, as indicated at step 428. The outputs may be routed in the same manner as described above in connection with the inputs to the Mux block. That is the $i^{th}$ output of the $x^{th}$ candidate block may be connected to the $x^{th}$ output of the $i^{th}$ Demux block.

The resource sharing optimizer 224 may insert a Deserializer block into the source model being modified between each Demux block that was added, and the single shared block, as indicated at step 430. Furthermore, the output of the single shared block may be routed to the input of its respective Deserializer block, and the output of the Deserializer block may be routed to its respective Demux block, as indicated at step 432 (FIG. 4C).

Figure 4C:
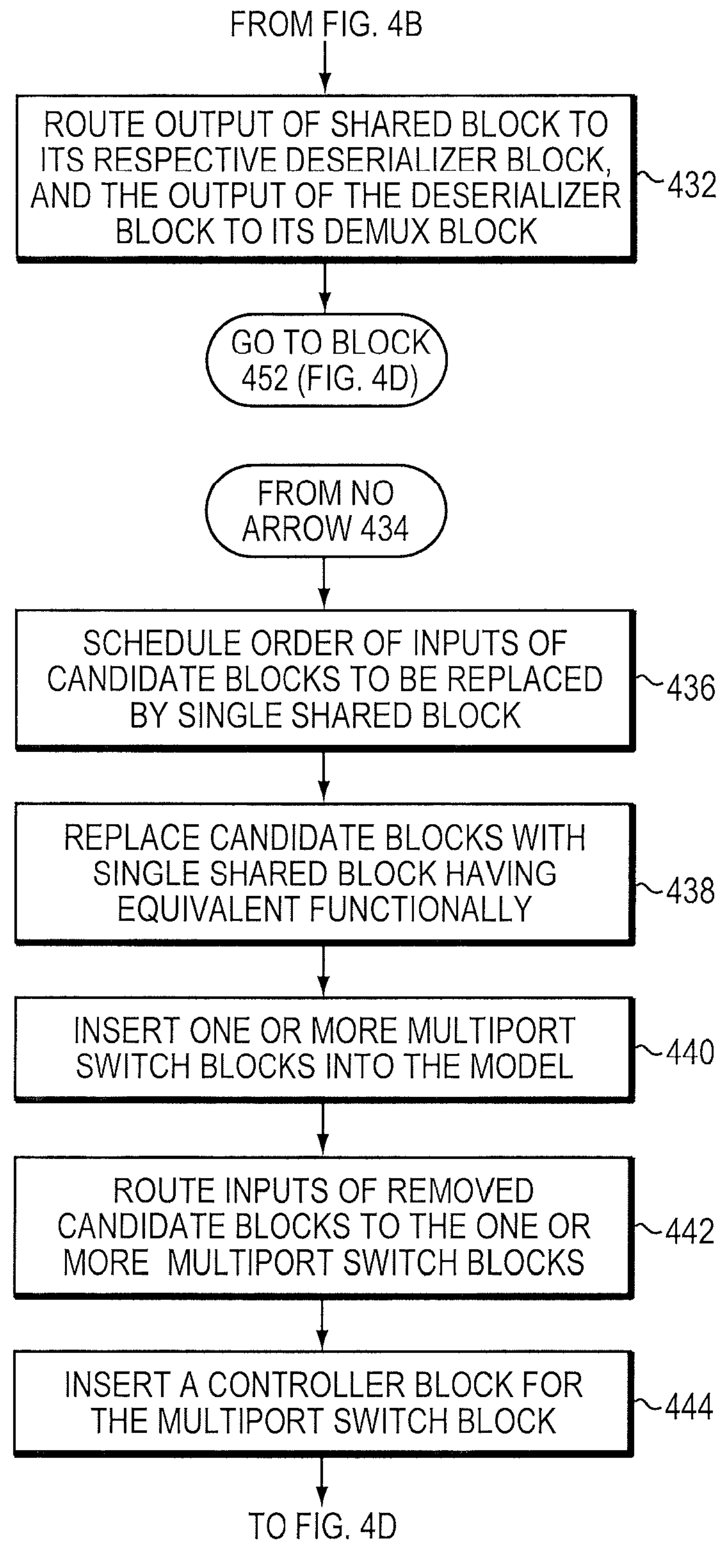

Now, returning to decision step 412, if a data dependency exists among the candidate blocks, then the resource sharing optimizer 224 may schedule the order of the one or more inputs of each candidate block that are to be shared by a single shared block, based on the execution step of the source model at which the respective input is processed, as indicated by No arrow 434 (FIG. 4A) leading to step 436 (FIG. 4C). The resource sharing engine 224 may delete the data-dependent candidate blocks, and insert a single shared block with the shared functionality in their place, as indicated at step 438.

One or more, e.g., G, Multiport Switch blocks may be inserted into the model, as indicated at step 440, where G equals the number of inputs of the single shared block. Each Multiport Switch block inserted into the source model may have a plurality, e.g., J, inputs, a control input, and one output, where J is the number of candidate blocks that were selected for sharing. The signal received on the control input controls which input of the Multiport Switch block is routed to its output. For example, if the received control input is '3', the third input may be switched to the output. The one or more Multiport Switch blocks may be inserted on the input side of the single shared block. The inputs of the candidate blocks that were removed are routed to the inputs of the one or more Multiport Switch blocks that were inserted, as indicated at step 442. As described above in connection with the mutually parallel blocks, the inputs of the removed blocks are routed to the one or more Multiport Switch blocks based on the previously determined execution order of the inputs. Again, the $i^{th}$ input of the $x^{th}$ candidate block may be routed to the $x^{th}$ input of the $i^{th}$ Mux block. A Controller block is inserted into the model and operatively coupled to each of the one or more Multiport Switch blocks that was added, as indicated at step 444. The resource sharing optimizer 224 may configure the Controller block to control the outputs of the Multiport Switch blocks based on the determined execution step order of the removed blocks.

Figure 4D:
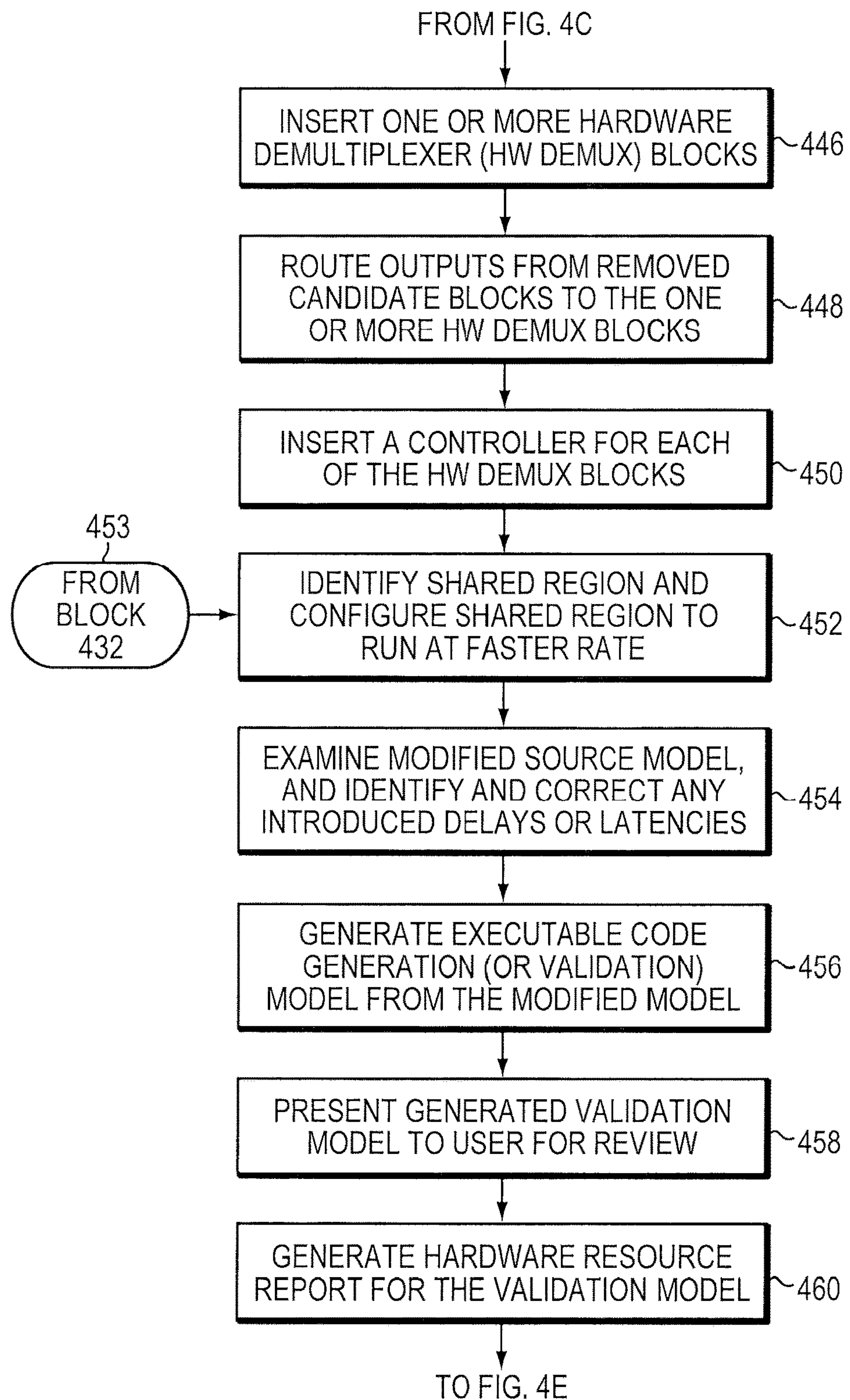

Next, the resource sharing engine 224 may insert one or more, e.g., H, Hardware Demultiplexer (HW Demux) blocks each having one input, a control input, and a plurality, e.g., I, outputs into the source model being modified, where H equals the number of outputs of the single shared resource, and I is the number of candidate blocks that was selected for sharing, as indicated at step 446 (FIG. 4D). The HW Demux block, which is at the model-level, operates like the Multiport Switch block but in reverse. The one or more HW Demux blocks may be inserted on the output side of the single shared resource. The outputs from the deleted candidate blocks may be routed to the outputs of the one or more HW Demux blocks, as indicated at step 448. The outputs of the HW Demux blocks may be routed in the same manner as described above in connection with the Demux blocks. A Controller block also may be inserted into the model and operatively coupled to each of the one or more HW Demux blocks, as indicated at step 450.

The resource sharing optimizer 224 also may identify a shared region, e.g., a subgraph of the source model as modified, and configure this subgraph to operate at a faster rate as compared to the rest of the source model 300, as indicated at step 452. The faster rate of the subgraph, or more accurately the portion of the modified PIR corresponding to the subgraph, may be a function of the number of identical blocks that have been replaced by a single shared block. For example, if four blocks have been replaced by a single shared block, then the subgraph may be configured to run at a rate that is at least four times faster than its original rate. The shared region or subgraph may be identified by the resource sharing optimizer 224 as including: the shared block; and any block of the model where there exists a path from the shared block to this block and there is a path from this block to another shared block that is not the first shared block. In an embodiment, the subgraph does not have any loops or cycles.

It should be understood that, in the mutually parallel case, only the shared block may be operated at the faster rate.

As discussed above, the resource sharing process may differ depending on whether the candidate blocks are determined to be mutually parallel or data-dependent. In an embodiment, the resource sharing engine 224 may be configured to treat two blocks as mutually parallel, even if there exists a data connectivity between them. Specifically, the resource sharing engine 224 may be configured to determine if there is a delay block at the output of at least one of the two candidate blocks having the data connectivity. If not, a retiming technique, such as pipelining, may be applied in order to move an existing delay in the model to the output of at least one of the candidate blocks. In response to the existence of such a delay block, the resource sharing engine 224 may treat the two candidate blocks as mutually parallel, and apply the processing discussed above for mutually parallel candidate blocks. As part of the resource sharing processing, the resource sharing engine 224 or the delay balancing engine 226 removes, e.g., "consumes", the one or more delay blocks to account for the delay being introduced by sharing the resource.

In an embodiment, the resource sharing optimizer 224 is further configured to share a resource located within a feedback loop of the source graphical model.

Figure 8:
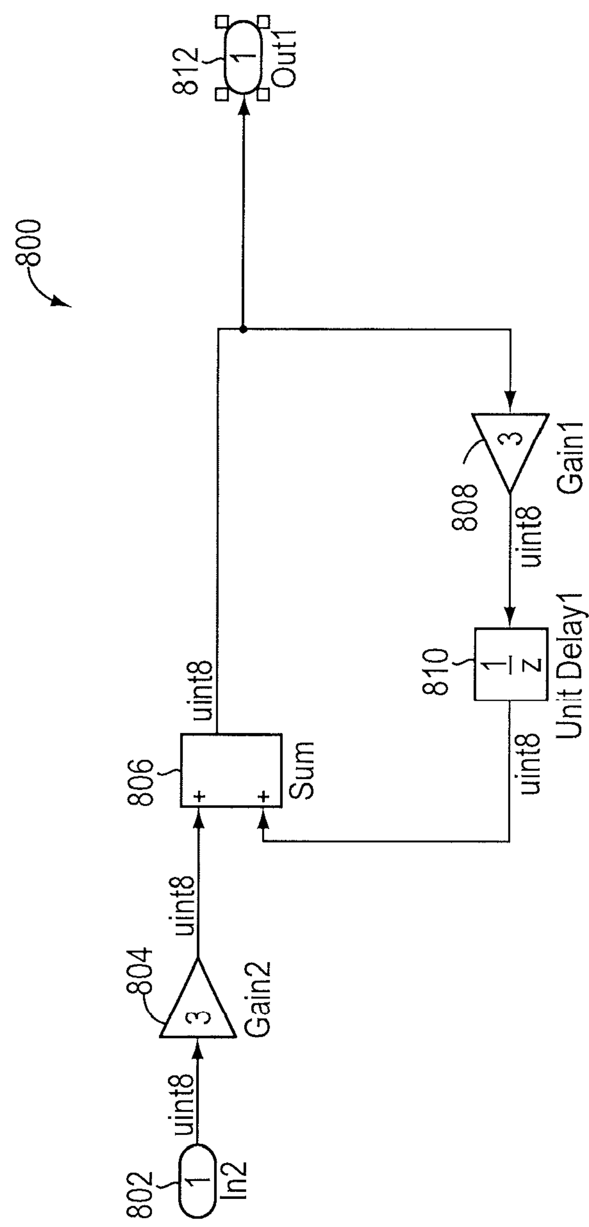
FIG. 8 is a schematic illustration of a feedback loop of a graphical program.

FIG. 8 is a schematic illustration of a feedback loop 800 that may form or represent part of a source graphical model. The feedback loop 800 includes an Inport block 802, a first Gain block 804, a Sum block 806, a second Gain block 808, a Delay block 810, and an Outport block 812. As shown, the output of the Sum block 806, which leads to the Outport block 812, also branches off to feed an input of the Sum block 806 via the second Gain block 808 and the Delay block 810. The resource sharing optimizer 224 may be configured to share the two Gain blocks 804, 808, the second of which is located within a feedback loop.

A cycle in a dependency graph, such as a data dependency graph, may be considered a feedback loop. The dependencies may be algebraic or direct, or they may include delays or non-direct relations. The dependencies may have varying degrees of strictness such as, for example, a dependency that requires one block to always execute immediately following another block. A weaker dependency may require a block to execute following another block, but the sequence may possibly be interspersed by other blocks executing. Dependencies may be conditional and only enabled for certain values in the model.

Figure 9:
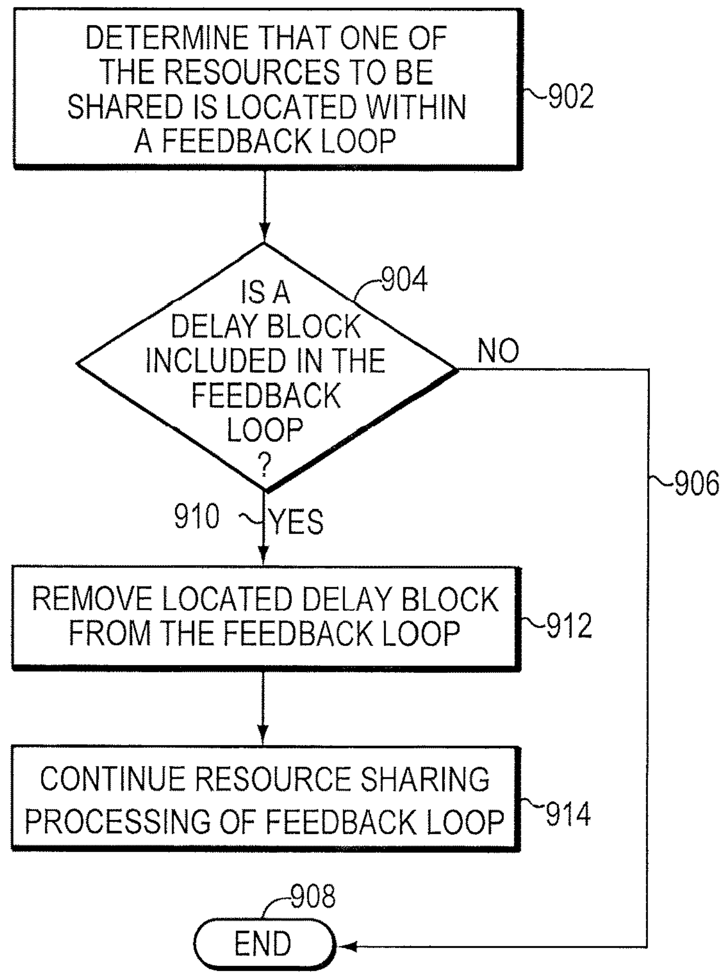
FIG. 9 is a flow diagram of a method in accordance with an embodiment of the present disclosure.

FIG. 9 is a flow diagram of an embodiment of additional steps that may be performed by the resource sharing optimizer 224 when including a resource located within a feedback loop as one of the resources being shared. The resource sharing optimizer 224 may determine based on its analysis of the PIR, that one of the resources to be shared is located within a feedback loop of the source graphical model, as indicated at step 902. If so, the resource sharing optimizer 224 may determine whether a delay block is also present within the feedback loop at the output of the shareable resource, as indicated by decision step 904. If not, a retiming technique may be applied to the model in order to move a delay that already exists somewhere else in the model to the output of the shareable resource. If no delay block is present at the output of the shared resource, and no existing delay block can be moved to that location, the resource sharing optimizer 224 may conclude that the resource within the feedback loop cannot be shared, as indicated by No arrow 906 leading to end step 908. If a delay block is located within the feedback loop, the resource sharing optimizer 224 may remove it, as indicated by Yes arrow 910 leading to step 912. The existing delay block is removed to account for the delay introduced as a result of the sharing process, and thus the latency of the feedback loop remains unchanged. After removing the delay block from the feedback loop, the sharing optimizer 224 may continue or resume the resource sharing process described above in connection with FIGS. 4A-E, as indicated at step 914. For example, processing may continue at step 412 (FIG. 4A).

In an embodiment, the source graphical model 300 may be a time-based model that executes once every one or more time steps over a period of time. Each step of the source model 300 may correspond to one clock cycle of the hardware description generated for the source model. A system master clock may be provided for the generated hardware description code, and this system master clock may be configured to run at a faster rate than the nominal sample rate of the source model 300. A timing controller may receive the system master clock signal, and be configured to provide clock (clk) and clock enable signals to the various components of the hardware description code at the appropriate rates, e.g., using counters and multiple clock enables.

In an embodiment, separate clocks may be provided for each domain operating at a different rate, thereby eliminating the need for timing controllers.

One result of changing the rate of the modified PIR, is the introduction of latencies or delays in one or more data paths through the model 300. If a latency or delay is introduced in a first path in the model 300, and this first path merges with a second path for which no (or a different) delay was introduced, then the signals or data represented by these two paths may no longer be aligned with each other. Such a mismatch or misalignment may result in incorrect results being produced if the modified model was to be executed, or hardware code generated from the modified model was to be run. In an embodiment, the delay balancing engine 226 cooperates with the streaming optimizer 222 to evaluate the PR as it is being modified, to identify and account for, e.g., correct, such latencies or delays automatically. The delay balancing engine 226 thus ensures that merging paths remain aligned with each other as specified in the source model.

In an embodiment, the delay balancing engine 226 automatically inserts one or more Delay blocks in the source model, and configures the inserted Delay blocks to return the data paths back into time wise alignment. The delay balancing engine 226 may sum the delays introduced along each path of the source model 300 as a result of the optimizations being performed by the streaming optimizer 222. At each join point of the source model 300, i.e., at each point where two paths merge together, the delay balancing engine 226 computes a sum of delays for each path up to the join point, and determines whether the sum of delays computed for each path is equal. If the sums computed for each path are not equal, for example one path has a higher computed delay than another path, then the delay balancing engine 226 may insert a Delay block into the path having less delay, and may configure the inserted Delay block so that the sums computed for all of the merging paths is equal at the join point being evaluated. The inserted Delay block also may be configured to operate at the same rate as the other signals at the join point being evaluated. This process is repeated at all of the join points in the model as optimized by the streaming optimizer 222 to ensure that the data remains aligned as specified in the original source model 300.

In an embodiment, the delay balancing engine 226 may consider each edge of the modified PIR. Each edge may correspond to a signal, data, or control path of the modified model. An edge being evaluated extends between a source or driver block and a destination or receiver block. The delay balancing engine 226 may evaluate the other edges that join at the same receiver block as the subject edge, and determine the value of the maximum or highest latency at these other edges. In addition, the delay balancing engine 226 may determine the delay, if any, introduced by the source block for the subject edge. The delay balancing engine 226 may compute the difference between the determined maximum latency and the latency introduced at the subject edge's source block. If the computed difference is greater than zero, the delay balancing engine 226 may insert a Delay block into the subject edge, i.e., between the source and destination blocks. The delay balancing engine 226 also may configure the inserted Delay block so that it provides a delay that aligns the latencies introduced at the destination block, for example, by choosing a delay that is equal to the computed difference.

In an embodiment, the delay balancing engine 226 is also configured to consider the rate at which delays are introduced along the edges of the modified PR. For example, suppose a single delay at a rate of 5 is introduced on a first edge, and a single delay of rate 10 is introduced on a second edge. While the number of delays along these two edges is equal, i.e., they are both 1, the delays are not aligned because of a rate mismatch. The delay balancing engine 226 may normalize the rates of delays before comparing them. The single delay at rate 5 may be translated to a delay of 2 units at rate 10. Upon normalizing the rates, a mismatch is now identified by the delay balancing engine 226. That is, the first edge has a delay equivalent to 2 units at rate 10, while the second edge has a single delay at rate 10. In this case, the delay balancing engine 226 may add a single delay to the second edge, so that the second edge now has two delays at rate 10.

In addition to considering the model's join points, the delay balancing engine 226 may also identify and evaluate each of the rate transition boundaries of the source model as modified, because the rate transition may itself be a source of data misalignment. Exemplary rate transition boundaries include Downsample and Upsample blocks, or other blocks operating at multiple rates. For a Downsample block having a downsample factor of K (the output is K times slower than the input), the delay balancing engine 226 may insert a delay at the input of the Downsample block with a rate matching the faster input rate of the Downsample block, and configured with a delay given by:

$$\text{Input\_Delay}=K-(N\ \%\ K),\ \text{where}$$

N represents the number of new delays introduced along the path ending in the input to the downsampling block, % is the modulo operation, and K may be given by the output rate divided by input rate.

In addition, the delay balancing engine 226 may compute the total delay at the output of the Downsample block, which value may be used in subsequent evaluations of the source model as modified, as follows:

$$\text{Downsample\_Output\_Delay}=\text{ceil}(N/K)\ \text{where}$$

ceil is a function that rounds the input (N/K) to the nearest integer greater than (N/K). This new output_delay is operating at the slower, output rate of the Downsample block.

For an Upsample block, where the rate goes from slower to faster, the delay balancing engine 226 may not insert a Delay block. The delay balancing engine 226 may compute the total delay at the output of an Upsample block having an upsample factor of K, again for use in subsequent evaluations of the model as modified, as follows:

$$\text{Upsample\_Output\_Delay}=(\text{input delay at the Upsample block})*K$$

This computed delay is operating at the faster, output rate of the Upsample block.

In an embodiment, the functionality performed by the delay balancing engine 226 may be selectively disabled and enabled, e.g., by the user, as desired. The functionality may be disabled or enabled by setting a property, such as a BalanceDelays property of the code generation process, to 'on' or 'off'. If the delay balancing engine 226 is disabled, then the user may need to manually account for the introduction of any delays into the source model.

In some implementations, even though it may be disabled from automatically balancing delays, the delay balancing engine 226 may still determine the locations at which one or more delays should be inserted to balance delays that may have been introduced. The determined locations may be indicated on a display of the model, for example through one or more graphical affordance that may be overlaid onto a visual display of the model. For example, the one or more graphical affordance may be overlaid or displayed adjacent to signal, data, or control lines or at ports of model elements, or the signal, data, or control lines or at ports of model elements may be highlighted, labeled, or otherwise made visually identifiable to a user. The user may insert delays at one or more of the marked locations. In some implementations, the delay balancing engine 226 may provide suggested modifications, such as a suggestion to insert one or more delay elements into the model, and the user may choose to accept or reject one or more of the suggested modifications.

As described, the resource sharing optimizer 224 and delay balancing engine 226 may change the original PIR that was created from the source graphical model 300. For example, new blocks, such as Serializer, Deserializer, Rate Transition, and Delay blocks, may have been added, and the rate of at least a portion of the source model 300 may have been changed. This modified version of the original PIR may be referred to as a code generation PIR, and optimized hardware description code may be generated from the code generation PIR. In an embodiment, a technique is provided that verifies that this modified, i.e., code generation, PIR still produces the same results as the original PIR, which was generated from the source graphical model 300. Specifically, the graphical model generator 216 may receive the code generation PIR, and generate an executable code generation graphical model, which may also be referred to as a validation model, from the code generation PR. That is, the graphical model generator 216 may create a validation graphical model that includes blocks for the nodes or components that were added to the original PR. In addition, the graphical model generator 216 may interconnect these blocks based on the edges of the modified, i.e., code generation, PIR, for example, by adding lines or labeling input and output. The validation model produced by the graphical model generator 216 may be presented to the user for evaluation, e.g., on display 120.

In an embodiment, the validation process, including the generation of the validation model from the code generation PR, may be disabled or enabled by, e.g., the user. For example, a user may set a property, such as a GenerateValidationModel property, of the code generation process either 'on' or 'off'.

Figure 10:
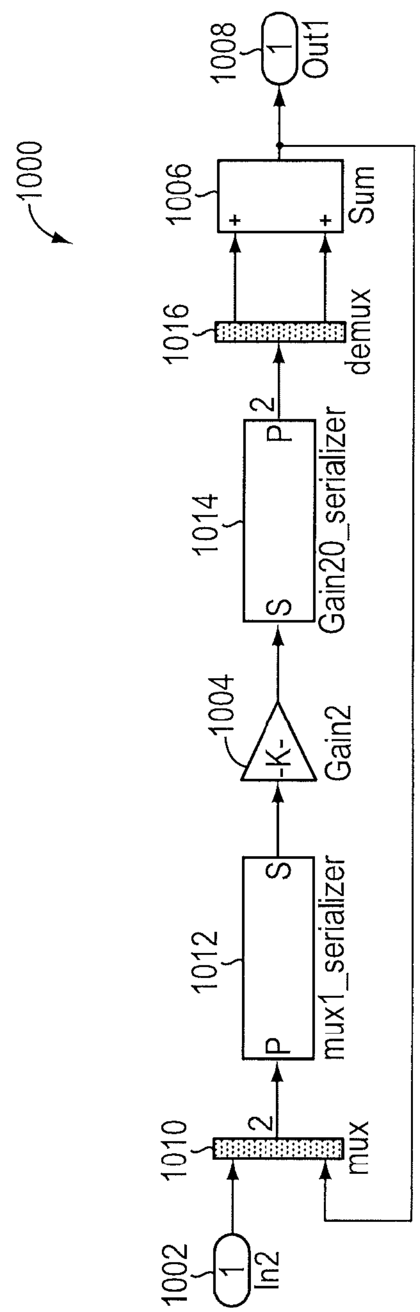
FIG. 10 is a schematic illustration of a validation model in accordance with an embodiment of the present disclosure.

FIG. 10 is a schematic illustration of a validation model 1000 generated for the feedback loop 800 (FIG. 8). The validation model 1000 includes an Inport block 1002, a single Gain block 1004, a Sum block 1006, and an Outport block 1008. The validation model 1000 also includes a Mux block 1010, a Serializer block 1012, a Deserializer block 1014, and a Demux block 1016. As with the original feedback loop 800, the output of the Sum block 1006, which feeds the Outport block 1008, also branches off and loops to an input of the Sum block 1006 via the Mux block 1010, the Serializer block 1012, the shared Gain block 1004, the Deserializer block 1014, and the Demux block 1016.

Note that the Delay block 810 of the feedback loop 800 has been removed, and is not present in the validation model 1000.

It should be understood that the feedback loop 800 of FIG. 8 is intended for illustration purposes only, and that the resource sharing optimizer 224 may operate with other, possibly more complex, feedback loops.

In addition, the delay balancing engine 226 may cooperate with the resource sharing optimizer 224 to evaluate the PIR as it is being modified, to identify and account for, e.g., correct, any latencies or delays that have been introduced automatically, as indicated at step 454. In particular, a Delay block of the source model with a delay of $Z^{-k}$ may be expanded to have a delay of $Z^{-(k*Shf)}$, where Shf is the specified sharing factor. Furthermore, if a data-dependent path exists between two shared blocks that is solely combinational, i.e., the path is delay-less, then the delay balancing engine 226 may insert a delay at the end of this path. This avoids the creation of an algebraic loop, which might cause a scheduling issue during execution or simulation in some technical computing environments. The delay balancing engine 226 thus ensures that merging paths in the source model remain aligned with each other. More specifically, the delay balancing engine 226 may automatically insert one or more Delay blocks in the source model and configure the inserted Delay blocks so as to return the data paths back into alignment. Specifically, the result of the resource sharing optimization process may be the introduction of two cycles of delay at the subgraph; one for the rate change operation to faster rates and the other for completing the execution of the shared subgraph. This delay of two cycles may be balanced at higher levels of the model.

As shown, the delay balancing engine 226 may balance or otherwise account for delays introduced in the source model 300 by the streaming or resource sharing engines 222, 224 without adding or requiring a handshake protocol to be implemented on any of the model's signals, data paths, control paths, or communication channels. In an embodiment, the delay balancing engine 226 also does not add or implement a scheduler to any of the signals, data paths, control paths, or communication channels of the source model 300. Similarly, the delay balancing engine 226 may not insert any new values, such as synchronization or absent values, to the data ranges of any of the model's signals, data paths, control paths, or communication channels. As a result, such synchronization or absent values may not need to be added to the information contained in any source or input data blocks or files utilized by the source model 300. Likewise, such synchronization or absent values may not need to be removed from any sink or output data blocks or files of the source model 300.

Processing from step 432 (FIG. 4C), which dealt with the mutually parallel paths, may also continue at step 452, as indicated by from step 453 (FIG. 4D).

In an embodiment, the number of functionally equivalent blocks that are marked as candidate blocks for removal in place of a single, shared block by the resource sharing optimizer 224 is user-configurable. More specifically, the user may set the degree of sharing that is performed through the sharing factor. For example, in response to the user specifying a sharing factor of four, the resource sharing optimizer 226 may seek to replace groups of four functionally equivalent blocks with a single shared block. If the sharing factor is two, the sharing optimizer 224 may seek to replace groups of two functionally equivalent blocks with a single shared block. In those cases where there is a choice of which blocks to replace with a shared block, the sharing optimizer 224 may be configured to group and select those blocks that are most similar. The similarity may be determined based on block parameters, block input/output, and checksums of characteristics and functionality. For example, if there are four functionally equivalent Gain blocks, and two of them have the same gain parameter, then for a sharing factor of two, the two Gain block with the same gain parameter may be replaced as a group. The determination of similarity may be user configurable.

The process of identifying functionally equivalent blocks that may be shared and replacing these blocks with a single shared block may also be applied to subsystems. That is, if multiple subsystems are determined to be functionally equivalent or identical, and each subsystem is atomic, then the subsystems may all be replaced with a single shared subsystem. The process is the same as described above for blocks of the source model.

As with the streaming optimizer 222, a validation model may be generated from the source model (or an in-memory representation), as modified by the resource sharing optimizer 224 and the delay balancing engine 226, as indicated at step 456. The validation model may be presented to the user, as indicated at step 458.

Figures 5, 5A:
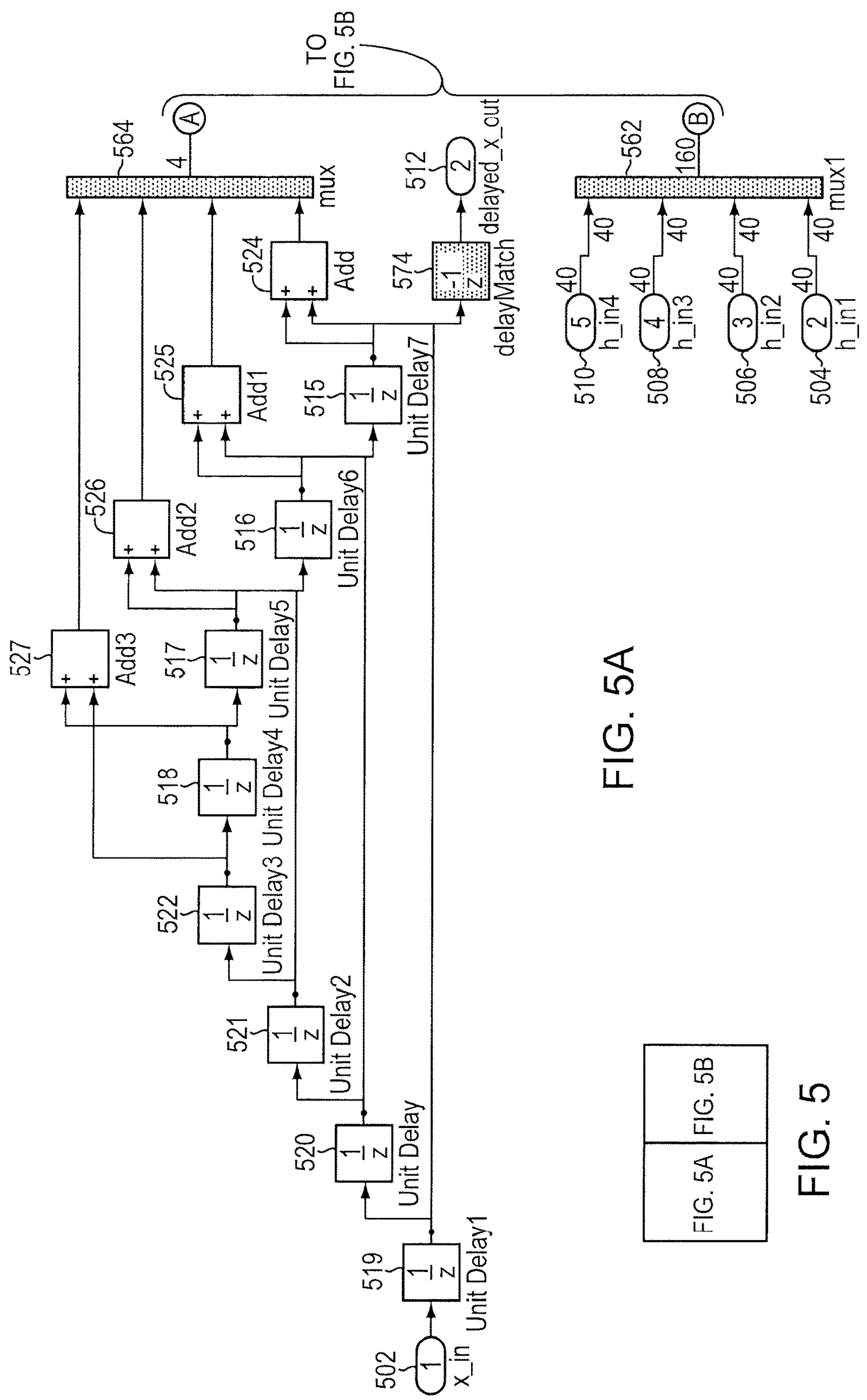
FIG. 5 is a smaller scale view indicating the positions of FIGS. 5A and 5B to form a whole view.
FIGS. 5A and 5B are partial views of a schematic illustration of a validation model in accordance with another embodiment of the present disclosure.
Figure 5B:
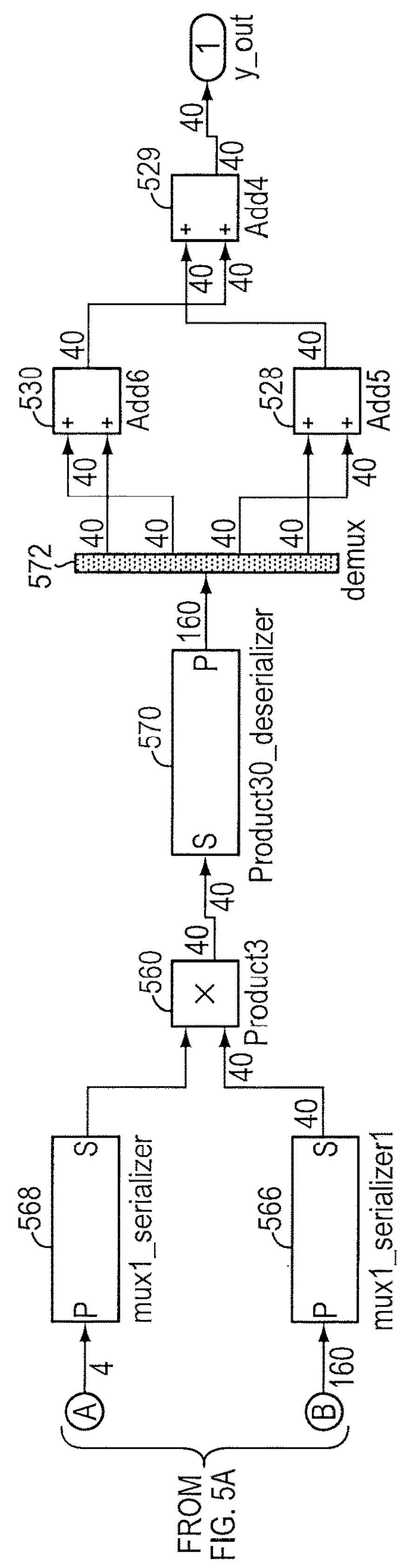

FIGS. 5A and 5B are partial views of a schematic illustration of a validation model 500 that represents an optimized version of the source model 300 in which the four Product blocks 332-335 have been replaced with a single shared Product block 560. FIG. 5 is a smaller scale view indicating the positions of FIGS. 5A and 5B to form a whole view. For source model 300, the resource sharing optimizer 224 determines that the four Product blocks 332-335 are fully parallel. Accordingly, the resource sharing optimizer 224 follows the sharing optimization process described above for fully parallel blocks.

Validation model 500 may be generated by the graphical model generator 216, and presented to the user, e.g., on the display 120. Like the source graphical model 300, the validation model 500 also has a scalar Inport block 502, four vector Inport blocks 504-810, a scalar Outport block 512, and a vector Outport block 514. Validation model 500 also includes eight Unit Delay blocks 515-522. Validation model 500 also includes seven Add blocks 524-530, and the one shared Product blocks 560. Validation model 500 also includes several other blocks that have been added as a result of the optimizations performed by the resource sharing optimizer 224, as described above in connection with FIGS. 4A-E. Specifically, a first Mux Block 562 receives as its inputs the Inports 504-510. A second Mux block 564 receives at its inputs signals from the Add blocks 524-527. A first Serializer block 566 receives the output of the first Mux block 562, and the output of the first Serializer block 566 is routed to one of the inputs of the one Product block 560 being shared. The first Serializer block 566 receives a 160-element wide vector from the first Mux block 562, and outputs a 40-element wide vector to the one Product block 560. A second Serializer block 568 receives the output of the second Mux block 564, and the output of the second Serializer block 568 is routed to the second input of the one Product block 560. The second Serializer block 568 receives a 4-element wide vector, and outputs a scalar. A Deserializer block 570 receives a 40-element wide vector from the one Product block 560, and outputs a 160-element wide vector to a Demux block 572 that has been added by the resource sharing optimizer 224. A Delay Matching block 574 has also been added.

The validation model 500 also may be used together with the source model 300 in a validation environment to test that the outputs produced by the validation model 500 are identical to the outputs produced by the source model 300 with necessary delays added to balance the outputs of the source model 300 with the outputs of the validation model 500. For example, the validation model 500 may be received by the validation engine 230, which may be configured to produce a validation environment that allows the source graphical model 300 to be compared directly to the validation model 500. The user may cause the validation environment to be run. That is, the simulation or execution engine of the technical computing environment 124 may run, e.g., execute, the validation environment. It should be understood that validation environment may also be run programmatically.

The report generator 221 may be directed to produce a report that describes or lists the resources that would be required to implement the validation model 500 in hardware, as indicated at step 460. For example, a user-settable parameter may be asserted, e.g., set to 'on', that causes the report generator 221 to generate a hardware resource report upon creation of the modified PR and/or validation model 500. Alternatively, the user may operate the GUI to direct the report generator 221 to create the report. The hardware resource report may be presented to the user, e.g., on the display 120. It may also be saved in memory and/or printed.

Figure 4E:
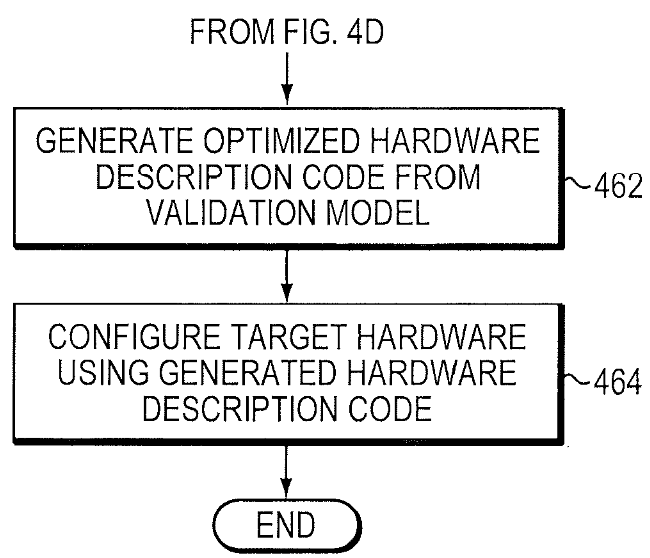

Furthermore, if the user is satisfied with the operation of the validation model 500, and with the resource savings achieved by the resource sharing optimizer 224 (or the savings achieved by a combination of the streaming and resource sharing optimizers), the modified PIR may be used to generate optimized hardware description code, as indicated at step 462 (FIG. 4E). More specifically, the back-end processing unit 218 may interface with the IR generator 214 to generate optimized hardware description code from the modified PIR. This optimized hardware description code may be converted into a serial bit stream for synthesizing one or more target hardware devices, as indicated at step 464.

Figure 6:
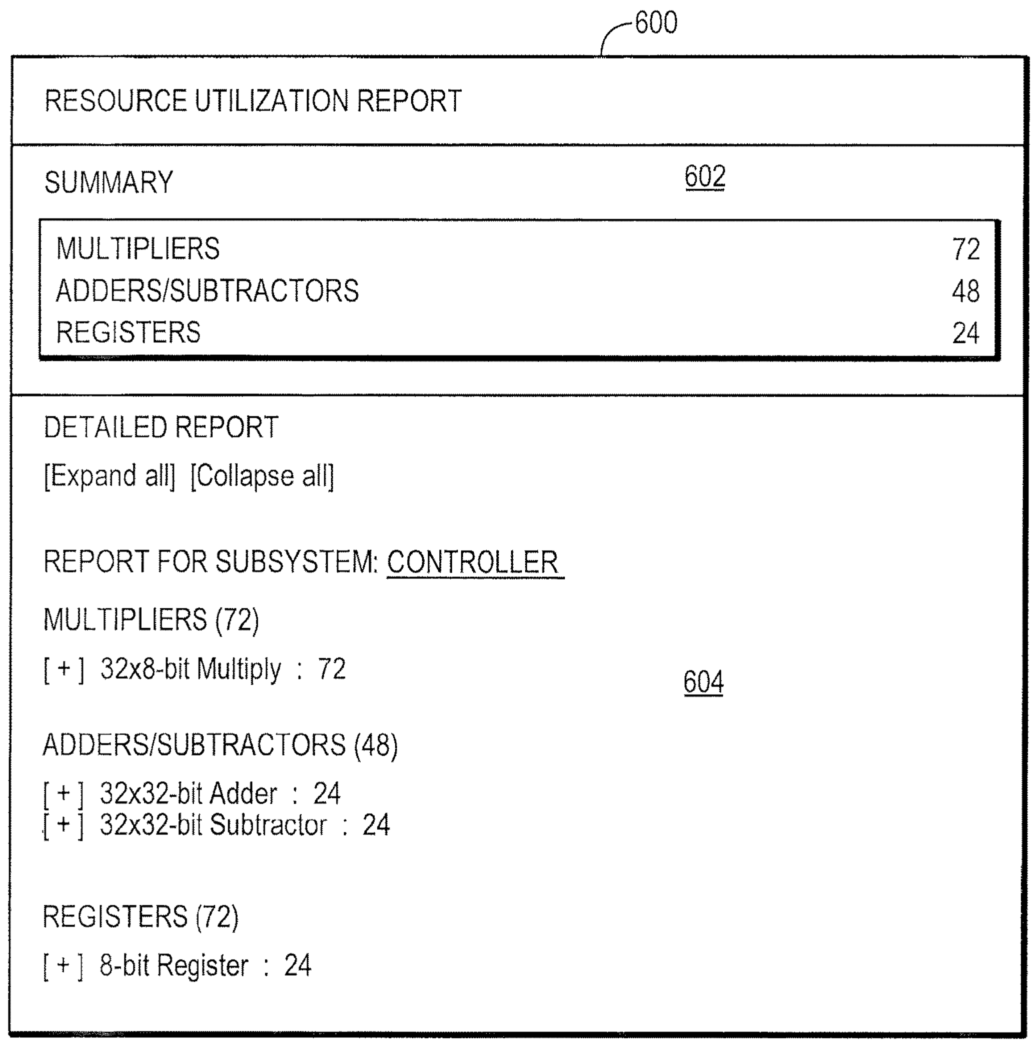
FIG. 6 is a schematic illustration of a resource report for a source model.

FIG. 6 is a schematic illustration of a resource report 600 produced by the report generator 221 for a source model. The report 600 may be presented to a user, e.g., on display 120. Report 600 may include a summary section 602 and a detailed section 604. The summary section 602 may list the number of hardware components needed to implement the source model, such as the number of multipliers, adders/subtractors, and registers, among other hardware components. The detailed section 604 may provide further information regarding these components, such as their sizes. As shown, to implement the source model in hardware, 72 multipliers, 48 adders/subtractors, and 24 registers are needed.

FIG. 7 is a schematic illustration of a resource report 700 produced by the report generator 221 for an optimized version of the source model corresponding to FIG. 6. The source model may be optimized by the streaming optimizer, the resource sharing optimizer, or both. As shown, report 700 also includes a summary section 702, and a detailed section 704. Following the optimizations described herein, implementation of the optimized version of the source model only requires three multipliers, and two adders. However, as shown, applying the optimizations described herein results in an increase in the number of registers that are required, i.e., from 24 for the source model corresponding to FIGS. 6 to 210.

In an embodiment, the report may be automatically synchronized with user selected parameters for the optimization such as the sharing factor. For example, as one of the parameters, such as the streaming factor Sf or the sharing factor, is changed by the user, a report may automatically show how this change may affect the required resources, such as the number of registers required. For example, a parameter may be associated with a graphical slider bar, and a user may change the value of the parameter by moving the graphical slider bar within a range of possible values. This information may be displayed in a prominent location such as, for example, in a corner of the model canvas. The report may include information about alternate parameter choices, for example, as a table of parameter values, such as the streaming factor Sf or the sharing factor, and corresponding hardware resources that may be required for each respective parameter value. The report may be generated before the user commits to a choice of a parameter.

In an embodiment, the user may indicate a particular target hardware device, and an indicator may be provided if the selected parameters for code generation require more resources than what is available on the target hardware device.

It should be understood that reports 600, 700 may be produced in a number of formats, such as a HyperText Markup Language (HTML) format for viewing with a browser application, a word processing format for viewing with a word processing application, a spreadsheet format for viewing with a spreadsheet application, a database format for viewing with a database application, etc.

It should also be understood that the optimizations performed by the streaming and resource sharing optimizers 222, 224 may both be applied to the same source model 300 to increase the level of optimization. For example, the streaming optimization process may be applied to the validation model 500 so that the 40-element wide vector at the one shared Product block 560 is converted into a scalar.

Figure 11:
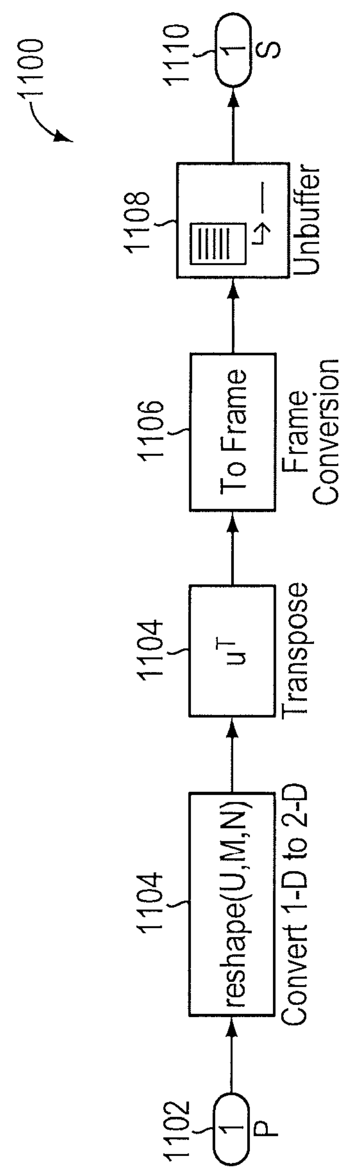
FIG. 11 is a schematic illustration of a Serializer subsystem.

In an embodiment, the Serializer and Deserializer blocks may each be implemented through an arrangement of blocks organized as a subsystem. FIG. 11 is a schematic illustration of a Serializer subsystem 1100, which includes a plurality of interconnected blocks. For example, the Serializer subsystem 1100 may have an Inport block 1102 that receives, e.g., the vector input, and a Convert 1-D to 2-D block 1104 that reshapes a received vector or matrix to a vector or matrix of a specified size. The Serializer subsystem 1100 also may include a Transpose block 1104 that transposes an M-by-N input matrix to an N-by-M output matrix, and a To Frame Conversion block 1106 changes the sampling mode from sample-based to frame-based. The Serializer subsystem 1100 may include an Unbuffer block 1108 that unbuffers an input matrix row-wise so that each row of the input matrix becomes an independent time-sample in the output. Finally, the Serializer subsystem 1100 may include an Outport block 1110 that provides the, e.g., serialized, output.

Figure 12:
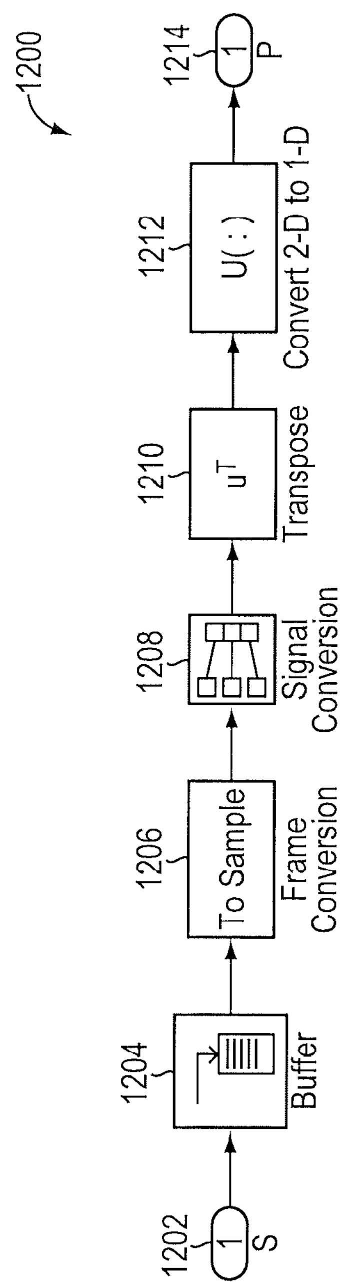
FIG. 12 is a schematic illustration of a Deserializer subsystem.

FIG. 12 is a schematic illustration of a Deserializer subsystem 1200, which includes a plurality of interconnected blocks. For example, the Deserializer subsystem 1200 may have an Inport block 1202 that receives, e.g., a serial input, and a Buffer block 1204 that redistributes data in each column of an input frame to produce an output with a different frame size than the input, for example, a larger size at a slower rate. The Deserializer subsystem 1200 also may include a To Sample Conversion block 1206 that changes the sampling mode from frame-based to sample-based. The Deserializer subsystem 1200 may include a Signal Conversion block 1208 that stores elements in contiguous memory. The Deserializer subsystem 1200 may further include a Transpose block 1210 that transposes an M-by-N input matrix to an N-by-M output matrix. The Deserializer subsystem 1200 may include a Convert 2-D to 1-D block that reshapes a matrix input to a 1-D vector. Finally, the Deserializer subsystem 1200 may include an Outport block 1214 that provides the, e.g., parallel, output.

Alternatively, the Serializer and Deserializer blocks may be implemented through code blocks, such as the Embedded MATLAB function block of the Simulink product. More specifically, MATLAB code may be written to implement the Serializer and Deserializer functionality, for example, the functionality illustrated in FIGS. 11 and 12, and this code may be associated with respective Embedded MATLAB function blocks.

In a further embodiment, the Serializer and Deserializer blocks may represent corresponding hardware descriptions that may be utilized during code generation. Those skilled in the art will understand that the Serializer and Deserializer blocks may be implemented in other ways.

Figure 13:
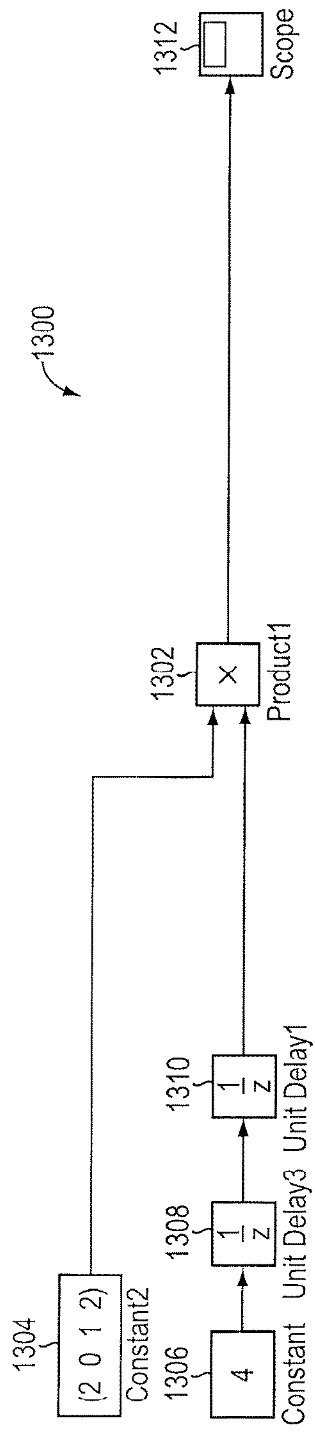
FIG. 13 is a schematic illustration of a portion of a source graphical model.

In an embodiment, the streaming optimizer may be further configured to perform additional optimizations as a function of data values within the source graphical model, such as constant values, and/or in the data being input to the source model. FIG. 13 is a schematic illustration of a portion 1300 of a source graphical model. The model portion 1300 includes a Product block 1302 that has as a first input the output of a Constant block 1304, and as a second input the output produced by a sequence of blocks, e.g., a second Constant block 1306 and two Unit Delay blocks 1308, 1310, whose initial condition values may be set to different values. The output of the Product block 1302 may be provided to a Scope block 1312.

The streaming optimizer may be configured to examine fixed or otherwise known values being input to one or more pre-selected blocks, such as Product blocks. If the input values include a 1 or 0, then the output of the Product is known in advance, and the output value need not be computed by the Product block. The streaming optimizer may take this information into consideration when generating the Serializer and Deserializer blocks associated with the subject Product block.

Figure 14:
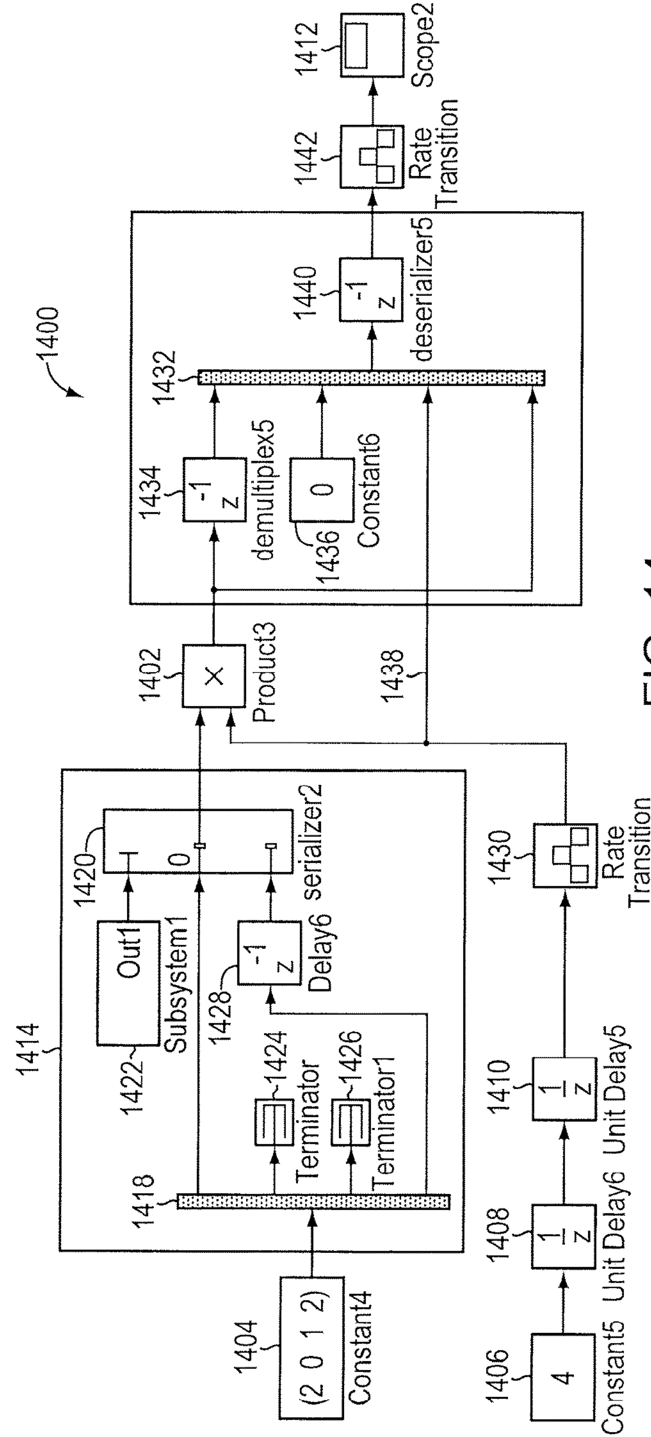
FIG. 14 is a schematic illustration of a validation model.

FIG. 14 is a schematic illustration of a portion 1400 of a code generation model generated for the streaming optimizer for the portion 1300 of the source model. The code generation portion 1400 includes a Product block 1402, a first Constant block 1404, a second Constant block 1406, two Unit Delay blocks 1408, 1410, and a Scope block 1412. The code generation portion 1400 also includes a Serializer subsystem 1414 and a Deserializer subsystem 1416. The Serializer subsystem 1414 includes a Demux block 1418 and a Multiport switch block 1420 that is controlled by a Controller block 1422, which may be a counter. The outputs of the Demux block 1418 that correspond to the 0 and 1 values of the first Constant block 1404 may be provided to or accessed by Terminator blocks 1424, 1426, because these values do not need to be provided to the Product block 1402, as they have no effect on the output computed by the Product block 1402. The Serializer subsystem 1414 may also include a Delay block 1428 associated with the last value of the first Constant block 1404. The output of the Multiport Switch block 1420 is provided as an input to Product block 1402. A Rate Transition block 1430 may also be inserted into the code generation portion 1400 to receive the data values from the second Constant and Unit Delay blocks 1406, 1408, 1410, and provide those values to the other input of the Product block 1402.

The Deserializer subsystem 1416 may include a Mux block 1432 that receives the output computed by the Product block 1402. Specifically, the Mux block receives the first and fourth output values computed by the Product block 1402. The first output value may be delayed by a Delay block 1434. As described above, the second and third values of the first Constant block 1404 are not provided to the Product block 1402. Instead, the streaming optimizer configures the Mux block 1432 to receive a 0 value for the second output of the Product block 1432 through third Constant block 1436. In addition, the streaming optimizer configures Serializer and Deserializer subsystems 1414, 1416 so that the values from blocks 1406, 1408, 1410 are delivered directly to the Mux block 1432, for example, by signal line 1438, by-passing the Product block 1402 entirely. The Deserializer subsystem 1416 may also include a Delay block 1440. Another Rate Transition block 1442 may be inserted into the code generation portion 1400 to between the Deserializer subsystem 1416 and the scope block 1412.

It should be understood that the Serializer and Deserializer subsystems 1414, 1416 may also include the Rate Transition blocks 1430, 1342, respectively.

As shown, instead of computing four output values, the Product block 1402 of the code generation model portion 1400 only computes two output values. As a result, while the streaming optimizer configures the Product blocks 1402 and the Serializer and Deserializer subsystems 1414, 1416 to operate at a higher clock rate than the time step of model portion 1300, this higher clock rate may not be as fast as would otherwise be required if the Product block were computing four outputs.

Other components may be used to implement the Serializer and Deserializer subsystems.

Similar optimizations may be implemented by the streaming optimizer for other blocks besides Product blocks. For example, similarly optimizations may be implemented for Add and Subtraction blocks that receive 0 as input values, and for Divide blocks that receive 1 as in input value.

In addition to examining values within the source graphical model, the streaming optimizer may be configured to examine values of input data to the graphical model. For example, an input to a source model may be a sparse matrix that has mostly 0 values. In this case, the streaming optimizer may be configured to implement the increased optimization described above. Such a sparse matrix may, for example, correspond to one or more image files taken in low light conditions.

Sharing Resources Whose Inputs have Different Data Types

In some embodiments, resources whose inputs have different data types may be shared by the resource sharing optimizer 224. In an embodiment, the resources that may be shared include multipliers, where the term multiplier is intended to broadly cover any element that performs a multiplication operation, such as multipliers, gains, and product elements. Other resources that may be shared include adders. The term data type may refer to the way in which data, such as numbers, are represented in computer memory. A data type may determine the amount of storage allocated to a number, the method used to encode the number's value as a pattern of binary digits, and the operations available for manipulating the data type. Different data types may have different precision, dynamic range, performance, and memory usage. A fixed-point data type may be characterized by a word length in bits, the position of the binary point, and whether the fixed-point data type is signed or unsigned. A signed fixed-point data type may be represented using one's complement, two's complement, or a sign bit.

Figure 15:
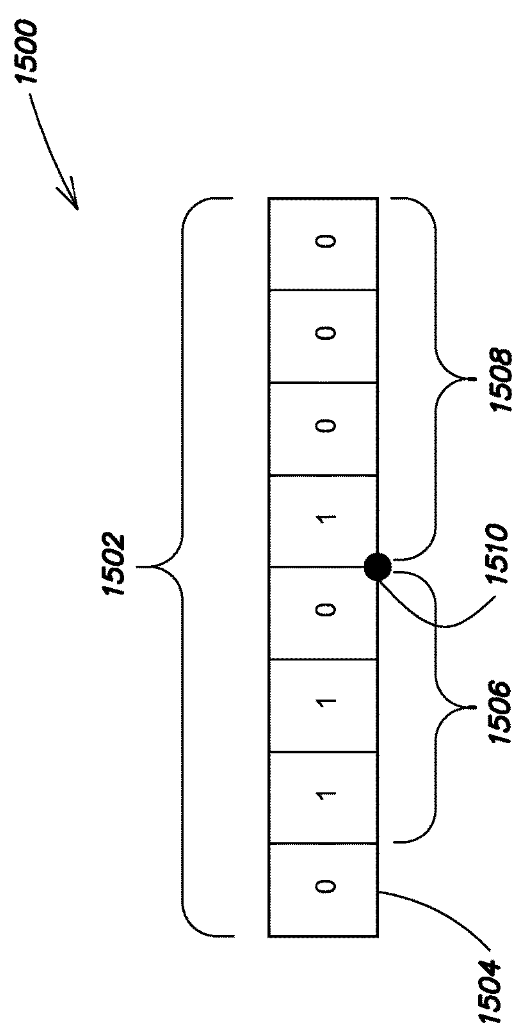
FIG. 15 is a schematic illustration of a fixed point data type.

FIG. 15 is a schematic illustration of a fixed-point data type 1500 that may be used to represent real-world values, such as rational numbers. The fixed-point data type 1500 has a word length 1502, which is the total number of bits in the representation, for example, eight bits. The fixed-point data type 1500 may include a sign bit 1504, a whole number part 1506, and a fractional part 1508. The whole number part 1506 and fractional parts 1508 are defined by the location of a binary point 1510. The value of the sign bit 1504 indicates whether the number is positive or negative with '0' specifying a positive number, and '1' specifying a negative number. The whole number part 1506 may be the binary equivalent of the decimal whole number of the rational number being represented in fixed-point format. The fractional part 1508 may be the binary equivalent of the decimal fraction of the rational number being represented, divided by the resolution of the fixed point representation, which is the smallest nonzero value that the fixed point number can represent. The fraction part 1508 may thus determine the resolution of the fixed point data type, which is the smallest nonzero value that the fixed point data type can represent. Resolution may alternatively be referred to as precision. The resolution of the fixed point data type 1500 is 0.0625, i.e., $(1/2)^4$.

The term range may refer to the span of numbers that a given fixed-point data type can represent. The range of the fixed point data type 1500 is −8 (i.e., $2^3$) to +7.9375 (i.e., $2^3$ minus the resolution. The fixed point data type 1500 illustrates the binary value 01101000, which is the binary equivalent of the base ten value +6.5.

Scaling may refer to the technique used to represent real-world values, such as rational numbers, as fixed-point numbers. With binary point-only scaling, scaling is defined by moving the binary point left or right. Changing the location of the binary point in a fixed-point data type causes a trade-off between range and resolution. With slope-bias scaling, a real-world value may be encoded according to the scheme:

$$V=SQ+B$$

where

V is the real-world value being encoded,

S is the slope,

Q is an integer (also referred to as the stored integer or quantization value) that encodes V with the binary point assumed to be at the far right of the word length, and B is the bias.

In some examples, the slope may be represented as $$S=F2^E,$$

where

F is a slope adjustment factor, such that $1 \le F < 2$, and $2^E$ specifies the binary point, and E is the fixed power-of-two exponent.

In some implementations, S and B are constants that are not stored in the hardware directly. Only the quantization value is stored in memory.

For binary-point-only scaling, F=1 and B=0, thus the general equation becomes $$V=Q2^E$$

Different programming languages may use different syntaxes or notations to represent fixed point data types. For example, for binary-point-only scaling, a fixed point data type may be represented as:

fixdt(Signed, WordLength, FractionLength), where

'Signed' specifies whether the fixed point data type is signed (0) or unsigned (1), 'WordLength' specifies the word length in bits, e.g., 8 bits, 16-bits, 32-bits, etc., and 'FractionLength' specifies the fraction length in bits, e.g., 1, 2, 3, etc. Fraction length may be positive or negative. Fraction length may also be larger or smaller than the word length.

A fixed point data type using binary-point-only scaling may be represented as:

'sfixXX_EnYY' to represent a signed fixed point data type with a word length of XX and negative exponent or a fraction length of YY, as indicated by the 'n' in 'En'. For example, 'sfix32_En2' represents a signed fixed point data type with a word length of 32 and a fraction length of 2; and 'ufixXX_EnYY' to represent an unsigned fixed point data type with a word length of XX and a negative exponent or fraction length of YY. For example, 'ufix16_En4' represents an unsigned fixed point data type with a word length of 16 and a fraction length of 4.

Additional representations include:

'sfixXX_EYY' to represent a signed fixed point data type with a word length of XX and a positive exponent of YY; and 'ufixXX_EYY' to represent an unsigned fixed point data type with a word length of XX and a positive exponent YY.

Here, 'E', as opposed to 'En', indicates a positive exponent which means a big number is being represented.

As noted, in some implementations, fraction length may be larger than the word-length, e.g., sfix32_En40 or sfix32_E40. The former means some number, e.g., 8, of the leading zeros after the binary point are not represented, while the latter means that some number, e.g., 8, of the trailing zeros before the binary point are not represented.

For slope-bias scaling, a fixed point data type may be represented as:

fixdt(Signed, WordLength, FractionLength, Slope, Bias), where

'Signed' specifies whether the fixed point data type is signed (0) or unsigned (1), 'WordLength' specifies the word length in bits, and 'Slope' and 'Bias' specify values for slope-bias scaling.

Figure 16A:
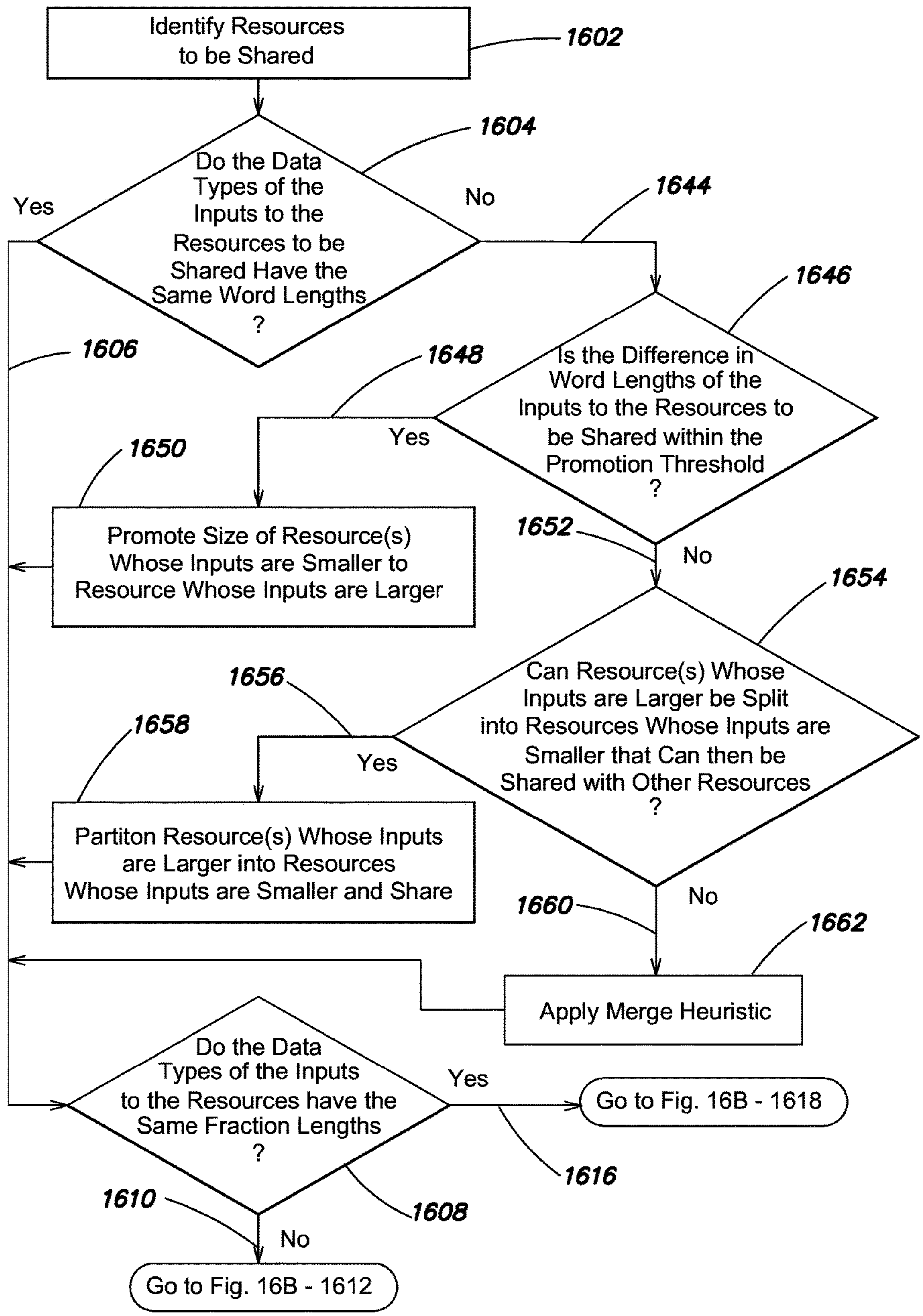
FIGS. 16A-16C are partial views of a flow diagram of a method in accordance with an embodiment of the disclosure.
Figure 16B:
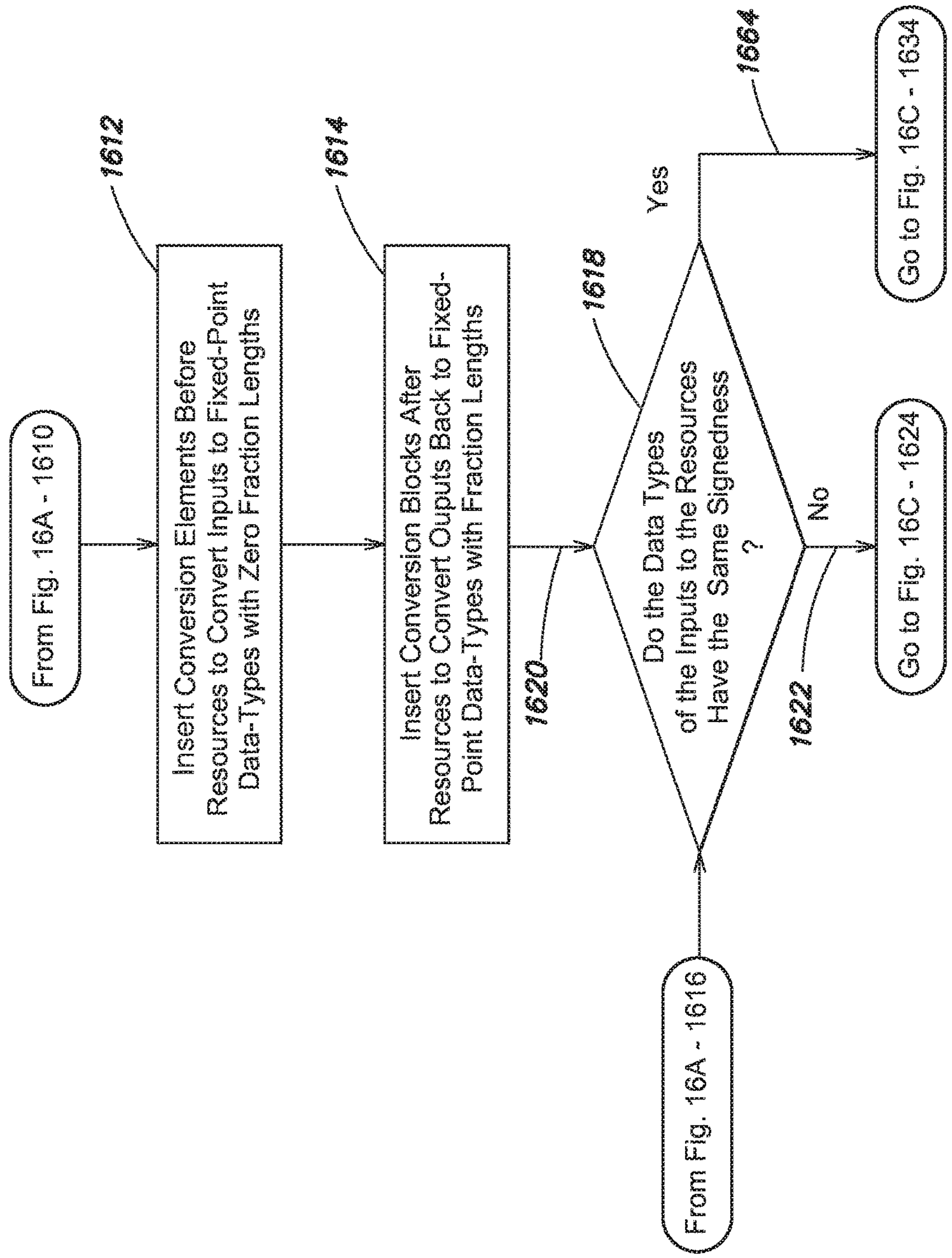

FIGS. 16A and 16B are partial views of a flow diagram of a method for sharing resources whose inputs have different data types in accordance with an embodiment. The resource sharing optimizer 224 may identify a plurality of resources, such as multipliers, of a source model to be shared, as indicated at step 1602. The resource sharing optimizer 224 may determine whether the fixed point data types of the inputs of the resources to be shared have the same word lengths, as indicated at decision step 1604. If the data types have the same word lengths, the resource sharing optimizer 224 may determine whether the data types have the same fraction lengths, as indicated by Yes arrow 1606 leading to decision step 1608.

Different Fraction Lengths

Suppose the data types of the inputs to two or more resources to be shared, such as multipliers, have different fraction lengths. The resource sharing optimizer 224 may modify the source model so that the resources whose inputs have different fraction lengths may be shared. In some embodiments, the resource sharing optimizer 224 may insert into an IR created for the source model one or more elements that convert all of the inputs received by the resources to be shared to fixed-point data types having zero fraction lengths, as indicated by No arrow 1610 leading to step 1612 (FIG. 16B). The conversion elements added to the source model may not change the word length or signedness of the inputs, and may only change the fraction length from its initial value to zero. Furthermore, the conversion elements may not change the bit pattern or bit sequence of the input. For example, if the bit pattern of the input is 0 1 1 0 1 0 0 0, then the bit pattern of the output is also 0 1 1 0 1 0 0 0. The location of the binary point, however, is changed. For example, while the binary point for the input may be between the fourth and fifth bits, the binary point after the conversion may be after the last bit, e.g., thus indicating zero fraction length.

The resource sharing optimizer 224 also may insert into the IR constructed for the source model one or more elements that convert the demuxed outputs from the shared resource to fixed-point data types with fraction lengths, as indicated at step 1614. Again, the conversion elements may not change the word length or signedness of the outputs, just the fraction length from zero back to its original value. Similarly, the conversion elements for the outputs may not change the bit patterns or bit sequences of the outputs. The conversion elements may merely move the location of the binary point.

In some embodiments, the conversion elements may be Data Type Conversion blocks of the Simulink modeling environment where the Data Type Conversion blocks are set to ‘Stored Integer’ mode in which the block preserves the raw bit pattern of the value, sometimes referred to as the stored integer value, of the input, within the limits of the resolution of the fixed point data type, during conversion. Nonetheless, it should be understood that other model elements or combinations thereof that convert fixed point data types may be used. For example, in C++, a reinterpret cast may be used.

Different Signedness

Figure 16C:
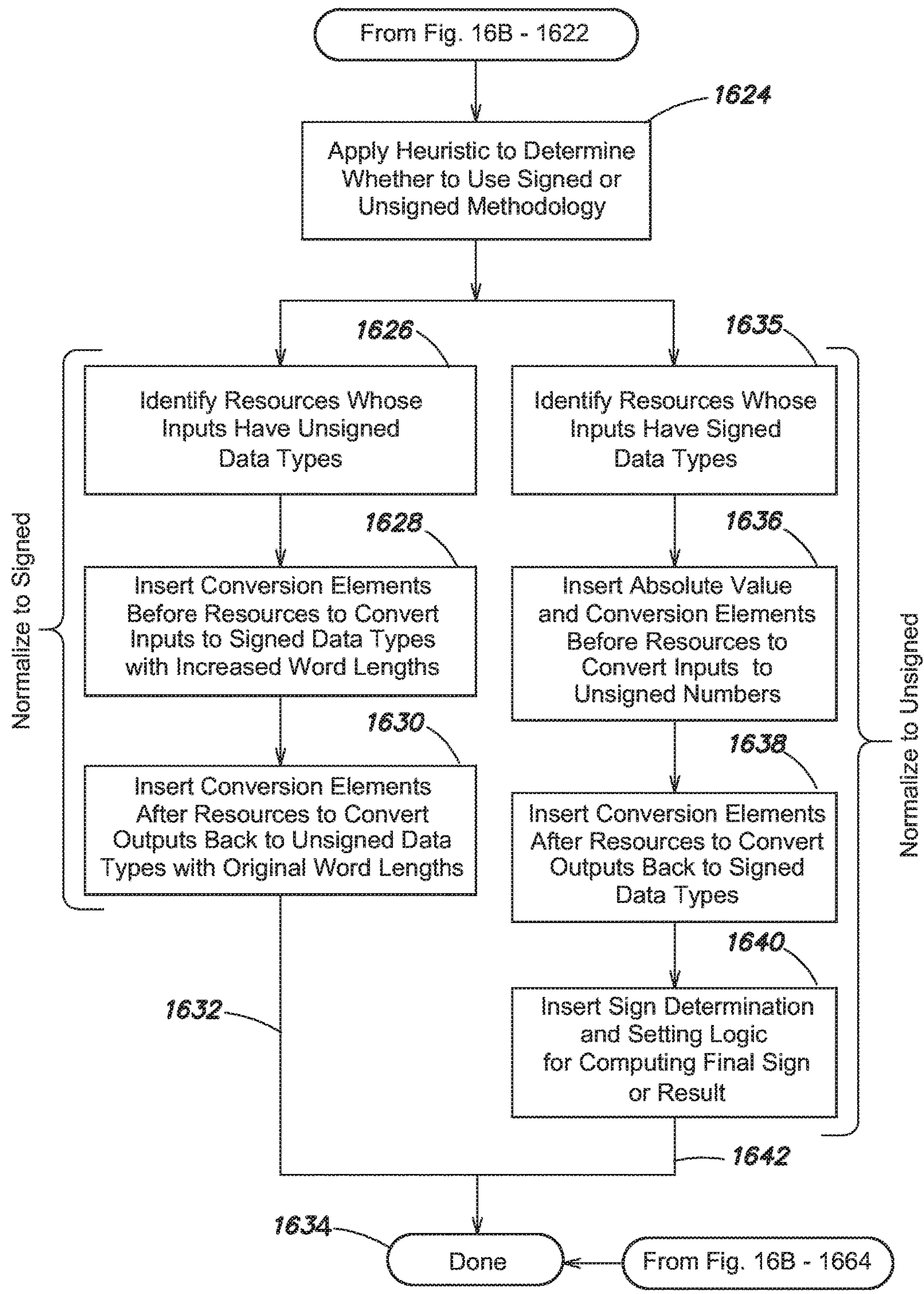

Returning to decision step 1608 (FIG. 16A), if the data types of inputs to the resources to be shared have the same fraction lengths, the resource sharing optimizer 224 may determine whether the data types have the same signedness, as indicated at Yes arrow 1616 leading to decision step 1618 (FIG. 16B). The determination whether the inputs to the resources to be shared have the same signedness may also be made following steps 1612 and 1614, as indicated by arrow 1620 leading to decision step 1618. Suppose the data types of the inputs to the resources to be shared have different signedness. In some embodiments, the resource sharing optimizer 224 may have multiple different methodologies for sharing resources whose inputs have different signedness, and the resource sharing optimizer 224 may select and apply one of the methodologies. For example, a first methodology may convert the data types to signed numbers, while a second methodology may convert the data types to unsigned numbers. The resource sharing optimizer 224 or a heuristics engine may apply a heuristic to determine which of the methodologies to apply, as indicated by No arrow 1622 leading to step 1624 (FIG. 16C).

Suppose, as a result of the heuristic, the resource sharing optimizer 224 chooses to convert the data types to signed numbers. The resource sharing optimizer 224 may identify those resources whose input data type is unsigned, as indicated at step 1626. The resource sharing optimizer 224 may insert into the IR constructed for the source model one or more elements that convert the inputs received by the resources having unsigned data types to signed data types, as indicated at step 1628. The conversion elements added to the IR may also increase the word length by one bit to provide a sign bit to the fixed point data type. The conversion elements may not change the fraction length of the inputs. The resource sharing optimizer 224 also may insert into the IR one or more elements that convert the demuxed outputs from the shared resource back to unsigned data types and that also reduce the word lengths by one, as indicated at step 1630. Again, the conversion elements may not change the fraction length of the outputs, just the signedness from signed to unsigned and the word length by reducing the word length by one.

Suitable conversion elements include the Data Type Conversion blocks of the Simulink modeling environment where the Data Type Conversion blocks are set to ‘Stored Integer’ mode in which the block preserves the stored integer value of the input, within the limits of the resolution of the fixed point data type, during conversion. Nonetheless, it should be understood that other model elements or combinations thereof that convert fixed point data types may be used.

Having resolved differences in fraction length and signedness in the example where the data types have the same word length, processing may be complete, as indicated by arrow 1632 leading to done step 1634.

Returning to step 1624, suppose upon applying the heuristic, the resource sharing optimizer 224 determines that the unsigned methodology should be applied. The resource sharing optimizer 224 may identify resources to be shared having inputs with signed fixed point data types, as indicated at step 1635. The resource sharing optimizer 224 may insert into the IR one or more elements that take the absolute value of the signed inputs received by the resources to be shared and that also convert the inputs to unsigned data types, as indicated at step 1636. The conversion elements may not change the word length or the fraction length of the inputs. The resource sharing optimizer 224 also may insert into the IR one or more elements that convert the demuxed outputs from the shared resource from unsigned back to signed data types, as indicated at step 1638. Again, the conversion elements may not change the word length or the fraction length of the outputs, just the signedness from unsigned to signed. If a resource being shared has a signed output signal, the resource sharing optimizer 224 also may add sign determination and setting logic to the IR, as indicated at step 1640. The sign determination and setting logic may determine the sign of a signed input signal to the resource, and set the sign of the demuxed signed output signal from the shared resource to either positive or negative, as appropriate.

With differences in fraction length and signedness resolved, processing may be complete, as indicated by arrow 1642 leading to the done step 1634.

Different Word Lengths

Returning to decision step 1604 (FIG. 16A), suppose the resource sharing optimizer 224 determines that the resources to be shared process fixed point data types having different word lengths. The resource sharing optimizer 224 may determine whether the differences in word length of the inputs to the resources to be shared is within a promotion threshold, as indicated by No arrow 1644 leading to decision step 1646. The promotion threshold may specify the limit to which a resource may be promoted to a larger size. For example, suppose a model includes two multipliers whose inputs have word lengths of 32 and 16. To share these two multipliers, the promotion threshold must be set to 16 or higher. If the promotion threshold is set to 8 for example, then the two multipliers will not be shared. Promoting a multiplier to a larger size may have an adverse effect on the area usage and timing of a programmable logic device. The use of a promotion threshold may limit such adverse effects. In some embodiments, a user may specify the promotion threshold, for example through a graphical affordance or a Command Line Interface (CLI).

If the difference in word length of the inputs to the resources to be shared is within the promotion threshold, the resource whose input word length is smaller may be promoted to a resource whose input word length is larger to permit sharing, as indicated by Yes arrow 1648 leading to step 1650. Processing may then continue at decision step 1608. If the difference in input word length is outside of the promotion threshold, the resource sharing optimizer 224 may determine whether one or more resources whose inputs are a first word length can be split into multiple resources whose inputs are a second word length that is smaller than the first word length, that can be shared, as indicated by No arrow 1652 leading to decision step 1654. If so, the one or more resources whose input word lengths are larger may be split into resources whose input word lengths are smaller, as indicated by Yes arrow 1656 leading to step 1658. For example, if there are two multipliers and the inputs to the first multiplier have a word length of 32 bits and the inputs to the second multiplier have a word length of 16 bits, but the promotion threshold is 8, then the multiplier whose inputs have a word length of 32-bits may be split into two multipliers whose inputs have a word length of 16-bits, resulting in three multipliers whose inputs have a word length of 16-bits. The three multipliers whose inputs have a word length of 16-bits may be replaced with a single shared multiplier. Processing may then continue at decision step 1608.

Multipliers may be promoted to any larger word length, and split to any smaller word length.

If the one or more larger resources cannot be split into smaller resources, then a heuristic may be applied to determine whether resources to be shared may be merged, as indicated by No arrow 1660 leading to step 1662. A heuristic is described herein in connection with FIG. 29.

Processing may then continue with decision step 1608. Returning to decision step 1618 (FIG. 16B), if the data types of the resources have the same signedness, then processing may be complete, as indicated by Yes arrow 1664 leading to the done step 1634 (FIG. 16C)

In some embodiments, a single Data Type Conversion block inserted into the IR constructed for a model may be used for converting a combination of word length, fraction length, and signedness.

Fraction Length Example

Figure 17:
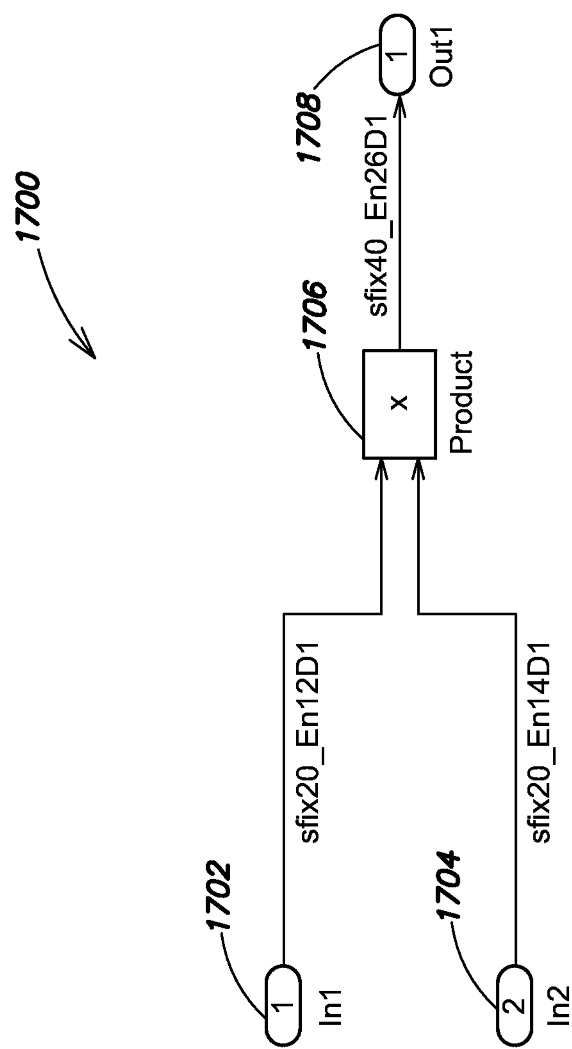
FIG. 17 is a schematic illustration of a portion of a source model.
Figure 18:
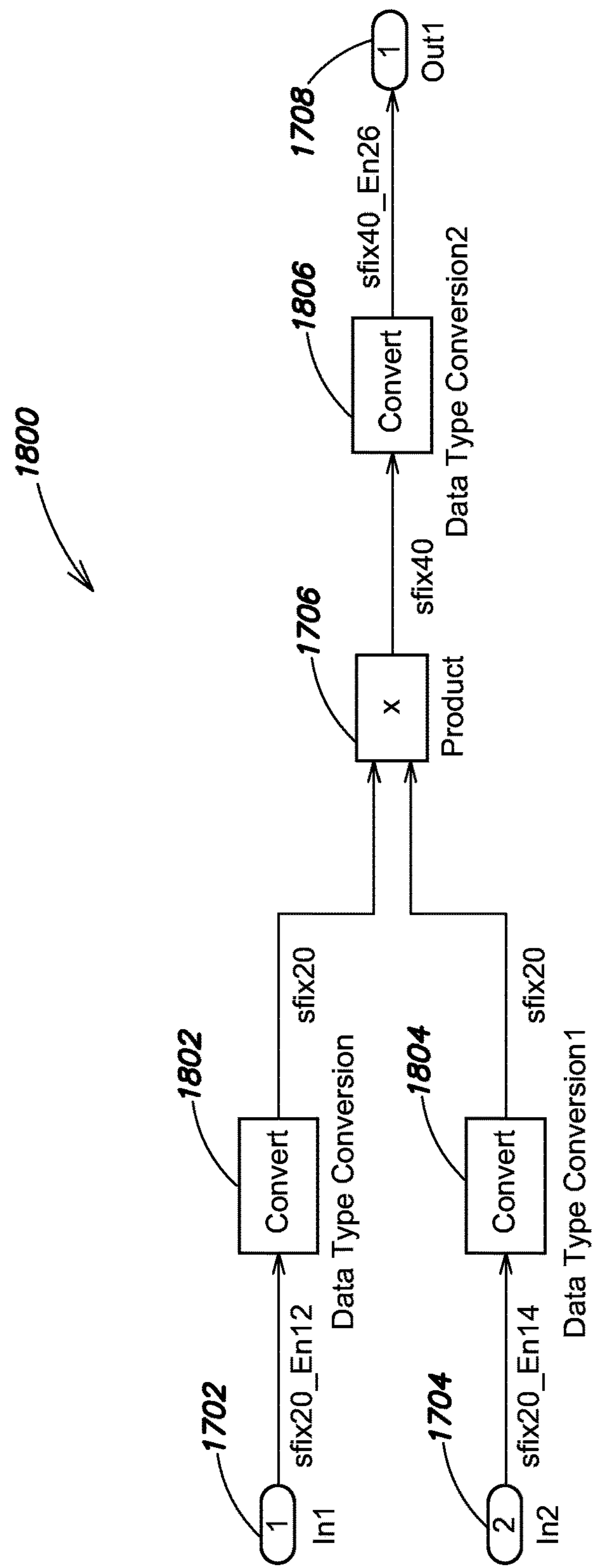
FIG. 18 is a schematic illustration of a portion of a validation model.

FIGS. 17 and 18 show an example of sharing resources whose inputs have different fraction lengths. The example implements the methodologies illustrated in FIG. 16A. For purposes of explanation, the example includes source and modified models. Nonetheless, it should be understood that the resource sharing optimizer 224 may modify an IR constructed for a source model. It should also be understood that the models, numerical values, and block types shown in FIGS. 17 and 18 are for illustration purposes, and that the disclosure may be used with other models, numerical values, and block types.

FIG. 17 is a schematic illustration of a portion 1700 of a source model having a resource, e.g., a multiplier, to be shared where the two inputs to the multiplier have different fraction lengths. This example illustrates a single multiplier whose inputs have different fraction lengths, and the single multiplier is to be shared with other multipliers (not shown) of the model. Nonetheless, it should be understood that a similar procedure may be used with two (or more) multipliers to be shared where the fraction lengths of the inputs of the multipliers are different. The model portion 1700 may include a first Inport element 1702, a second Inport element 1704, a multiplier element 1706, and an Outport element 1708. In the example shown in the figure, the multiplier 1706 receives a first input from the first Inport element 1702. In this example, the first input has a signed fixed point data type with a word length of 20 and a fraction length of 12. The multiplier element 1706 also receives a second input signal from the second Inport element 1704 that is a signed fixed point data type with the same word length as the first input, which is 20 in this example, and a fraction length of 14. The multiplier element 1706 generates an output signal that is a signed fixed point data type with a word length of 40 and a fraction length of 26.

The inputs to and output of the multiplier element 1706 may be time-varying signals or other data values, such as data in a data flow modeling environment. Suitable Inport, Outport, and multiplier elements include the Inport, Outport, and multiplier blocks of the Simulink modeling environment. Other suitable elements include terminals and multipliers of the LabVIEW block diagramming system.

Suppose the resource sharing optimizer 224 determines that the multiplier element 1706 may be shared with other multipliers, and that the inputs to the multipliers to be shared have different fraction lengths. The resource sharing optimizer 224 may modify one or more of the IRs representing the model so that the inputs to the multipliers to be shared have zero fraction lengths. With reference to FIG. 17, the resource sharing optimizer 224 may add one or more conversion elements that convert the inputs to the multiplier element 1706 to fixed point data types having no fraction lengths, and one or more conversion elements that convert the output of the multiplier element 1706 back to a fixed point data type with a word length of 40 and a fraction length of 26.

FIG. 18 is a schematic illustration of a portion 1800 of a validation model representing the changes made by the resource sharing optimizer 224 to the IR created for the model portion 1700 of FIG. 17. It should be understood that the validation model 1800 is provided for explanation purposes, and that the code generation system 200 may not create a validation model. Instead, the code generation system 200 may proceed with the code generation process using the IR as modified. The validation model portion 1800 includes the first and second Inport elements 1702 and 1704, the multiplier element 1706 that is to be shared, and the Outport element 1708. The resource sharing optimizer 224 added a first conversion element 1802 at the first input to the multiplier element 1706, a second conversion element 1804 at the second input to the multiplier element 1706, and a third conversion element 1806 at the output of the multiplier element 1706. The first and second conversion elements 1802 and 1804 convert the inputs from fixed point data types having fraction lengths of 12 and 14, respectively, to fixed point data types having no fraction lengths. The multiplier 1706 multiplies the fixed point data types without fraction lengths and produces an output that is a fixed point data type without a fraction length. The third conversion element 1806 converts the output signal of the multiplier 1706 from a fixed point data type with a word length of 40 and no fraction length to a fixed point data type with a word length of 40 and a fraction length of 26, which is then provided to the Outport element 1708 in conformance with the source model portion 1700 (FIG. 17).

The conversion of fixed point data types to data types having no fraction lengths may also be performed for other multipliers that are to be shared. With the model modified such that a plurality of multipliers have fixed point data types with no fraction lengths, the multipliers may then be shared. For example, a plurality of multipliers having no fraction lengths may be replaced by a singled shared resource, for example a single multiplier having no fraction lengths, by the resource sharing optimizer. As a result, hardware resources of a target hardware platform may be conserved.

Normalizing to Signed Example

Figure 19:
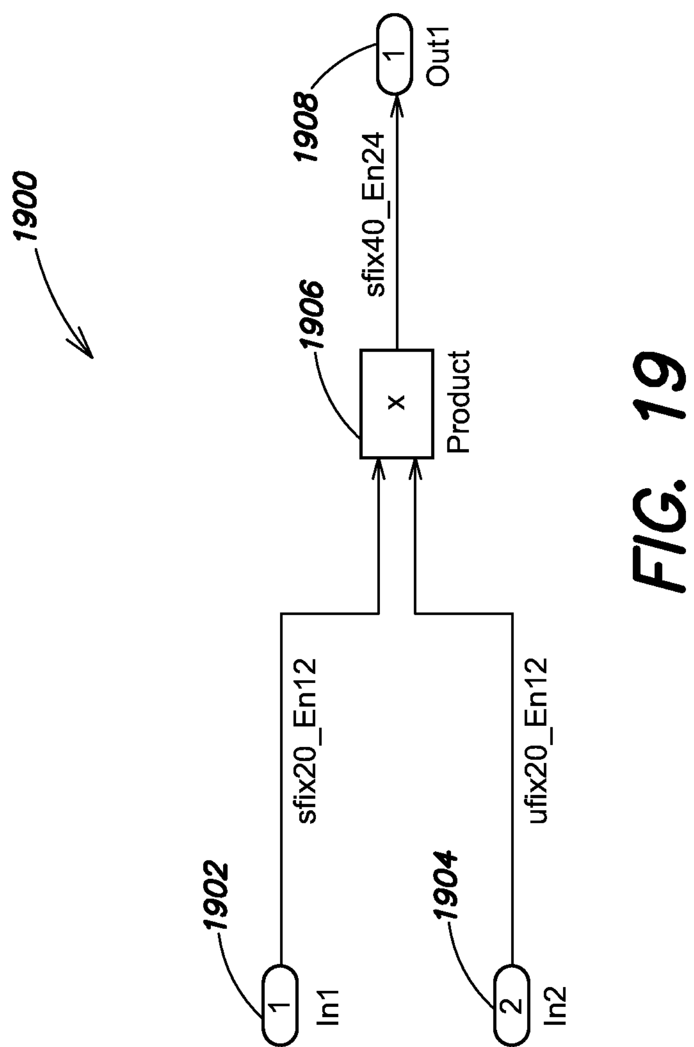
FIG. 19 is a schematic illustration of a portion of a source model.
Figure 20:
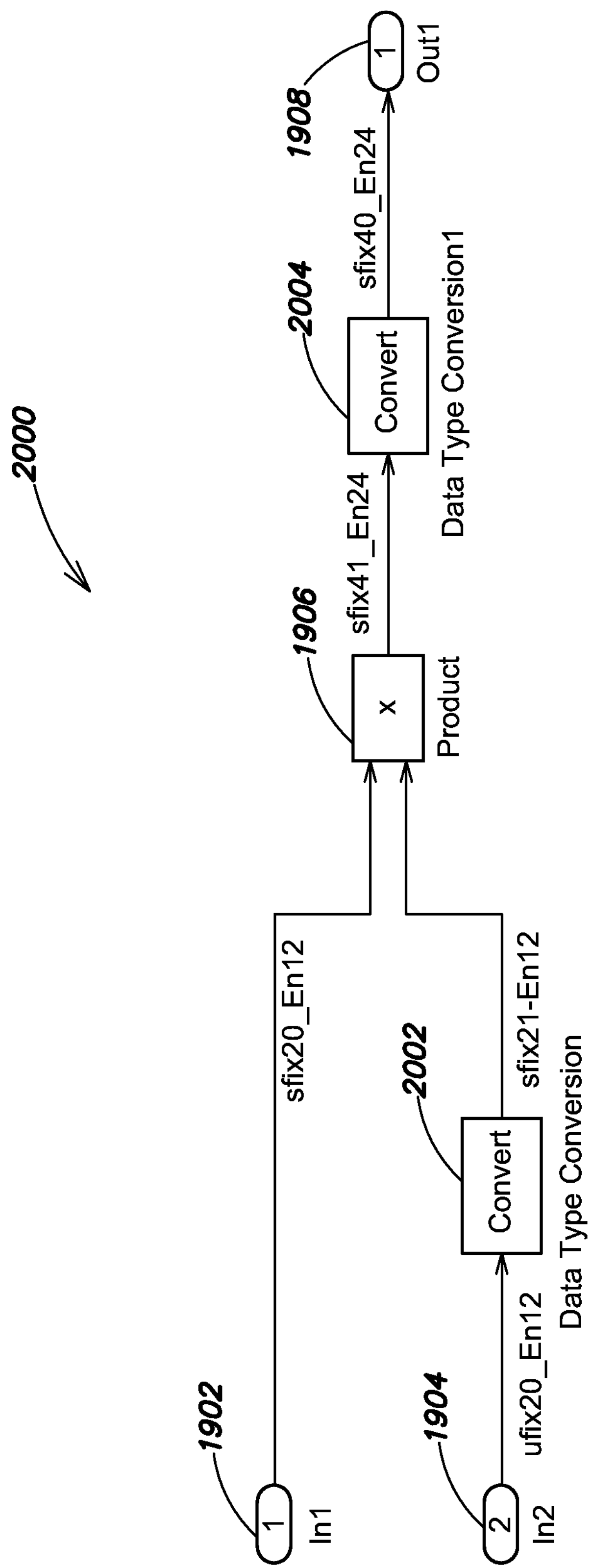
FIG. 20 is a schematic illustration of a portion of a validation model.

FIGS. 19 and 20 show an example of sharing resources whose inputs have different signedness. The example implements the normalized to sign methodology illustrated in FIG. 16B. For purposes of explanation, the example includes source and modified models. Nonetheless, it should be understood that the resource sharing optimizer 224 may modify an IR constructed for a source model. It should also be understood that the models, numerical values, and block types shown in FIGS. 19 and 20 are for illustration purposes, and that the disclosure may be used with other models, numerical values, and block types.

FIG. 19 is a schematic illustration of a portion 1900 of a source model having a resource to be shared where the inputs to the resource have different signedness. This example illustrates a single multiplier whose inputs have different signedness, and the single multiplier is to be shared with other multipliers (not shown) of the model. Nonetheless, it should be understood that a similar procedure may be used with two (or more) multipliers to be shared where the signedness of the inputs of the multipliers are different. The model portion 1900 may include a first Inport element 1902, a second Inport element 1904, a multiplier element 1906, which is the resource to be shared, and an Outport element 1908. In the examples shown in the figure, the multiplier element 1906 receives a first input from the first Inport element 1902. In this example, the first input is a signed fixed point data type with a word length of 20 and a fraction length of 12. The multiplier element 1906 also receives a second input from the second Inport element 1904. The second input is an unsigned fixed point data type with a word length of 20 and a fraction length of 12. The multiplier element 1906 generates an output signal that in the example is a signed fixed point data type with a word length of 40 and a fraction length of 24.

Suppose the resource sharing optimizer 224 determines that the multiplier element 1906 may be shared with other multipliers (not shown) of the model, and that the inputs to the multipliers to be shared have signed and unsigned fixed point data types. The resource sharing optimizer 224 may modify IR created for the model portion 1900 so that the inputs to the multipliers to be shared are signed. The resource sharing optimizer 224 may add one or more conversion elements to the IR, and may configure the conversion elements to convert one or more inputs so that the multiplier 1906 receives only signed inputs or unsigned inputs. If the model portion 1900 is normalized to unsigned data types, the resource sharing optimizer 224 may also add one or more conversion elements that convert the demuxed output of the shared multiplier back to a signed fixed point data type for this model portion 1900.

FIG. 20 is a schematic illustration of a portion 2000 of a validation model representing the changes made by the resource sharing optimizer 224 to the IR created for the model portion 1900 of FIG. 19. It should be understood that the validation model 1900 is provided for explanation purposes, and that the code generation system 200 may not create a validation model. Instead, the code generation system 200 may proceed with the code generation process using the IR as modified. The validation model portion 2000 includes the first and second Inport elements 1902 and 1904, the multiplier element 1906 that is to be shared, and the Outport element 1908. As shown in this example, the resource sharing optimizer 224 added a first conversion element 2002 at the second input to the multiplier element 1706, and a second conversion element 2004 at the output of the multiplier element 1706. The first conversion element 2002 converts the second input from an unsigned fixed point data type having a word length of 20 to a signed fixed point data type having a word length of 21 and a fraction length of 12. That is, the first conversion element 2001 adds a sign bit to the fixed point data type, thereby increasing the word length by one bit. The multiplier element 1906 multiplies the signed fixed point data types and produces an output that is a signed fixed point data type having a word length of 41 and a fraction length of 24. The second conversion element 2004 converts the output of the multiplier 1906 from a signed fixed point data type with a word length of 41 and a fraction length of 24 to a signed fixed point data type with a word length of 40 and a fraction length of 24, which may then be provided to the Outport element 1908 as in the source model portion 1900 (FIG. 19). That is, the second conversion element 2004 removes one bit from the fixed point data type. Because the word length had been expanded by one bit by the first conversion element 2002, the multiplication operation is full-precision, and no saturation will occur, thus allowing the extra bit to be eliminated.

The multipliers now having signed data types may then be shared. For example, a plurality of multipliers having signed data types may be replaced by a singled shared resource, e.g., a single shared multiplier, by the resource sharing optimizer 224. Code generated by the code generation system 200 using the IR as modified to include a single shared multiplier may include code for a single multiplier, rather than code for all of the multipliers included in the source model. As a result, when the automatically generated code is deployed, hardware resources of a target hardware platform may be conserved.

Normalizing to Unsigned Example

Figure 21:
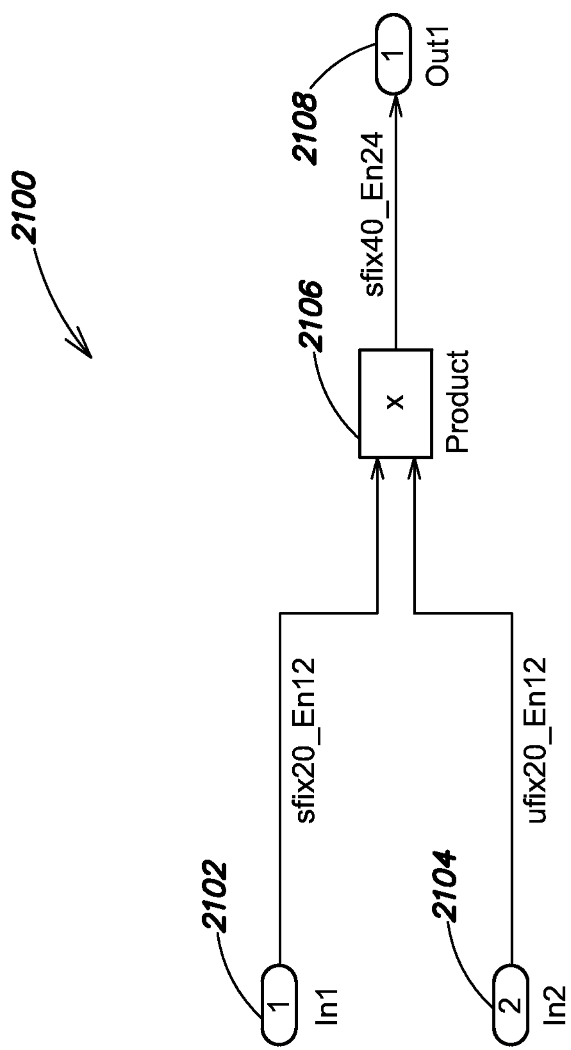
FIG. 21 is a schematic illustration of a portion of a source model.
Figure 22:
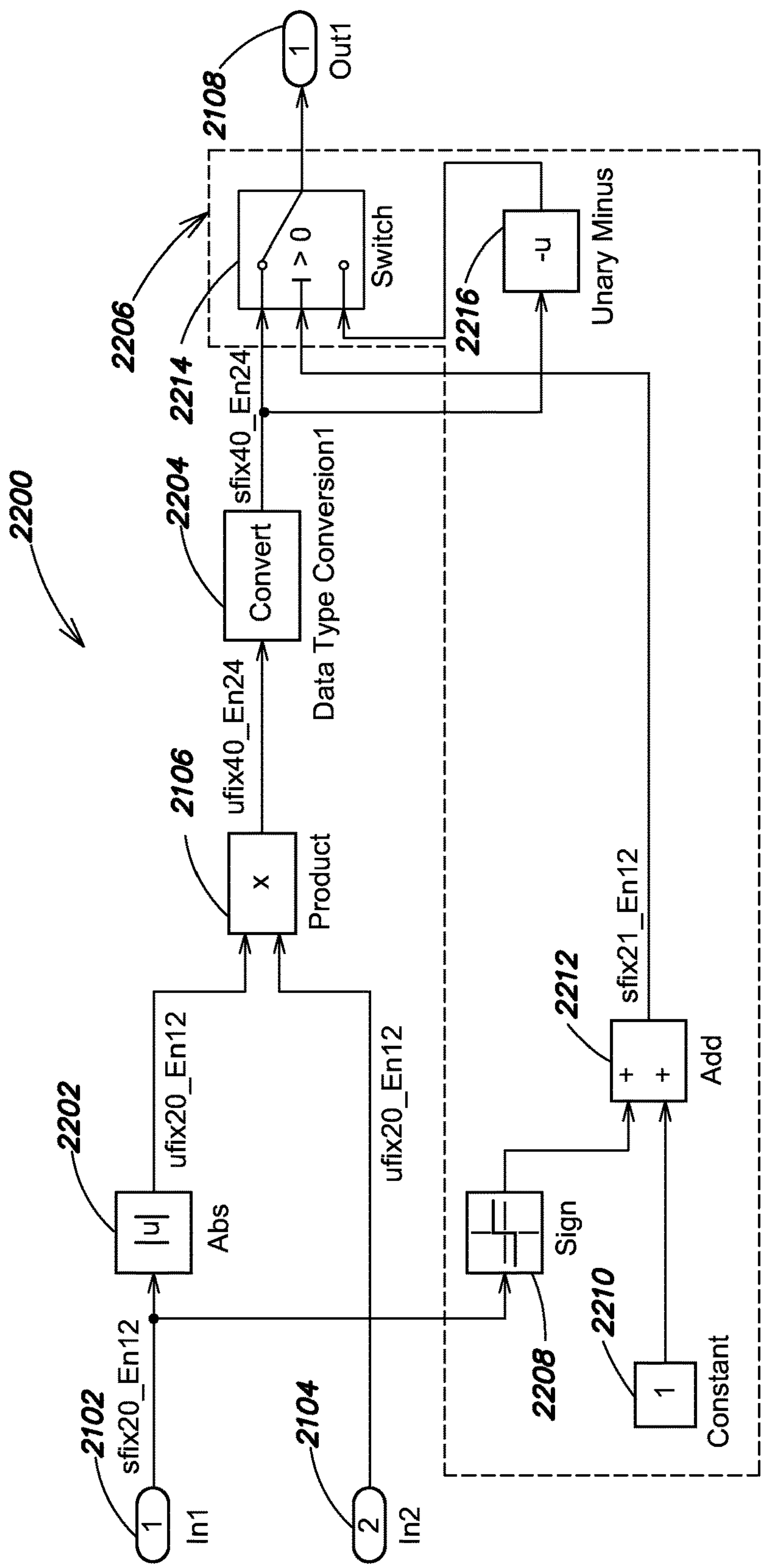
FIG. 22 is a schematic illustration of a portion of a validation model.

FIGS. 21 and 22 show another example of sharing resources whose inputs have different signedness. The example implements the normalized to unsigned methodology illustrated in FIG. 16B. For purposes of explanation, the example includes source and modified models. Nonetheless, it should be understood that the resource sharing optimizer 224 may modify an IR constructed for a source model. It should also be understood that the models, numerical values, and block types shown in FIGS. 21 and 22 are for illustration purposes, and that the disclosure may be used with other models, numerical values, and block types.

FIG. 21 is a schematic illustration of a portion 2100 of a source model having a resource, e.g., a multiplier, to be shared where the two inputs to the multiplier have different signedness. This example, illustrates a single multiplier whose inputs have different signedness, and the single multiplier is to be shared with other multipliers (not shown) of the model. Nonetheless, it should be understood that a similar procedure may be used with two (or more) multipliers to be shared where the signedness of the inputs of the multipliers are different. The model portion 2100 may include a first Inport element 2102, a second Inport element 2104, a multiplier element 2106, and an Outport element 2108. In the example, the multiplier element 2106 receives a first input from the first Inport element 2102 that is a signed fixed point data type with a word length of 20 and a fraction length of 12. The multiplier element 2106 also receives a second input from the second Inport element 2104 that is an unsigned fixed point data type with a word length of 20 and a fraction length of 12. The multiplier element 2106 generates an output that is a signed fixed point data type with a word length of 40 and a fraction length of 24.

Suppose the resource sharing optimizer 224 determines that the multiplier element 2106 may be shared with other multipliers, and that the inputs to the multipliers to be shared have signed and unsigned fixed point data types. If the model portion 2100 is being normalized to unsigned data, the resource sharing optimizer 224 may modify the IR for the model portion 2100 so that the inputs of the multipliers to be shared are unsigned. The resource sharing optimizer 224 may convert signed inputs to unsigned inputs, and convert demuxed unsigned outputs of the shared resource back to signed outputs. Additionally, the resource sharing optimizer 224 may add sign determination and setting logic that monitors the sign of the shared resource's signed inputs, and sets the sign of the shared resource's demuxed output, based on the sign of the signed inputs.

FIG. 22 is a schematic illustration of a portion 2200 of a validation model representing the changes made by the resource sharing optimizer 224 to the model portion 2100 of FIG. 21. The validation model portion 2000 may include the first and second Inport elements 2102 and 2104, the multiplier element 2106 that is to be shared, and the Outport element 2108.

The resource sharing optimizer 224 may add a first absolute element 2202 at the first input to the multiplier element 2106 to convert the signed input to an unsigned input. The resource sharing optimizer 224 may also add a conversion element 2204 at the output of the multiplier element 2106 that converts the output of the multiplier 2106 from an unsigned fixed point data type with a word length of 40 and a fraction length of 24 to a signed fixed point data type with a word length of 40 and a fraction length of 24.

The resource sharing optimizer 224 may also add sign determination and setting logic, as indicated generally at 2206, to the IR as illustrated in the validation model portion 2200. The sign determination and setting logic 2206 may determine when the signed input of the multiplier element 2106 is negative, and may set the sign of the multiplier's output to negative.

The sign determination and setting logic 2206 may include a sign element 2208 that receives the signed input of the Inport element 2102 and outputs '1' if the input is positive, '0' if the input signal is zero, and '−1' if the input is negative. The logic 2206 further includes a Constant element 2210 that may output the value 1, and an add element 2212 whose output may be '0', '1', or '2' depending on the value output by the sign element 2208. The logic 2206 may further include a switch element 2214 and a unary minus element 2216. The output of the add element 2212 may provide the control input to the switch element 2214. In addition, the switch element 2214 may receive the output of the conversion element 2204 as a first data input. The unary minus element 2216 may receive the output of the conversion element 2204 and may negate the output value of the conversion element 2204. The switch element 2214 receives this negative value from the unary minus element 2216 at the second data input to the switch element 2214. Depending on the value of the control to the switch element 2214, the switch element 2214 either outputs the output of the conversion element 2204 or the negative of the output of the conversion element 2204. It should be understood that the sign determination and setting logic is for explanation purposes, and other logic, for example including other elements, may be used.

Word Length Promotion Example

Figure 23:
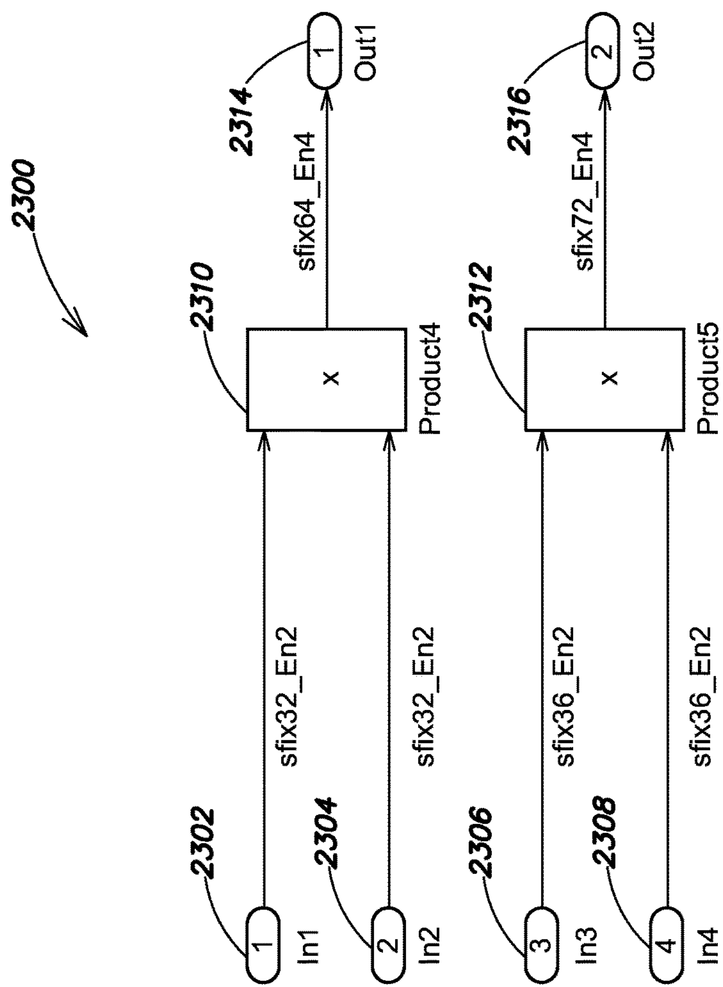
FIG. 23 is a schematic illustration of a portion of a source model.
Figure 24A:
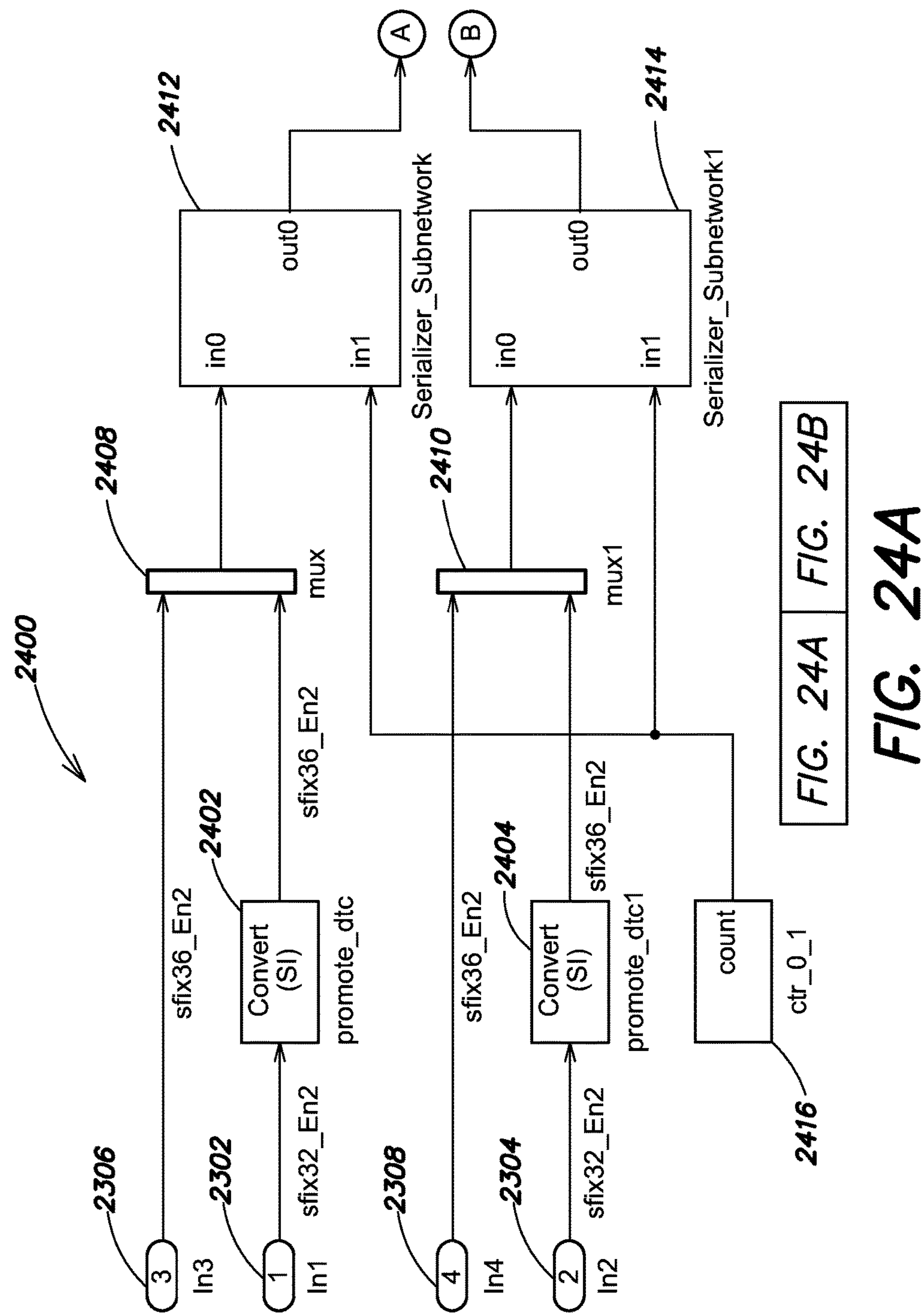
FIGS. 24A and 24B are partial views of a schematic illustration of a portion of a validation model.
Figure 24B:
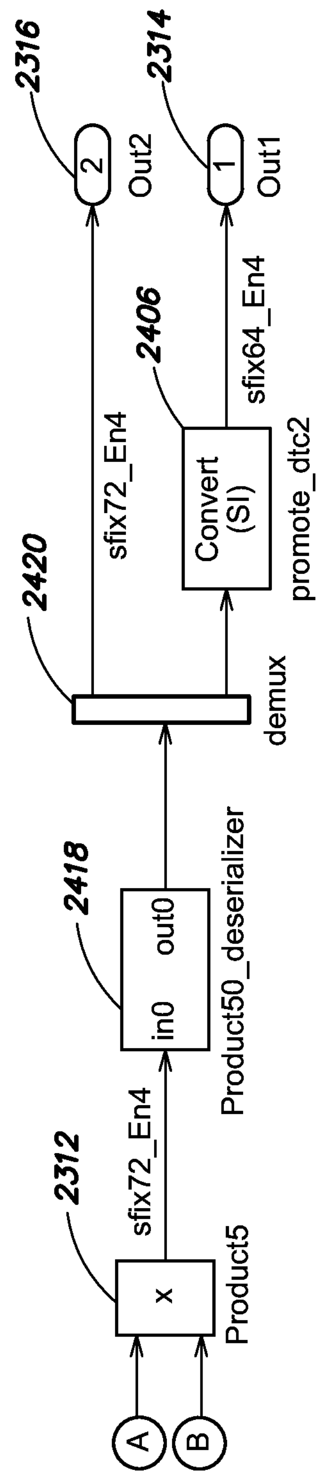

FIGS. 23 and 24A-B show an example of using promotion to share resources whose inputs have different word lengths. The example implements the methodologies illustrated in FIG. 16A. For purposes of explanation, the example includes source and modified models. Nonetheless, it should be understood that the resource sharing optimizer 224 may modify an IR of a source model. It should also be understood that the models, numerical values, and block types shown in FIGS. 23 and 24A-B are for illustrative purposes, and that the disclosure may be used with other models, numerical values, and block types.

FIG. 23 is a schematic illustration of a portion 2300 of a source model having resources, e.g., multipliers, to be shared where the inputs to the multipliers have different word lengths. The model portion 2300 includes a first Inport element 2302, a second Inport element 2304, a third Inport element 2306, a fourth Inport element 2308, a first multiplier element 2310, a second multiplier element 2312, a first Outport element 2314, and a second Outport element 2316. In the example shown in the figure, the first multiplier element 2310 receives inputs from the first and second Inport elements 2302 and 2304 that are both signed fixed point data types having a word length of 32 and a fraction length of 2. The first multiplier element 2310 generates an output that is a signed fixed point data type with a word length of 64 and a fraction length of 4. The output is received at the first Outport element 2314. The second multiplier element 2312 receives inputs from the third and fourth Inport elements 2306 and 2308 that are both signed fixed point data types with a word length of 36 and a fraction length of 2. The second multiplier element 2312 generates an output that is a signed fixed point data type having a word length of 72 and a fraction length of 4 that is provided to the second Outport element 2316.

FIGS. 24A and 24B are partial views of a schematic illustration of a portion 2400 of a validation model representing the changes made by the resource sharing optimizer 224 to the IR created for the model portion 2300 of FIG. 23 having a single shared resource, e.g., the second multiplier element 2312. It should be understood that the validation model portion 2400 is for explanation purposes, and that the code generation system 200 may not create a validation model. Instead, the code generation system 200 may proceed with the code generation process using the IR as modified. The resource sharing optimizer 224 may add a first conversion element 2402 at the first input, and a second conversion element 2404 at the second input 2304. The first and second conversion elements 2402 and 2404 convert the signed fixed point data types having a word length of 32 and a fraction length of two to signed data types having a word length of 36 and a fraction length of two, thereby matching the word lengths of the third and fourth input signals. The shared multiplier element 2312 produces an output s that is a signed fixed point data type having a word length of 72 and a fraction length of four. The resource sharing optimizer 224 also adds a third conversion element 2406 at the output of the shared multiplier element 2312. The third conversion element 2406 converts a portion of the output of the shared multiplier element 2312 from a signed fixed point data type having a word length of 72 and a fraction length of four to a word length of 64 and a fraction length of four.

The resource sharing optimizer 224 may also add first and second Multiplexer (Mux) elements 2408 and 2410, first and second serializer elements 2412 and 2414, and a Hardware Counter element 2416 that feed input data from the four Inport elements 2302, 2304, 2306, and 2308 to the single shared multiplier element 2312 of the validation model portion 2400. The resource sharing optimizer 224 may also add a deserializer element 2418 and a Demultiplexer (Demux) element 2420 that take the output of the single shared multiplier element 2312, split the output into two signals, and provide the two output signals to the first and second Outport elements 2314 and 2316.

In some implementations, a source model may include data whose data type is floating-point. For example, a source model may include signals, coefficients, model element parameters, etc. having a floating-point data type. These floating-point data types of the source model may be converted to fixed-point data types. For example, a fixed-point tool of a modeling environment may convert floating point data types of a source model to fixed point data types. The resource sharing optimizer 224 may then normalize these fixed-point data types in order to share resources whose inputs have different fixed point data types.

Because area usage and power consumption may increase as word length increases, the fixed-point tool may seek to minimize the word length when converting from floating point to fixed point data types. The fixed-point tool may use range analysis and a user-specified word length, and may consider precision and quantization errors, when choosing a word length during floating point to fixed point conversion.

In some embodiments, the resource sharing optimizer 224 may direct the fixed-point tool to choose a particular word length when converting from floating point to fixed point. For example, the resource sharing optimizer 224 may determine that a resource whose inputs have a first word length should be promoted to a resource whose inputs have a second, larger, word length so that the resource may be shared. In this case, the resource sharing optimizer 224 may provide an indication of a preferred word length, a preferred word length range, or a preferred minimum word length, to the fixed-point tool for use during the conversion from floating point to fixed point data types. The fixed-point tool may utilize the received indication during the conversion process and, as a result, may choose a word length that is closer to, or may be, the second, larger, word length, possibly improving precision and/or reducing quantization errors.

Word Length Partition Example

FIGS. 25, 26A-B, and 27A-B show an example of using partitioning or splitting to share resources whose inputs have different word lengths. The example implements the methodologies illustrated in FIG. 16A. For purposes of explanation, the example includes source and modified models. Nonetheless, it should be understood that the resource sharing optimizer 224 may modify an IR of a source model. It should also be understood that the models, numerical values, and block types shown in FIGS. 25, 26A-B, and 27A-B are for illustrative purposes, and that the disclosure may be used with other models, numerical values, and block types.

Figure 25:
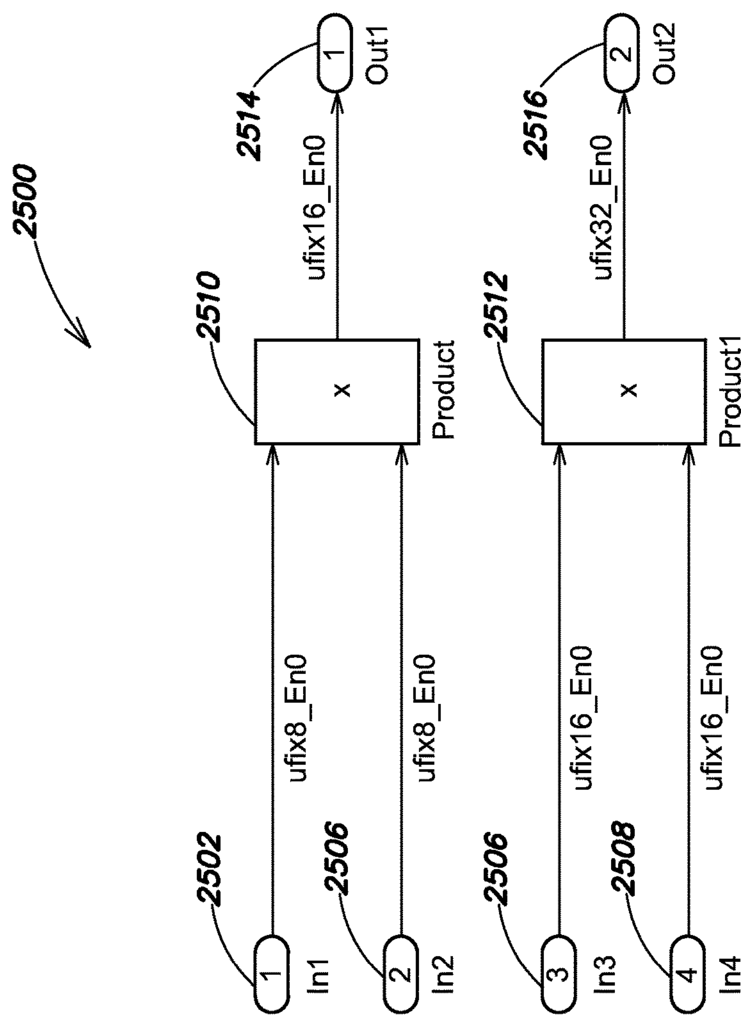
FIG. 25 is a schematic illustration of a portion of a source model.

FIG. 25 is a schematic illustration of a portion 2500 of a source model that includes resources, e.g., multipliers, to be shared where the inputs to the resources have different word lengths. The model portion 2500 includes a first Inport element 2502, a second Inport element 2504, a third Inport element 2506, a fourth Inport element 2508, a first multiplier element 2510, a second multiplier element 2512, a first Outport element 2514, and a second Outport element 2516. In the example shown in the figure, the first multiplier element 2510 receives inputs from the first and second Inport elements 2502 and 2504 that are both unsigned fixed point data types having a word length of 8 and a fraction length of 0. The first multiplier element 2510 generates an output that is an unsigned fixed point data type with a word length of 16 and a fraction length of 0. The output is received at the first Outport element 2514. The second multiplier element 2512 receives inputs from the third and fourth Inport elements 2506 and 2508 that are both unsigned fixed point data types with a word length of 16 and a fraction length of 0. The second multiplier element 2512 generates an output that is an unsigned fixed point data type having a word length of 32 and a fraction length of 0 that is provided to the second Outport element 2516.

The resource sharing optimizer 224 may determine that the second multiplier element 2512 whose inputs have a word length of 16 and a fraction length of 0 may be partitioned or split into a plurality of multipliers whose inputs have a word length of 8 and a fraction length of 0. For example, the resource sharing optimizer 224 may partition the second multiplier 2512 into four multipliers whose inputs have a word length of 8 and a fraction length of 0.

Figure 26A:
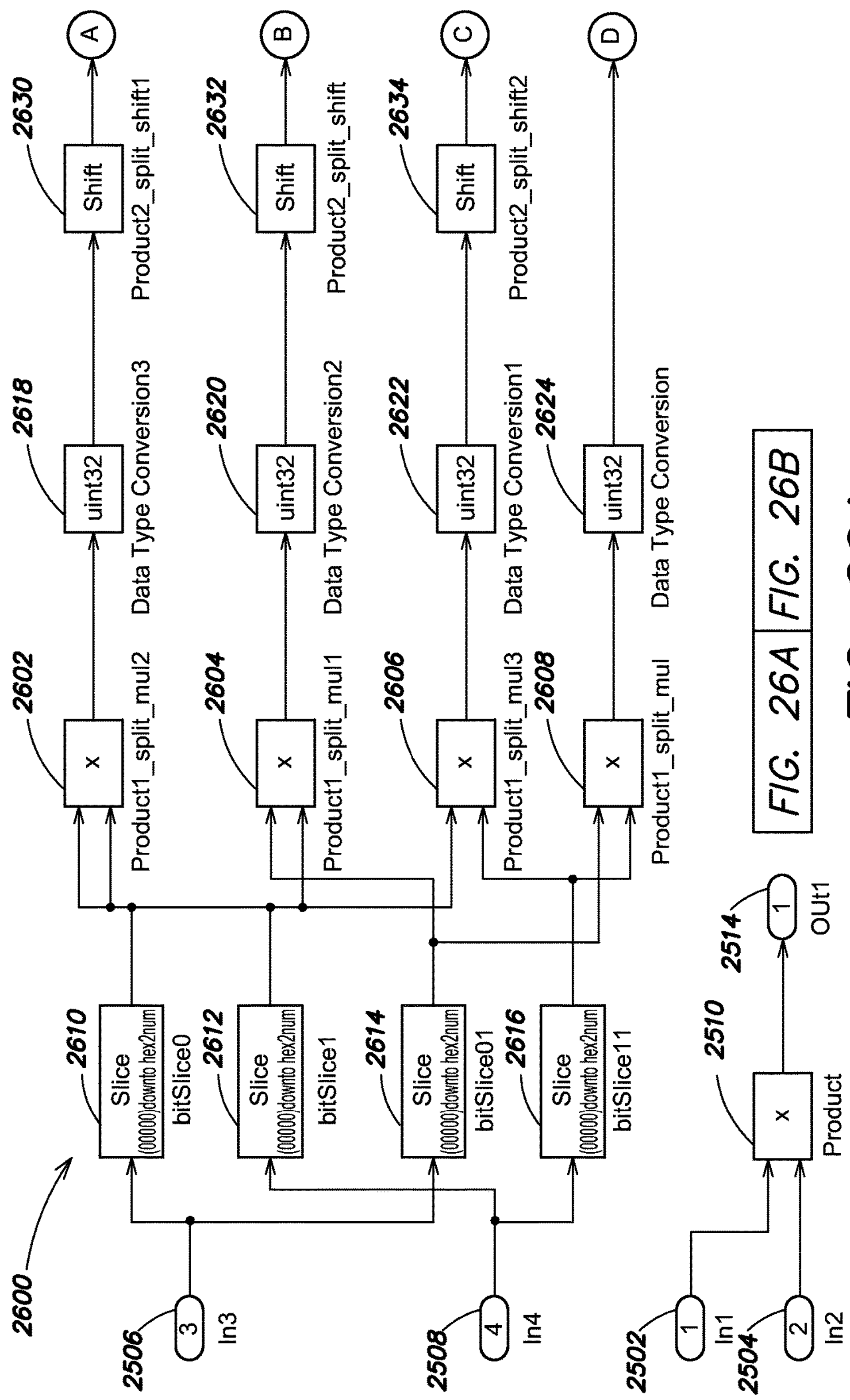
FIGS. 26A and 26B are partial views of a schematic illustration of a portion of a validation model.
Figure 26B:
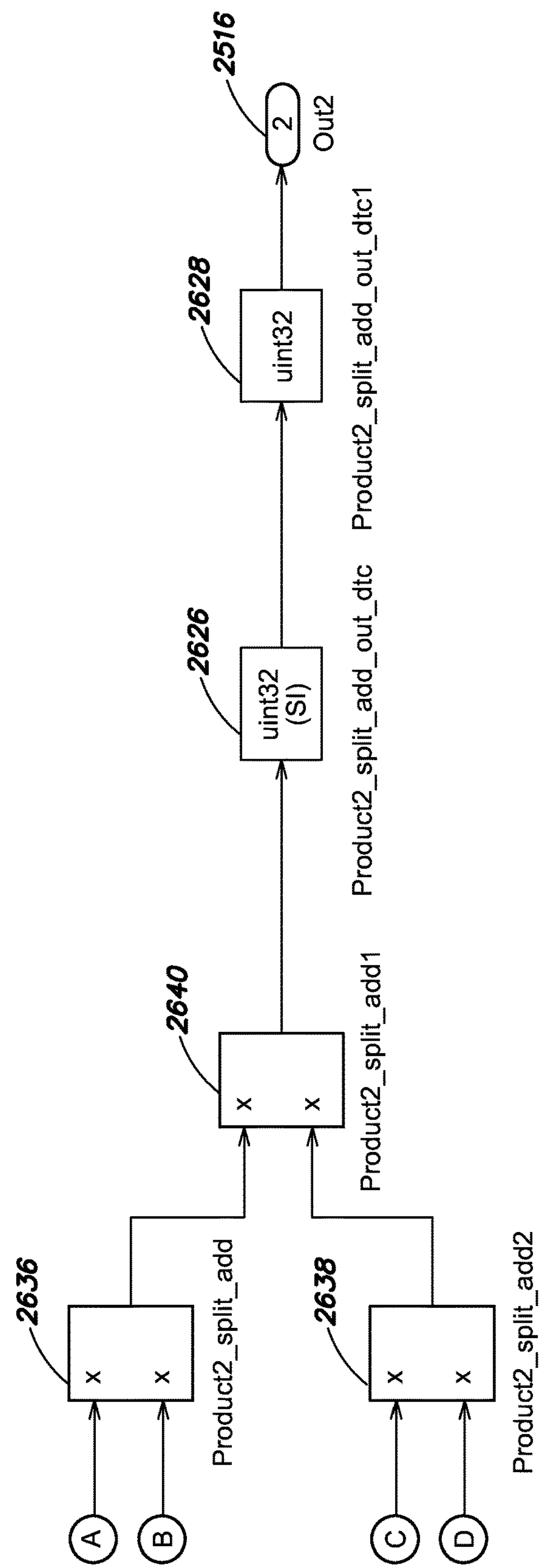

FIGS. 26A and 26B are partial views of a schematic illustration of a portion of a first validation model 2600 representing a first set of changes made by the resource sharing optimizer 224 to the IR created for the model portion 2500 of FIG. 25. It should be understood that the first validation model portion 2600 is for explanation purposes, and that the code generation system 200 may not create a validation model. Instead, the code generation system 200 may proceed with the code generation process using the IR as modified. The first validation model 2600 may include the first multiplier 2510 whose inputs have a word length of 8 and a fraction length of 0. The resource sharing optimizer 224 has replaced the second multiplier 2512 (FIG. 25) with four multipliers 2602, 2604, 2606, and 2608 whose inputs have a word length of 8 and a fraction length of 0. The first validation model 2600 also may include a plurality of bit slice elements 2610, 2612, 2614, and 2616 that take consecutive bits from the inputs at the third and fourth Inport elements 2506 and 2508, and provide these consecutive bits to the four multipliers 2602, 2604, 2606, and 2608. The first validation model 2600 may further include a plurality of conversion elements 2618, 2620, 2622, 2624, 2626, and 2628, a plurality of arithmetic shift elements 2630, 2632, and 2634, and a plurality of adder elements 2636, 2638, and 2640.

The resource sharing optimizer 224 may replace the five multipliers 2510, 2602, 2604, 2606, 2608 illustrated in the first validation model portion 2600 (FIGS. 26A and 26B) with a single shared multiplier.

Figure 27A:
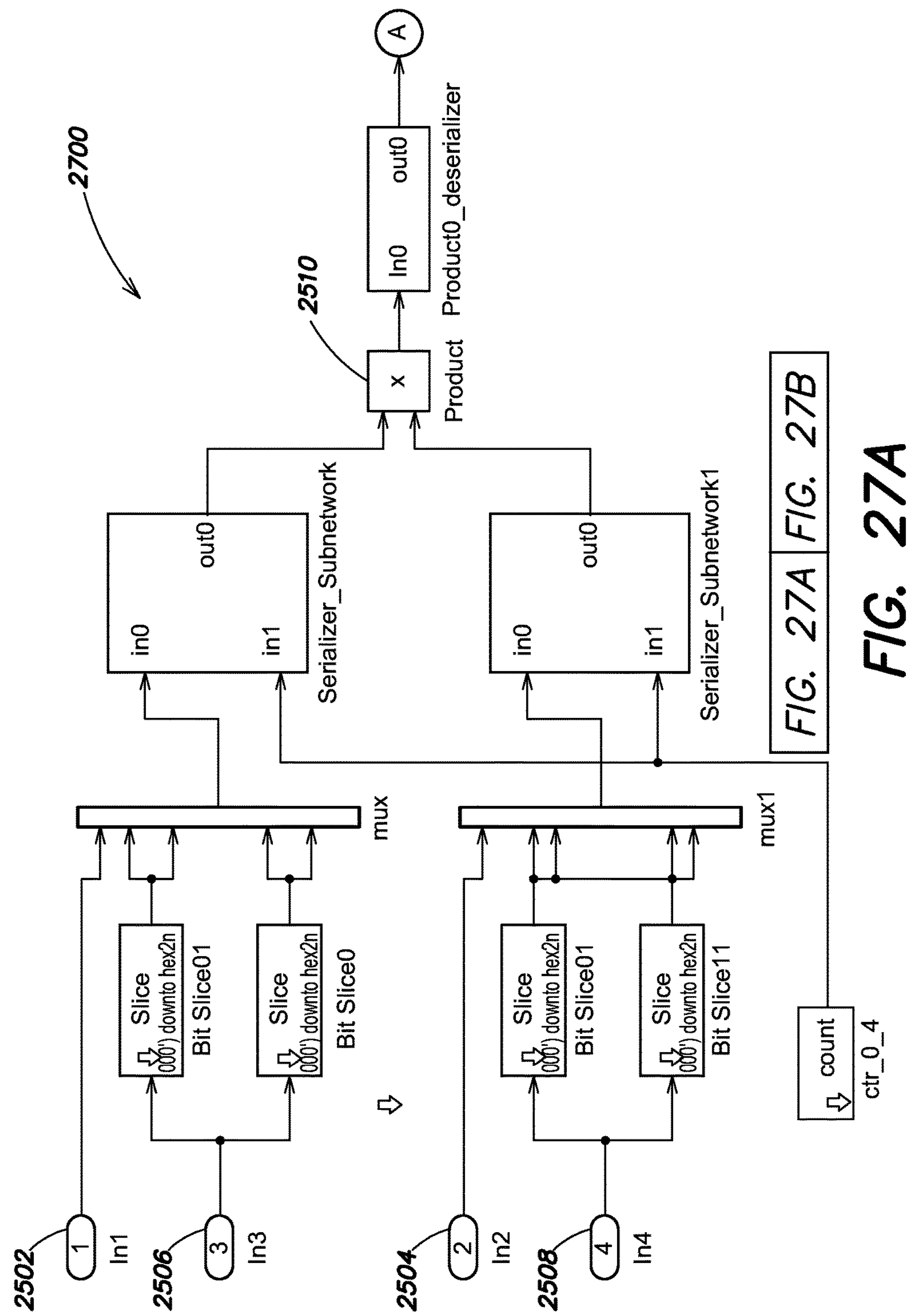
FIGS. 27A and 27B are partial views of a schematic illustration of a portion of a validation model.
Figure 27B:
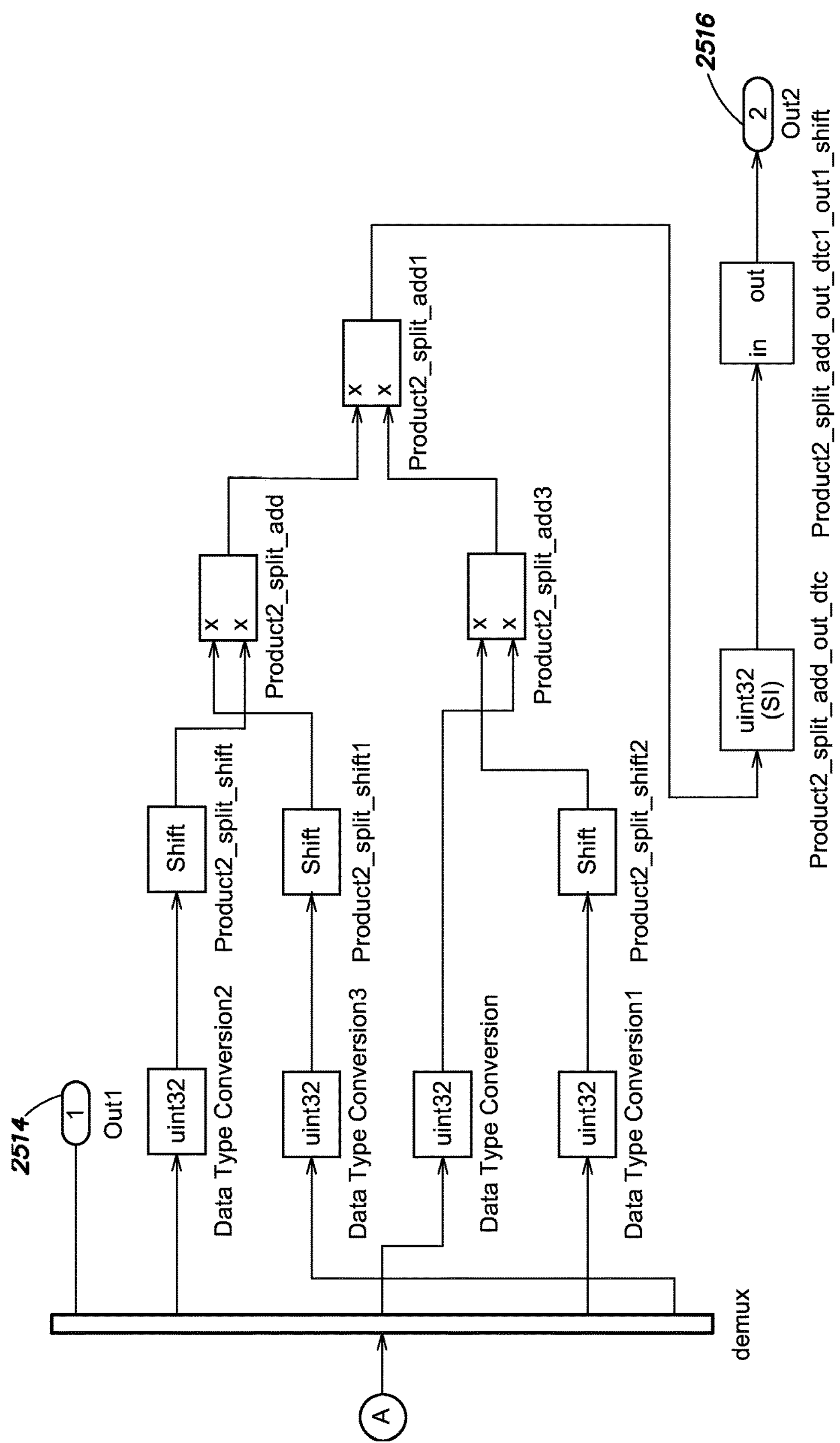

FIGS. 27A and 27B are partial views of a schematic illustration of a portion of a second validation model 2700 representing changes made by the resource sharing optimizer 224 to the first validation model 2600. It should be understood that the second validation model portion 2700 is for explanation purposes, and that the code generation system 200 may not create a validation model. Instead, the code generation system 200 may proceed with the code generation process using the IR as modified. The second validation model portion 2700 includes a single shared multiplier, namely the second multiplier 2510 from the source model portion 2500 (FIG. 25) whose inputs have a word length of 8 and a fraction length of 0.

Heuristics

Target hardware, such as Field Programmable Gate Arrays (FPGA) devices, are typically made up of a finite number of predefined resources. The resources may include configurable logic blocks (CLBs), Digital Signal Processing (DSP) slices or blocks, memory blocks, such as Random Access Memory (RAM) blocks, and input/output (I/O) blocks, among others. The DSP slices often include predefined function blocks, such as multipliers, adders, and accumulators as well as input and output registers and pipeline registers. The CLBs, DSP slices, and RAM blocks may be arranged at least conceptually in columns or rows on the FPGA devices.

In an embodiment, the code generation system 200 may include or have access to one or more target hardware databases. The one or more target hardware databases may contain performance data obtained for different target hardware platforms, such as various FPGA devices available from device vendors. The code generation system 200 may also include a heuristics engine that accesses information in the one or more target hardware databases for selecting a methodology to apply during code generation. The performance data may reflect the number of resources utilized of a particular target hardware device across a range of data types, such as a range of word lengths. The one or more target hardware databases may be in the form of one or more lookup tables.

Figure 28:
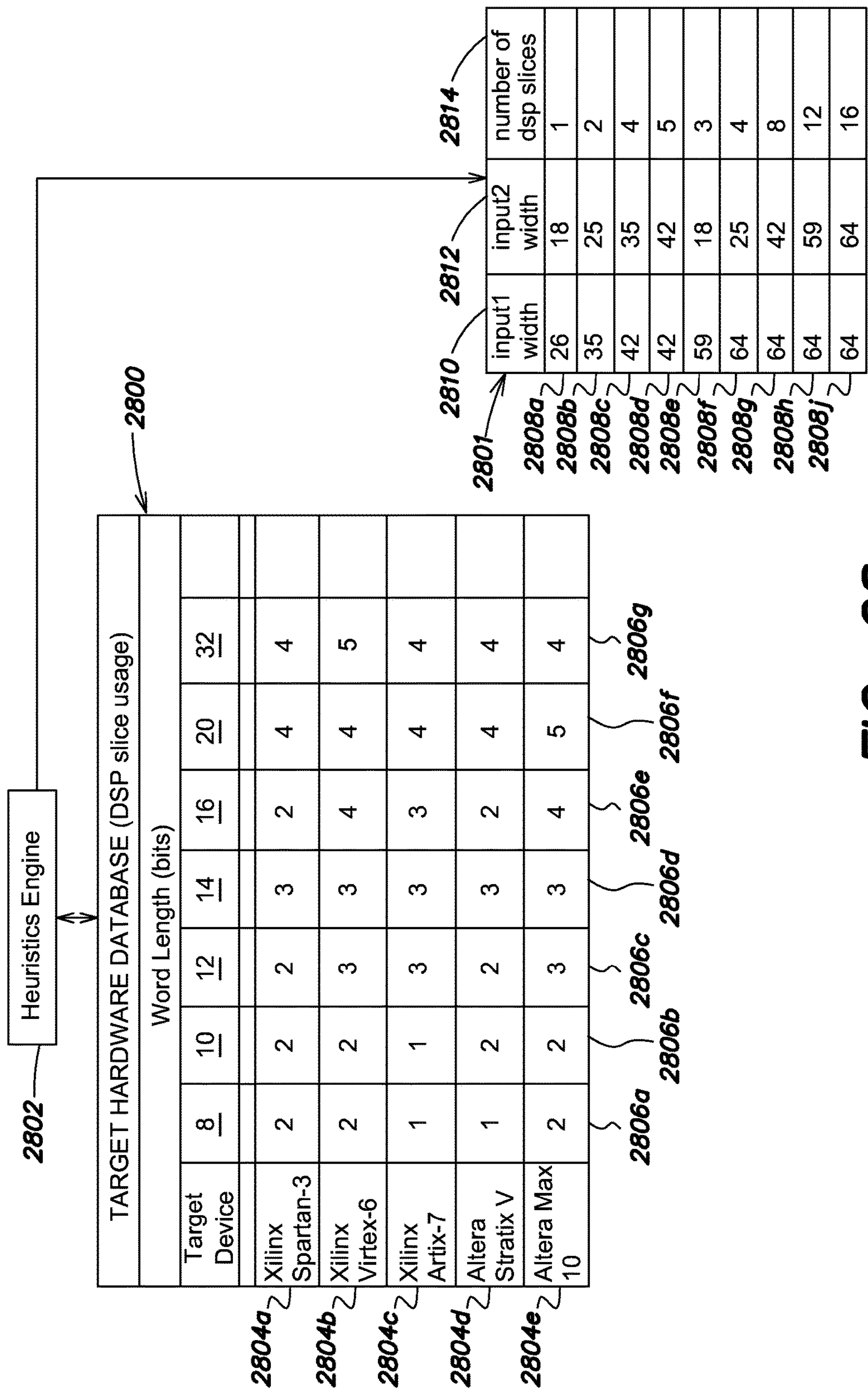
FIG. 28 is a schematic illustration of a target hardware database.

FIG. 28 is a schematic illustration of a first table 2800 and a second table 2801 included in the target hardware database, which may be accessed by a heuristics engine 2802. The table 2800 may include DSP slice usage information for a number of different programmable logic devices, e.g., FPGAs, as a function of the word length of the inputs the resource, e.g., multiplier, being shared for the normalize to signed methodology. The table 2800 may have a plurality of columns and rows whose intersections define cells for storing information. Each row, such as rows 2804*a-e*, may correspond to a particular programmable logic device, e.g., FPGA, or FPGA product family. The columns may correspond to different word lengths of the inputs to a resource, e.g., a multiplier, to be shared. For example, first through seventh columns 2806*a-g* may correspond to word lengths 8, 10, 12, 14, 16, 20, and 32, respectively. The cells may store the number of DSP slices used on the respective FPGA for the respective word lengths when using the normalize to signed methodology. The heuristics engine 2802 may review the information in the table 2800 as well as the information in a second table (not shown) storing DSP slice usage information for the normalize to unsigned methodology. The heuristics engine 2802 may choose the methodology that results in fewer DSP slices being used.

The second table 2801 may be used by the heuristics engine 2802 to determine whether to promote a resource whose inputs have a first word length to a resource whose inputs have a second word length that is larger, as indicated at step 1650 (FIG. 16A). The table 2801 may have a plurality of columns and rows whose intersections define cells for storing information. Each row, such as rows 2808*a-i*, may indicate a number of DSP slices required to implement a multiplier whose inputs have particular word lengths. For example, the second table 2801 may include a first column 2810 that indicates the word length of a first input to a multiplier, a second column 2812 that indicates the word length of a second input to the multiplier, and a third column 2814 that indicates the number of DSP slices required to implement a multiplier whose inputs have the specified word lengths or below.

The second table 2801 may correspond to a particular FPGA device and a particular clock frequency. In some embodiments, there may be a table in the form of the second table 2801 for each FPGA device/clock frequency of interest. When determining whether to promote a resource, the heuristics engine 2802 may access the appropriate table and determine whether the proposed promotion will result in an increase in DSP slice usage. For example, suppose a multiplier before promotion would require two DSP slices as indicated at row 2808*b*. Suppose further that after a proposed promotion, the multiplier would require five DSP slices as indicated at row 2808*d*. In such a case, the heuristics engine 2802 may cancel the proposed promotion.

Signedness Heuristics

Figure 29:
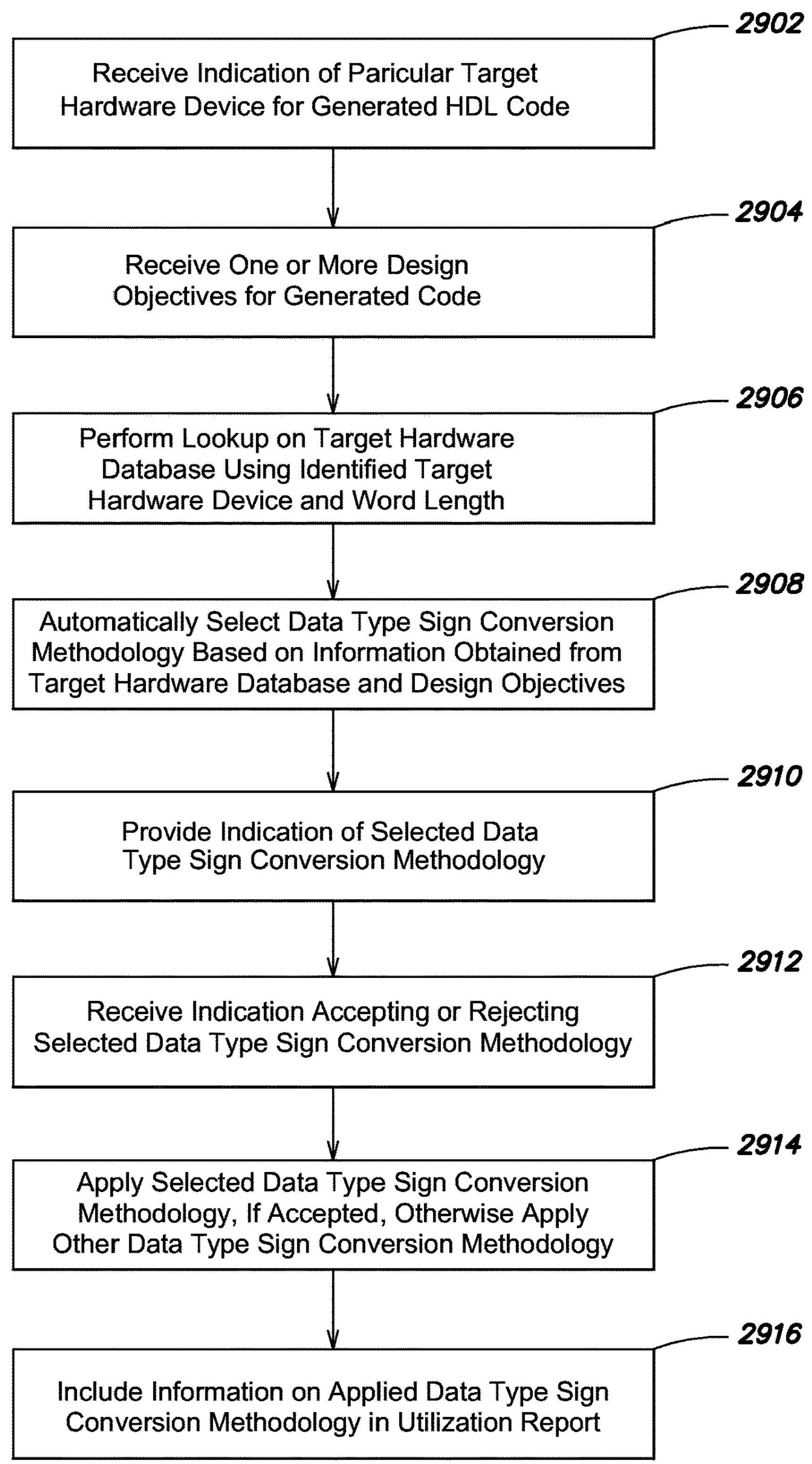
FIG. 29 is a flow diagram of a method in accordance with an embodiment of the disclosure.

FIG. 29 is a flow diagram of a method in accordance with an embodiment. During code generation, the code generation system 200 may receive an indication of a particular target hardware device, such as by vendor name and model name and/or number, for which generated HDL code will be utilized, as indicated at step 2902. The indication may be specified by a user, for example, through a code generation options setting page. The code generation system 200 also may receive one or more design objectives for the generated code, such as minimize area or maximize execution speed, as indicated at step 2904. When the resource sharing optimizer 224 identifies resources to be shared, where the inputs of the resources have signed and unsigned data types, the heuristics engine 2802 may perform a lookup on the one or more target hardware databases, which may include first and second tables 2800, 2801, among other data structures, utilizing the identity of the received target hardware device, and the word length of the inputs of the resources to be shared, as indicated at step 2906. Based on the lookup, the heuristics engine 2802 may determine whether to use the 'normalize to signed' or the 'normalize to unsigned' methodologies, as indicated at step 2908. The one or more target hardware databases may include information on the specified target hardware device. This information, moreover, may indicate that the 'normalize to signed' methodology results in fewer resources, e.g., CLBs and DSP slices, being needed, unless the word length falls within a particular range in which case the 'normalize to unsigned' methodology uses fewer resources. For example, the DSP slices included in the specified target hardware device may have 35-bit multipliers. When the word length of the resources to be shared is between 34 and 36 bits, applying the 'normalize to signed' methodology may cause an additional DSP slice of the target hardware device to be used. As a result, when the word length falls between 34 and 36 bits, and the design objective is to minimize area, the heuristics engine 2802 may select the 'normalize to unsigned' methodology, otherwise (when the word length is not between 34 and 36 bits), the heuristics engine 2802 may select the 'normalize to signed' methodology.

In some embodiments, information concerning the applied methodology may be included in a report, such as a hardware resource utilization report, on the code generation process, as indicated at step 2916. A user may decide to repeat the code generation process using a different methodology, and may evaluate the utilization of resources of the target hardware.

Word Length Heuristics

Figure 30:
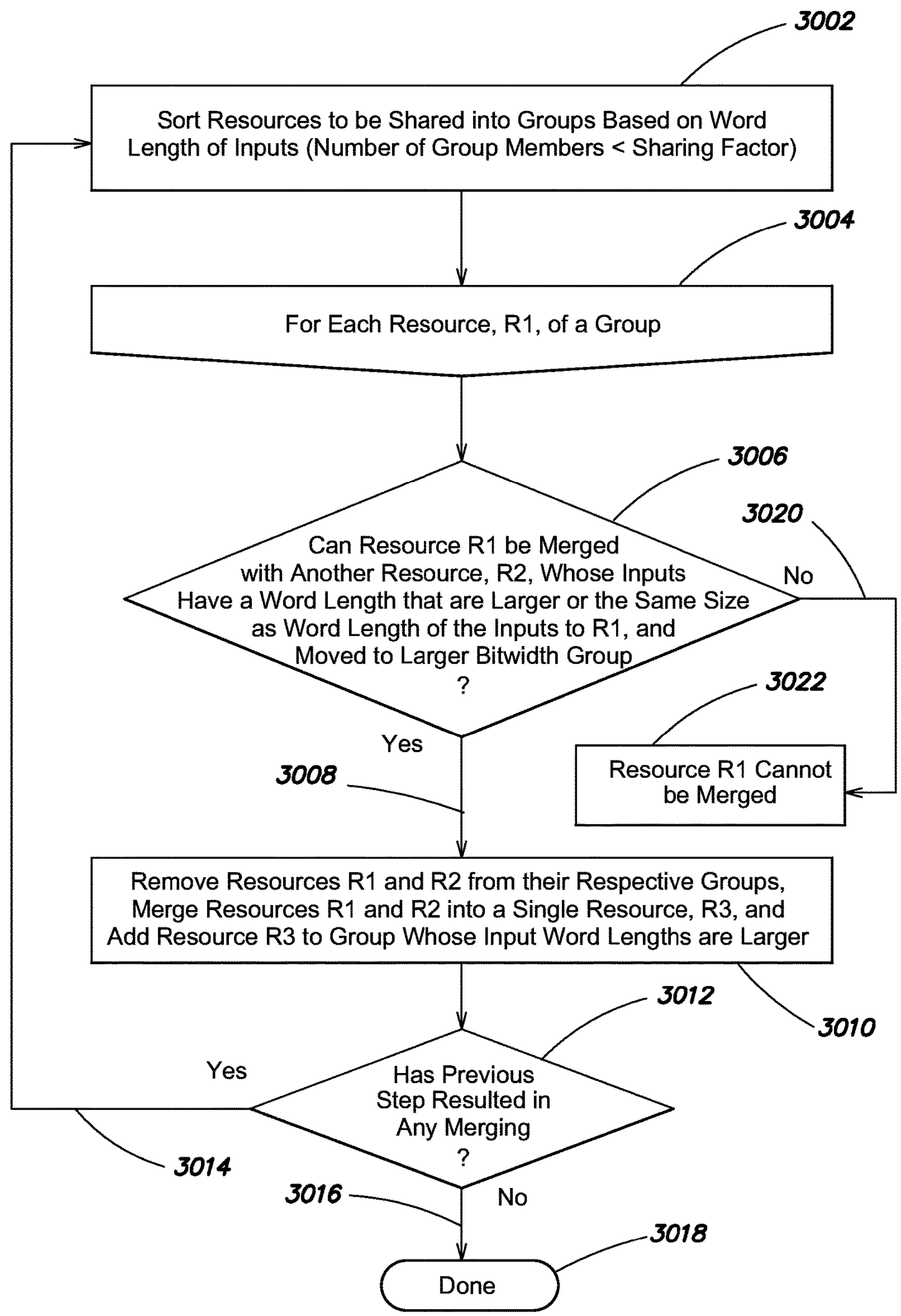
FIG. 30 is a flow diagram of a method in accordance with an embodiment of the disclosure.

FIG. 30 is a flow diagram of a method in accordance with an embodiment. The heuristics engine 2802 may sort the functionally equivalent resources to be shared into groups based on the word length of the inputs to the resources, e.g., multipliers, as indicated at step 3002. The resources of a given group may have the same input word lengths or a range of input word lengths. If the number of resources in any group is greater than the sharing factor, the group may be split into multiple groups where the number of multipliers in each group is equal to or less than the sharing factor. If the number of multipliers in a group equals the sharing factor, then the group is not a candidate for merging and may not be processed. It should be understood that the multipliers in such a group may still be shared. The heuristics engine 2802 may evaluate a first multiplier of a first group, as indicated at step 3004. In some embodiments, the heuristics engine 2802 may start with the group whose multipliers have the smallest input word lengths. The heuristics engine 2802 may determine whether a given multiplier, R1, of the group may be merged with another multiplier R2, where the input word length of R2 is larger than the input word length of R1, as indicated at decision step 3006. If so, the heuristics engine 2802 may merge the two multipliers R1 and R2 into a new multiplier R3, and may add the new multiplier R3 to a new group whose input word length is larger than the input word length of R1, as indicated by Yes arrow 3008 leading to step 3010. When the number of multipliers of any group reaches the sharing factor, the group may be removed from further merging consideration. The heuristics engine 2802 may determine whether the previous step resulted in any merging, as indicated at decision step 3012. If so, processing may return to step 3002, as indicated by Yes arrow 3014. If the previous step did not result in any merging, processing may be complete, as indicated by No arrow 3016 leading to Done step 3018.

Returning to decision step 3006, if the R1 cannot be merged with another multiplier, then R1 is not a candidate for merging, as indicated by No arrow 3020 leading to step 3022.

If any group becomes empty, for example because the last two resources in the group were merged and placed in another group, the empty group may be deleted. If any group becomes full, i.e., the number of members in the group equals the sharing factor, due to the addition of a new resources, e.g., multiplier R3, then this full group may be removed from the merging process.

Word Length Merging Example

FIGS. 31, 32, and 33A-B show an example of using merging to share resources whose inputs have different word lengths. The example implements the methodologies illustrated in FIG. 30. For purposes of explanation, the example includes source and modified models. Nonetheless, it should be understood that the resource sharing optimizer 224 may modify an IR of a source model. It should also be understood that the models, numerical values, and block types shown in FIGS. 31, 32, and 33A-B are for illustrative purposes, and that the disclosure may be used with other models, numerical values, and block types.

Figure 31:
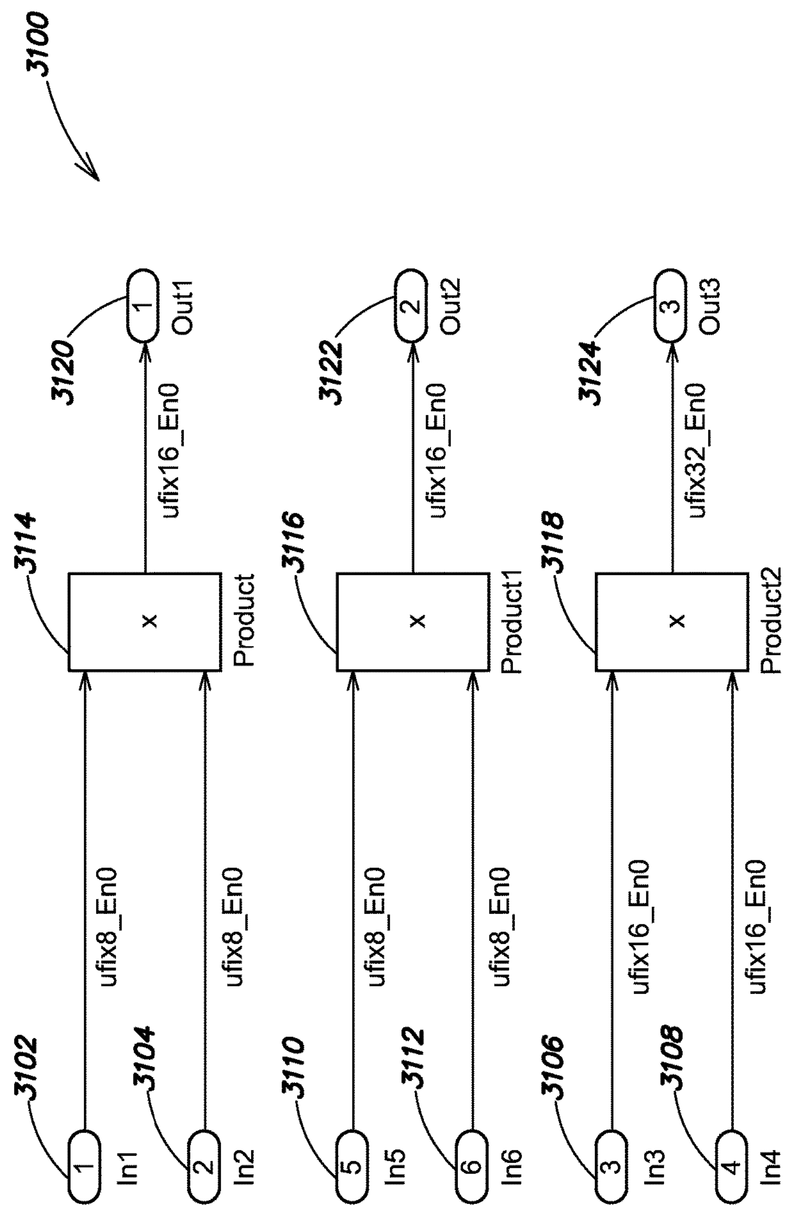
FIG. 31 is a schematic illustration of a portion of a source model.

FIG. 31 is a schematic illustration of a portion 3100 of a source model that includes resources, e.g., multipliers, to be shared where the inputs to the resources have different word lengths. The model portion 3100 includes a first Inport element 3102, a second Inport element 3104, a third Inport element 3106, a fourth Inport element 3108, a fifth Inport element 3110, a sixth Inport element 3112, a first multiplier element 3114, a second multiplier element 3116, a third multiplier element 3118, a first Outport element 3120, a second Outport element 3122, and a third Outport element 3124. In the example shown in the figure, the first multiplier element 3114 receives inputs from the first and second Inport elements 3102 and 3104 that are both unsigned fixed point data types having a word length of 8 and a fraction length of 0. The first multiplier element 3114 generates an output that is an unsigned fixed point data type with a word length of 16 and a fraction length of 0. The output is received at the first Outport element 3120. The second multiplier 3116 receives inputs from the fifth and sixth Inport elements 3110 and 3112 that are both unsigned fixed point data types having a word length of 8 and a fraction length of 0. The second multiplier element 3116 generates an output that is an unsigned fixed point data type with a word length of 16 and a fraction length of 0. The output is received at the second Outport element 3122. The third multiplier element 3118 receives inputs from the third and fourth Inport elements 3106 and 3108 that are both unsigned fixed point data types with a word length of 16 and a fraction length of 0. The third multiplier element 3118 generates an output that is an unsigned fixed point data type having a word length of 32 and a fraction length of 0 that is provided to the third Outport element 3124.

The resource sharing optimizer 224 may determine that the first and second multiplier elements 3114, 3116 whose inputs have a word length of 8 and a fraction length of 0 may be merged together, and that the resulting merged multiplier whose inputs have a word length of 16 and a fraction length of 0 may be shared with the third multiplier 3118 whose inputs have a word length of 16 and a fraction length of 0.

Figure 32:
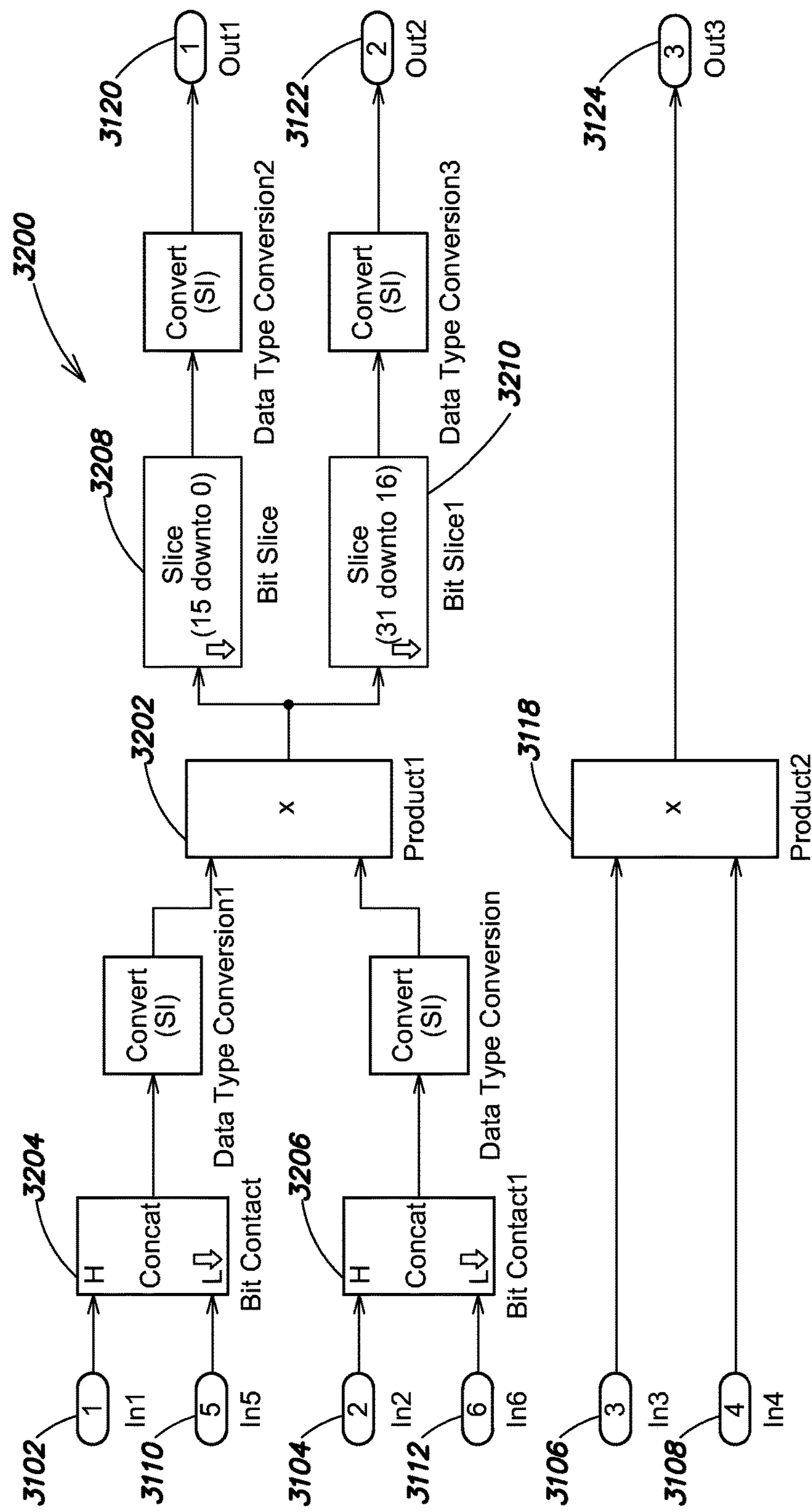
FIG. 32 is a schematic illustration of a portion of a validation model.

FIG. 32 is a schematic illustration of a portion of a first validation model 3200 representing a first set of changes made by the resource sharing optimizer 224 to the IR created for the model portion 3100 of FIG. 31. It should be understood that the first validation model portion 3200 is for explanation purposes, and that the code generation system 200 may not create a validation model. Instead, the code generation system 200 may proceed with the code generation process using the IR as modified. The first validation model 3200 may include the third multiplier 3118 whose inputs have a word length of 8 and a fraction length of 0. The resource sharing optimizer 224 has merged the first and second multipliers 3114, 3116 (FIG. 31) and replaced them with a single shared multiplier 3202 whose inputs have a word length of 16 and a fraction length of 0.

The input bits from the first Inport element 3102 and the fifth Inport element 3110 are concatenated to form a first 16-bit input by a first concatenate element 3204. The input bits from the second Inport element 3104 and the sixth Inport element 3112 are concatenated to form a second 16-bit input by a second concatenate element 3206. The output of the single shared multiplier 3202 has a word length of 32-bits. The output of the multiplier 3202 is split into two 16-bit outputs by a first bit slice element 3208 and a second bit slice element 3210.

The resource sharing optimizer 224 may replace the two multipliers 3202, 3118 illustrated in the first validation model portion 3200 (FIG. 32) with a single shared multiplier.

Figure 33A:
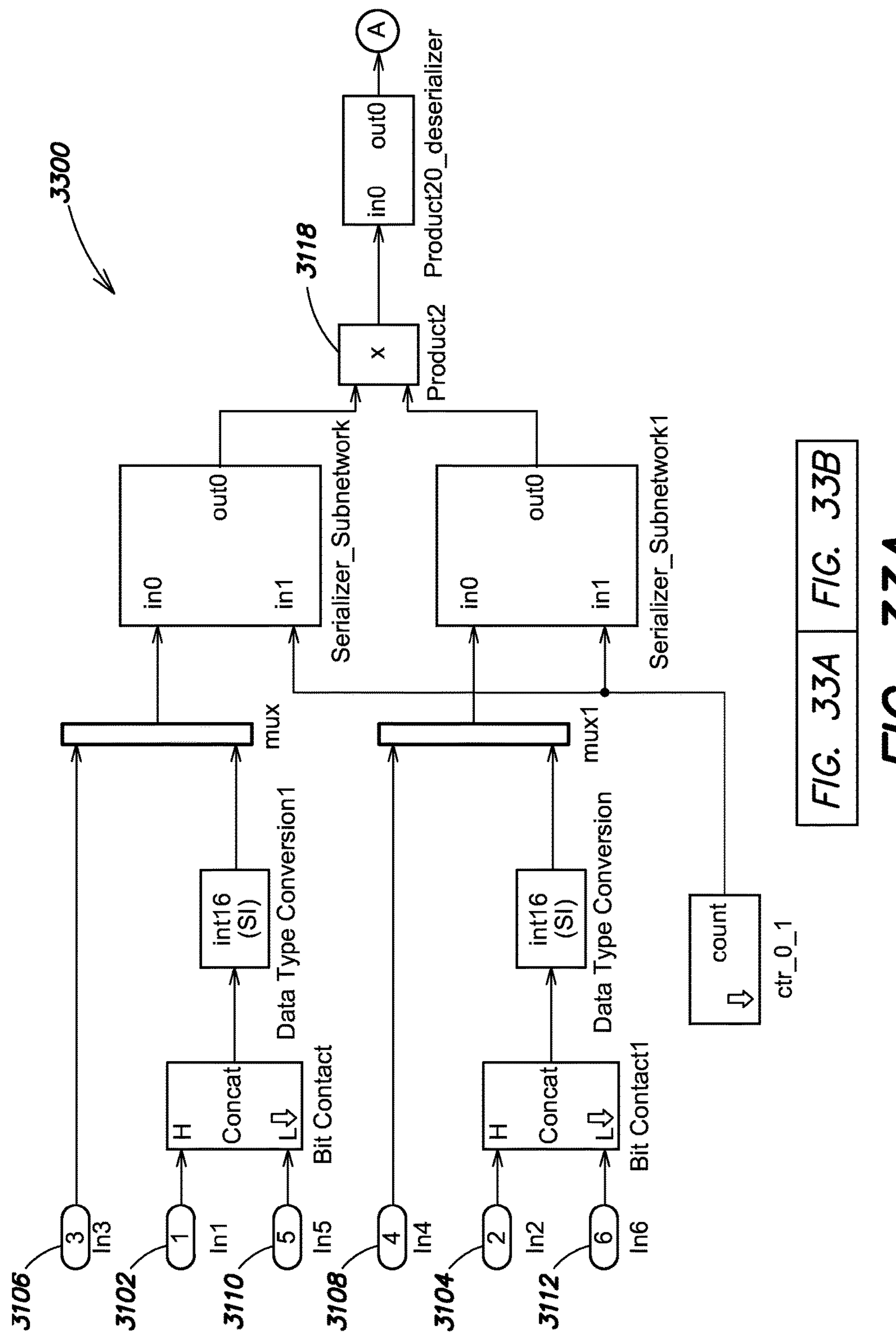
FIGS. 33A and 33B are partial views of a schematic illustration of a portion of a validation model.
Figure 33B:
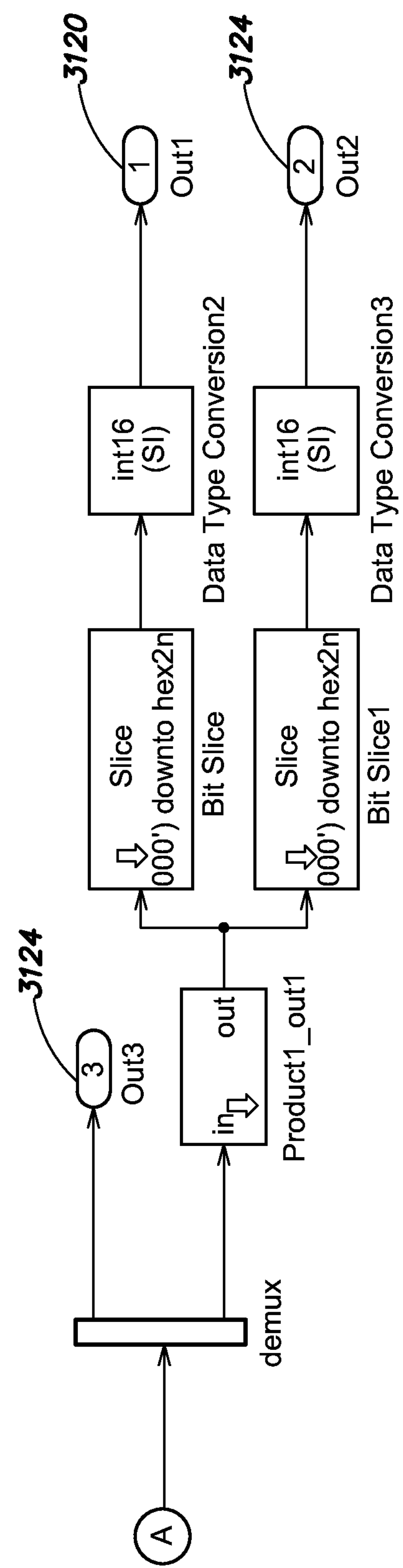

FIGS. 33A and 33B are partial views of a schematic illustration of a portion of a second validation model 3300 representing changes made by the resource sharing optimizer 224 to the first validation model 3200. It should be understood that the second validation model portion 3300 is for explanation purposes, and that the code generation system 200 may not create a validation model. Instead, the code generation system 200 may proceed with the code generation process using the IR as modified. The second validation model portion 3300 includes a single shared multiplier, namely the second multiplier 3118 from the source model portion 3100 (FIG. 31) whose inputs have a word length of 16 and a fraction length of 0.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified, one or more acts may be omitted, and one or more additional acts may be included, in other implementations. Further, non-dependent acts may be performed in parallel. Also, the term "user", as used herein, is intended to be broadly interpreted to include, for example, a computer or data processing system (e.g., system 100) or a user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible, non-transitory computer-readable storage media and may include computer-executable instructions that may be executed by a computer or data processing system, such as system 100, a processor, processing logic, etc. The computer-executable instructions may include instructions that implement one or more embodiments of the disclosure. The tangible, non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. Therefore, it is the object of the appended claims to cover all such variations and modifications as come within the true spirit and scope of the disclosure.

What is claimed is:

1. A method comprising:

storing, in a memory, at least a portion of an executable source model having a plurality of model elements;

identifying, by a processor coupled to the memory, first and second model elements that implement a same computation, functionality, or operation with each other, where a first input to the first model element is associated with a first fixed point data type and a second input to the second model element is associated with a second fixed point data type that is different than the first fixed point data types;

modifying, by the processor, the at least a portion of the executable source model by converting the first fixed point data type associated with the first input to the first model element to a new fixed point data type, wherein the converting includes at least one of:

changing a fraction length of at least one of the first fixed point data type or the second fixed point data type to a predetermined fraction length;

changing the first fixed point data type to either a signed data type or an unsigned data type;

promoting a first word length of the first fixed point data type to a second word length of the second fixed point data type;

partitioning the first model element into a set of model elements whose inputs are associated with data types having smaller word lengths than a word length of the first fixed point data type; or merging the first model element with one or more other model elements to create a merged model element wherein a merged word length associated with the merged model element equals the second word length of the second fixed point data type;

utilizing a single shared model element in place of the first and second model elements identified as implementing the same computation, functionality, or operation with each other; and automatically generating code for the at least a portion of the executable source model, following the modifying, wherein the code generated for the at least a portion of the executable source model includes a portion for the single shared model element.

2. The method of claim 1 wherein the predetermined fraction length is a zero fraction length.

3. The method of claim 1 wherein the first fixed point data type associated with the first input to the first model element is signed, and the second fixed point data type associated with the second input to the second model element is unsigned.

4. The method of claim 3 wherein the converting includes converting the first fixed point data type associated with the first input to the first model element to unsigned.

5. The method of claim 4 wherein the converting further includes adding sign determination and setting logic to the at least a portion of the executable source model.

6. The method of claim 3 wherein the converting includes converting the second fixed point data type associated with the second input to the second model element to signed and increasing the second word length if the second fixed point data type.

7. The method of claim 1 wherein the second word length is larger than the first word length, the identifying includes identifying a third model element of the executable source model that implements the same computation, functionality, or operation as the first and second model elements, a third input to the third model element is associated with a third fixed point data type having a third word length equal to the first word length, the single shared model element is further utilized in place of the third model element, and the single shared model element corresponds to the second model element.

8. The method of claim 1 wherein the first fixed point data type associated with the first input to the first model element is signed, and the second fixed point data type associated with the second input to the second model element is unsigned, the method further comprising:

applying a heuristic to determine whether to use a normalize-to-signed conversion or a normalize-to-unsigned conversion.

9. The method of claim 8 further comprising:

receiving an indication of a target hardware device to implement the code, wherein the applying the heuristic includes evaluating hardware utilization information for the target hardware device.

10. The method of claim 1 further comprising:

generating one or more in-memory intermediate representations of the executable source model, wherein the identifying and the modifying are performed on the one or more in-memory intermediate representations.

11. The method of claim 1 wherein the first and second model elements are multipliers, gains, products, or adders.

12. The method of claim 1 wherein the executable source model is in the form of a block diagram or a hardware description.

13. An apparatus comprising:

a memory storing at least a portion of an executable source model, the at least a portion of the executable source model including model elements; and a processor coupled to the memory, the processor configured to:

identify a group of the model elements that implement a same computation, functionality, or operation with each other, the group of the model elements having inputs associated with fixed point data types that are different; and modify the at least a portion of the executable source model by converting one or more of the fixed point data types that are associated with the inputs to the group of the model elements to a same fixed point data type, wherein the converting includes at least one of:

changing a fraction length of at least one of the fixed point data types to a predetermined fraction length;

changing the at least one of the fixed point data types to either a signed data type or an unsigned data type;

promoting a first word length of a first fixed point data type of the fixed point data types to a second word length of a second fixed point data type of the fixed point data types;

partitioning a first model element of the group of the model elements into a plurality of model elements whose inputs are associated with data types having smaller word lengths than a word length of the at least one of the fixed point data types; or merging a second model element of the group of the model elements with one or more other model elements to create a merged model element wherein a merged word length associated with the merged model element equals the first word length of the first fixed point data type, replacing the group of the model elements with a single shared model element that implements the same computation, functionality, or operation as the group of the model elements, and routing the inputs for the group of the model elements to the single shared model element.

14. The apparatus of claim 13 wherein the processor is further configured to:

automatically generate code for the at least a portion of the executable source model, following the modify.

15. The apparatus of claim 13 where the converting includes adding one or more data type conversion model elements at the inputs for one or more of the group of the model elements, the one or more data type conversion elements changing the fixed point data types associated with the inputs for the one or more of the group of the model elements.

16. The apparatus of claim 15 where the one or more data type conversion model elements change at least one of a word length, a fraction length, or a signedness associated with the inputs for the one or more of the group of the model elements.

17. The apparatus of claim 13 wherein the processor is further configured to:

generate a validation model where the validation model represents the at least a portion of the executable source model following the modify; and present the validation model on a display coupled to the processor.

18. One or more non-transitory computer-readable media comprising program instructions, the program instructions, when executed, causing a processor to:

access, from a memory coupled to the processor, at least a portion of an executable source model, the at least a portion of the executable source model including model elements;

identify a group of the model elements that implement a same computation, functionality, or operation with each other, the group of the model elements having inputs associated with fixed point data types that are different; and modify the at least a portion of the executable source model by converting one or more of the fixed point data types that are associated with the inputs to the group of the model elements to a same fixed point data type wherein the converting includes at least one of:

changing a fraction length of at least one of the fixed point data types to a predetermined fraction length;

changing the at least one of the fixed point data types to either a signed data type or an unsigned data type;

promoting a first word length of a first fixed point data type of the fixed point data types to a second word length of a second fixed point data type of the fixed point data types;

partitioning a first model element of the group of the model elements into a plurality of model elements whose inputs are associated with data types having smaller word lengths than a word length of the at least one of the fixed point data types; or merging a second model element of the group of the model elements with one or more other model elements to create a merged model element wherein a merged word length associated with the merged model element equals the first word length of the first fixed point data type, replacing the group of the model elements with a single shared model element that implements the same computation, functionality, or operation as the group of the model elements, and routing the inputs for the group of the model elements to the single shared model element.

19. The one or more non-transitory, computer-readable media of claim 18 further comprising instructions to:

automatically generate code for the at least a portion of the executable source model, following the modify.

* * * * *

UNITED STATES PATENT AND TRADEMARK OFFICE

CERTIFICATE OF CORRECTION

PATENT NO. : 10,423,733 B1
APPLICATION NO. : 15/099111
DATED : September 24, 2019
INVENTOR(S) : Girish Venkataramani et al.

It is certified that error appears in the above-identified patent and that said Letters Patent is hereby corrected as shown below:

On the Title Page

Item (71) Applicant reads:
"The Mathworks, Inc., Natick, MA (US)"
Should read:
--The MathWorks, Inc., Natick, MA (US)--

In the Specification

Column 9, Lines 50-51 read:
"Sharing Resources Whose Inputs have the Same Data Types"
Should read:
--Sharing Resources Whose Inputs Have the Same Data Types--

Column 11, Line 22 reads:
"modified PR. The resource sharing optimizer 224 may"
Should read:
--modified PIR. The resource sharing optimizer 224 may--

Column 11, Line 47 reads:
"may analyze and perform its operations on the PR modified"
Should read:
--may analyze and perform its operations on the PIR modified--

Column 16, Line 20 reads:
"PR as it is being modified, to identify and account for, e.g.,"
Should read:
--PIR as it is being modified, to identify and account for, e.g.,--

Signed and Sealed this
Second Day of June, 2020

Andrei Iancu
*Director of the United States Patent and Trademark Office*

Column 17, Line 6 reads:
"duced along the edges of the modified PR. For example,"
Should read:
--duced along the edges of the modified PIR. For example,--

Column 18, Line 35 reads:
"dation model, from the code generation PR. That is, the"
Should read:
--dation model, from the code generation PIR. That is, the--

Column 18, Line 38 reads:
"components that were added to the original PR. In addition,"
Should read:
--components that were added to the original PIR. In addition,--

Column 18, Line 47 reads:
"PR, may be disabled or enabled by, e.g., the user. For"
Should read:
--PIR, may be disabled or enabled by, e.g., the user. For--

Column 21, Line 16 reads:
"creation of the modified PR and/or validation model 500."
Should read:
--creation of the modified PIR and/or validation model 500.--

Column 24, Lines 41-42 read:
"Sharing Resources Whose Inputs have the Same Data Types"
Should read:
--Sharing Resources Whose Inputs Have the Same Data Types--

Column 27, Line 28 reads:
"types may be used. For example, in C++, a reinterpret cast"
Should read:
--types may be used. For example, in C++, a reinterpret_cast--

Column 38, Line 58 insert:
--In some embodiments, the selection of a particular methodology by the heuristics engine 2802 may be overridden, for example by a user. The code generation system 200 may provide an indication of the preferred methodology, as indicated at step 2910. For example, the code generation system 200 may cause a pop-up window to be presented indicating that a particular methodology has been selected, e.g., 'normalize to signed'. The code generation system 200 may receive an indication that the particular methodology selected by the heuristics engine 2802 is accepted or is not accepted, as indicated at step 2912. If the code generation system 200 receives an indication that the selected methodology is accepted, it may be applied by the resource sharing optimizer 224, as indicated at step 2914. If the code generation system 200 receives an indication that the selected methodology is not accepted, the resource sharing optimizer 224 may apply a different methodology, as also indicated at step 2914. In some implementations, the code generation system 200 may store user preferences regarding methodologies, for example in response to a user request, and may apply the stored methodologies in subsequent code generation operations initiated by the user.--

In the Claims

Column 41, Line 61 Claim 1 reads:
"first fixed point data types;"
Should read:
--first fixed point data type;--

Column 42, Line 44 Claim 6 reads:
"increasing the second word length if the second fixed point"
Should read:
--increasing the second word length of the second fixed point--